(12) United States Patent
Chiu et al.

(10) Patent No.: US 12,080,713 B2
(45) Date of Patent: Sep. 3, 2024

(54) SELF-ALIGNED ETCH IN SEMICONDUCTOR DEVICES

(71) Applicant: Taiwan Semiconductor Manufacturing Co., Ltd., Hsinchu (TW)

(72) Inventors: Yi-Hsun Chiu, Zhubei (TW); Ching-Wei Tsai, Hsinchu (TW); Yu-Xuan Huang, Hsinchu (TW); Cheng-Chi Chuang, New Taipei (TW); Shang-Wen Chang, Jhubei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/358,140

(22) Filed: Jul. 25, 2023

(65) Prior Publication Data

US 2023/0369324 A1    Nov. 16, 2023

Related U.S. Application Data

(63) Continuation of application No. 17/733,169, filed on Apr. 29, 2022, now Pat. No. 11,810,917, which is a
(Continued)

(51) Int. Cl.
*H01L 27/088*     (2006.01)
*H01L 21/768*     (2006.01)
(Continued)

(52) U.S. Cl.
CPC ...... *H01L 27/0886* (2013.01); *H01L 21/7682* (2013.01); *H01L 23/535* (2013.01);
(Continued)

(58) Field of Classification Search
CPC ............. H01L 27/0886; H01L 21/7682; H01L 23/535; H01L 29/41791; H01L 29/42392;
(Continued)

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |

(Continued)

FOREIGN PATENT DOCUMENTS

| | | |
|---|---|---|
| DE | 102020103710 A1 | 9/2020 |
| JP | 2019526926 A | 9/2019 |

(Continued)

*Primary Examiner* — Changhyun Yi
(74) *Attorney, Agent, or Firm* — Slater Matsil, LLP

(57) ABSTRACT

Methods of performing backside etching processes on source/drain regions and gate structures of semiconductor devices and semiconductor devices formed by the same are disclosed. In an embodiment, a semiconductor device includes a first transistor structure; a first interconnect structure on a front-side of the first transistor structure; and a second interconnect structure on a backside of the first transistor structure, the second interconnect structure including a first dielectric layer on the backside of the first transistor structure; a contact extending through the first dielectric layer to a source/drain region of the first transistor structure; and first spacers along sidewalls of the contact between the contact and the first dielectric layer, sidewalls of the first spacers facing the first dielectric layer being aligned with sidewalls of the source/drain region of the first transistor structure.

20 Claims, 89 Drawing Sheets

Related U.S. Application Data continuation of application No. 16/944,025, filed on Jul. 30, 2020, now Pat. No. 11,342,326.

(60) Provisional application No. 63/016,391, filed on Apr. 28, 2020.

(51) Int. Cl.

| | | |
|---|---|---|
| *H01L 23/535* | (2006.01) | |
| *H01L 29/417* | (2006.01) | |
| *H01L 29/423* | (2006.01) | |
| *H01L 29/66* | (2006.01) | |
| *H01L 29/78* | (2006.01) | |

(52) U.S. Cl.
CPC .................. *H01L 29/41791* (2013.01); *H01L 29/42392* (2013.01); *H01L 29/66795* (2013.01); *H01L 29/7851* (2013.01)

(58) Field of Classification Search
CPC ........... H01L 29/66795; H01L 29/7851; H01L 29/785; H01L 21/76897; H01L 29/78696; H01L 29/78618

See application file for complete search history.

(56) References Cited

U.S. PATENT DOCUMENTS

| | | |
|---|---|---|
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 9,923,094 B2 | 3/2018 | Ching et al. |
| 10,756,017 B2 | 8/2020 | Lin et al. |
| 10,872,820 B2 | 12/2020 | Block et al. |
| 10,879,406 B2 | 12/2020 | Huang et al. |
| 2018/0122714 A1 | 5/2018 | Cheng et al. |
| 2018/0219090 A1 | 8/2018 | Morrow et al. |
| 2019/0267279 A1 | 8/2019 | Cheng et al. |
| 2019/0378842 A1* | 12/2019 | Reznicek ............ H01L 29/4175 |
| 2020/0126987 A1 | 4/2020 | Rubin et al. |
| 2020/0294998 A1 | 9/2020 | Lilak et al. |
| 2020/0365586 A1 | 11/2020 | Shin et al. |
| 2021/0351219 A1 | 11/2021 | Yamagishi et al. |

FOREIGN PATENT DOCUMENTS

| | | |
|---|---|---|
| KR | 20160110053 A | 9/2016 |
| KR | 20180060969 A | 6/2018 |
| KR | 20180110656 A | 10/2018 |
| KR | 20190036521 A | 4/2019 |
| WO | 2020044943 A1 | 8/2021 |

* cited by examiner

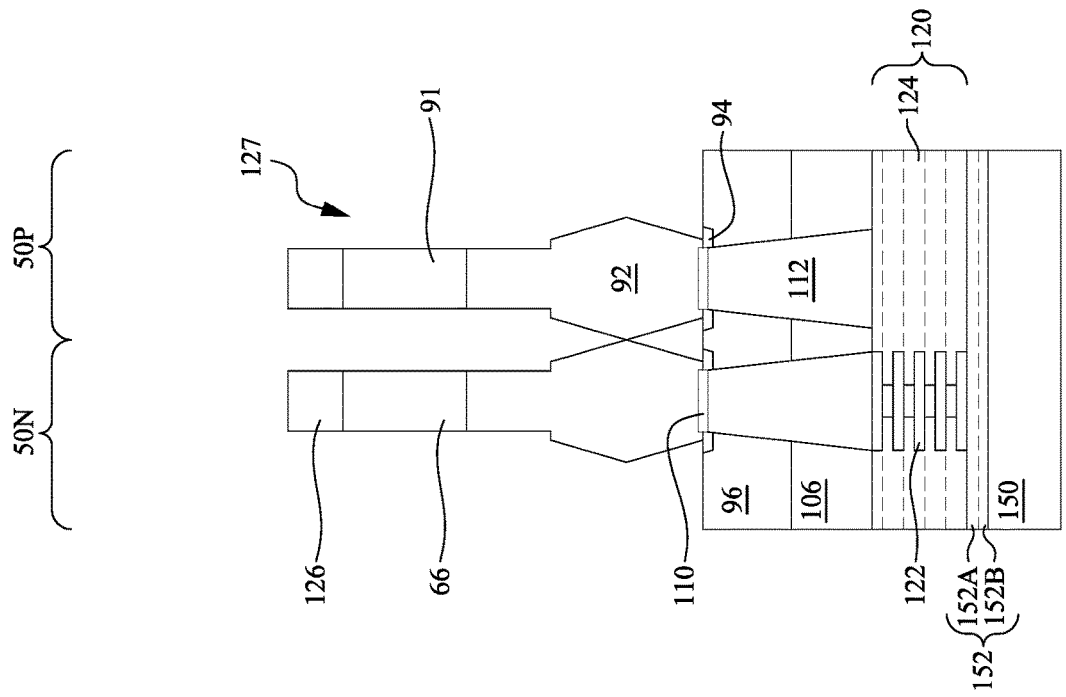
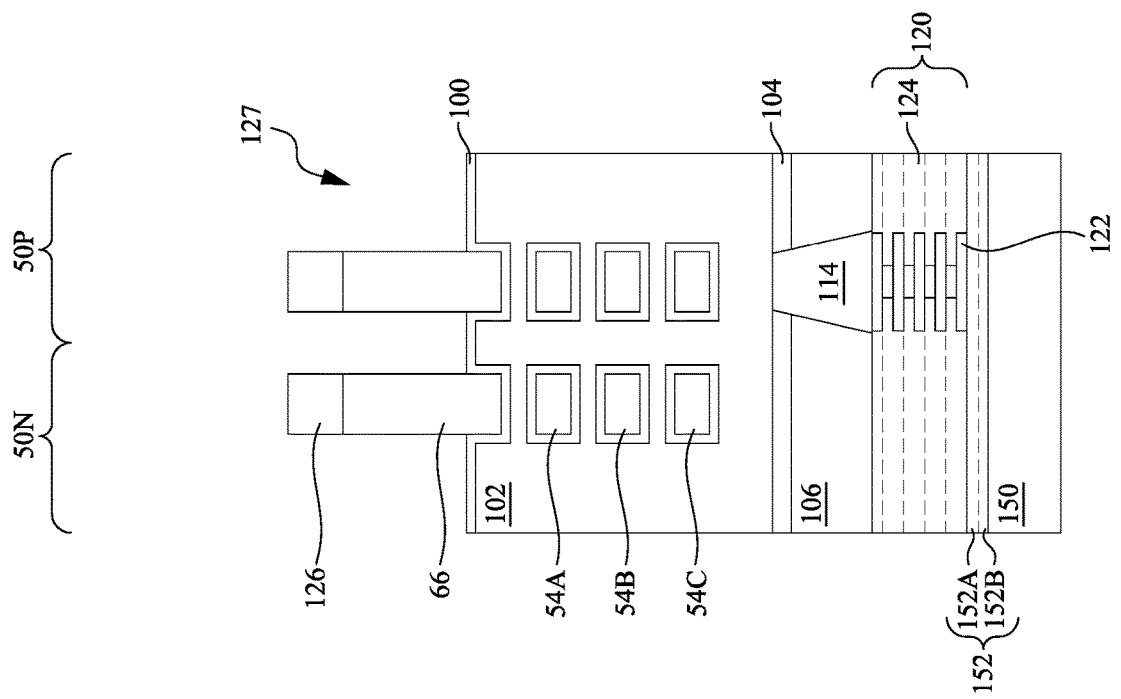
Fig. 27B
Fig. 27A

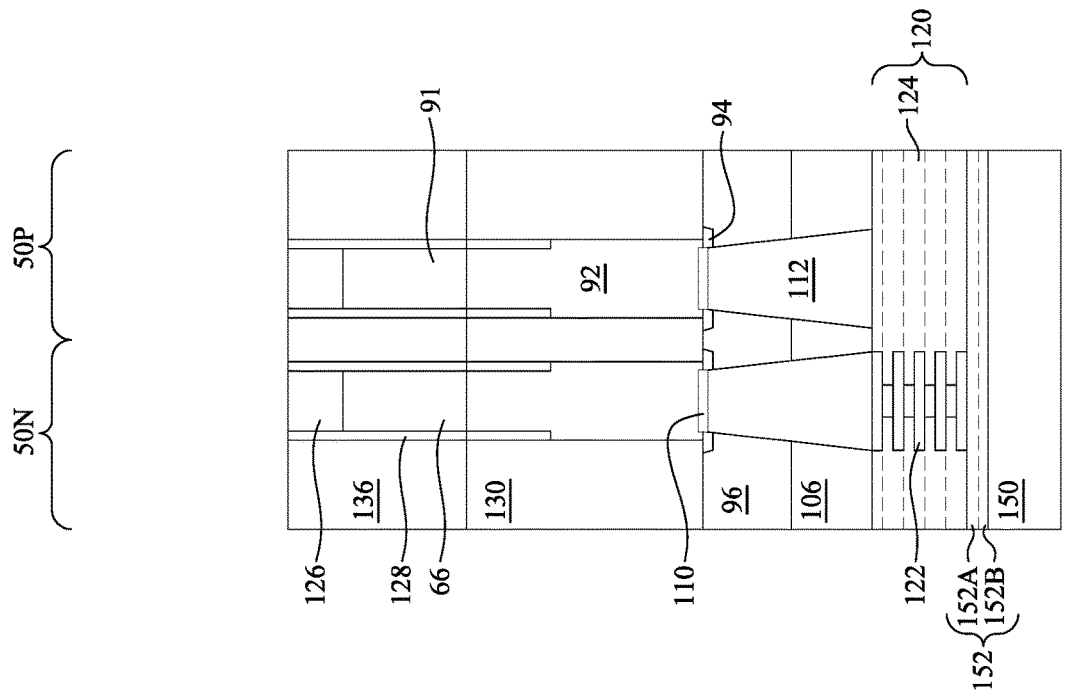
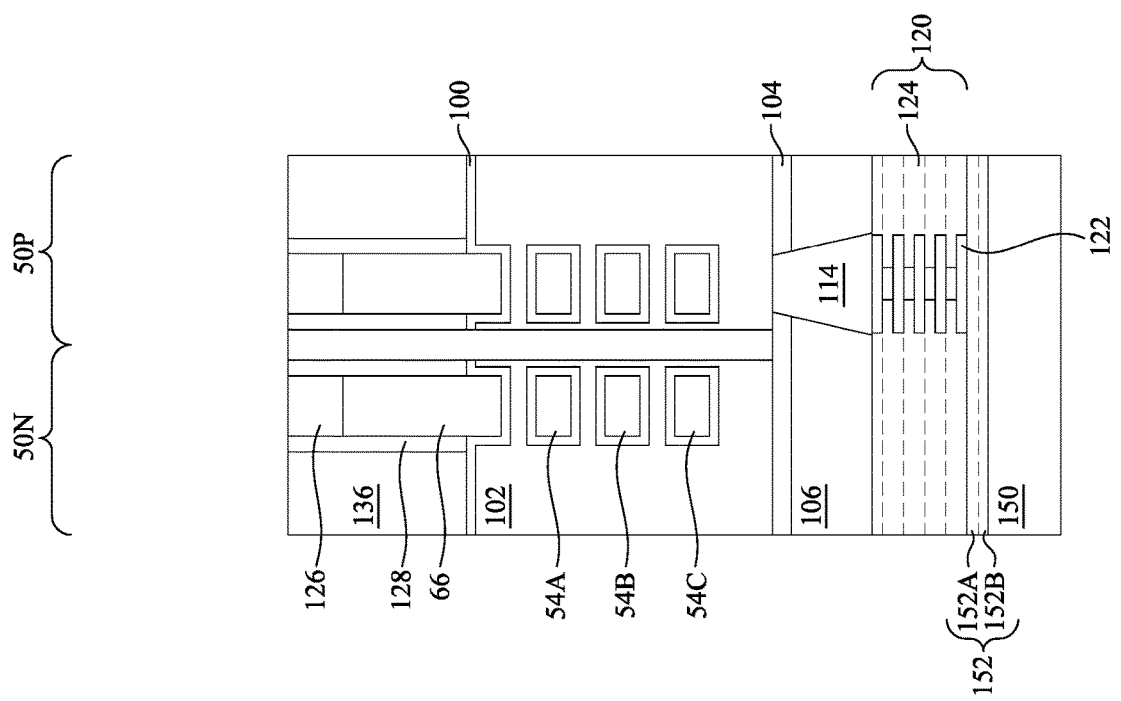
Fig. 32B
Fig. 32A

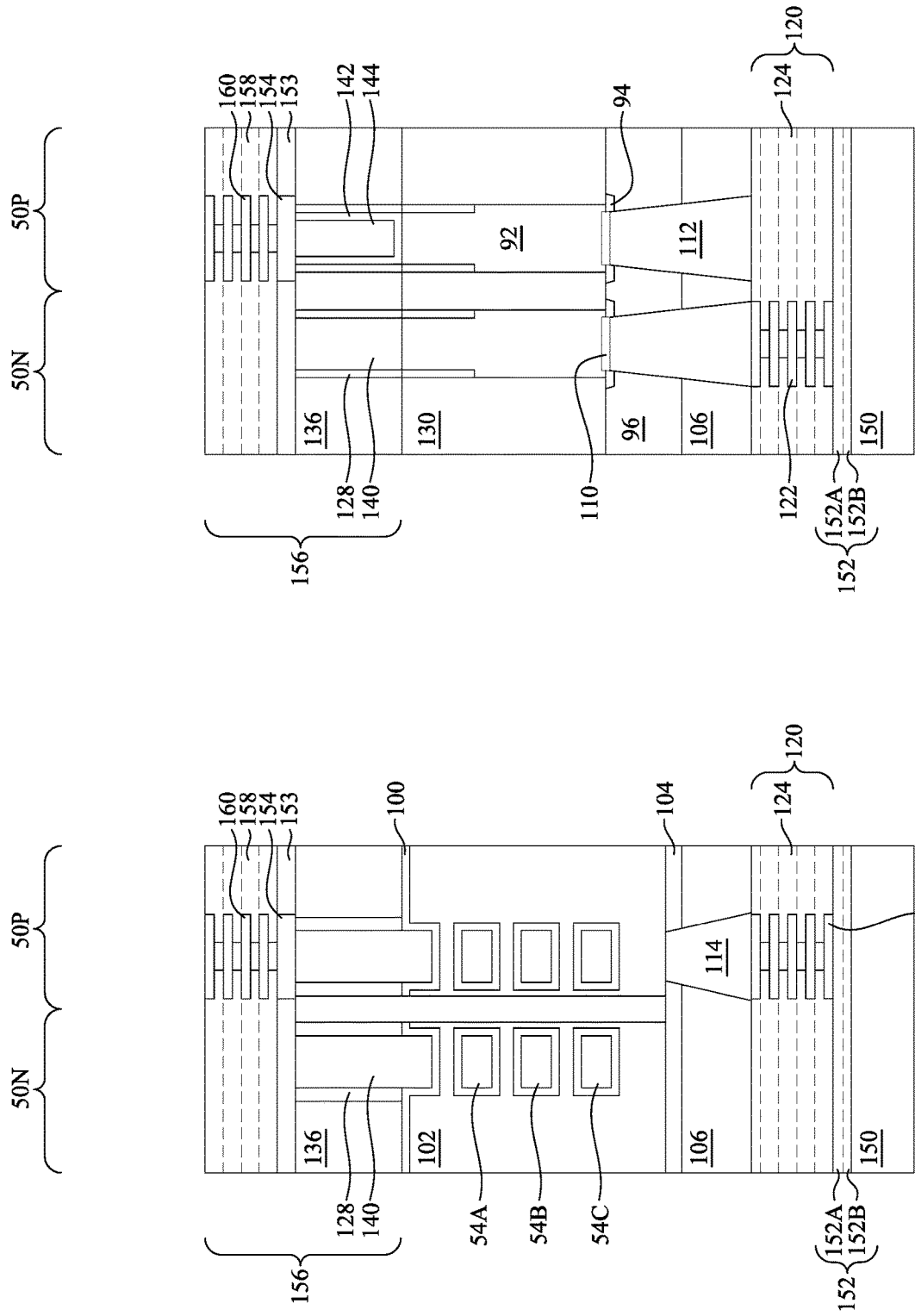

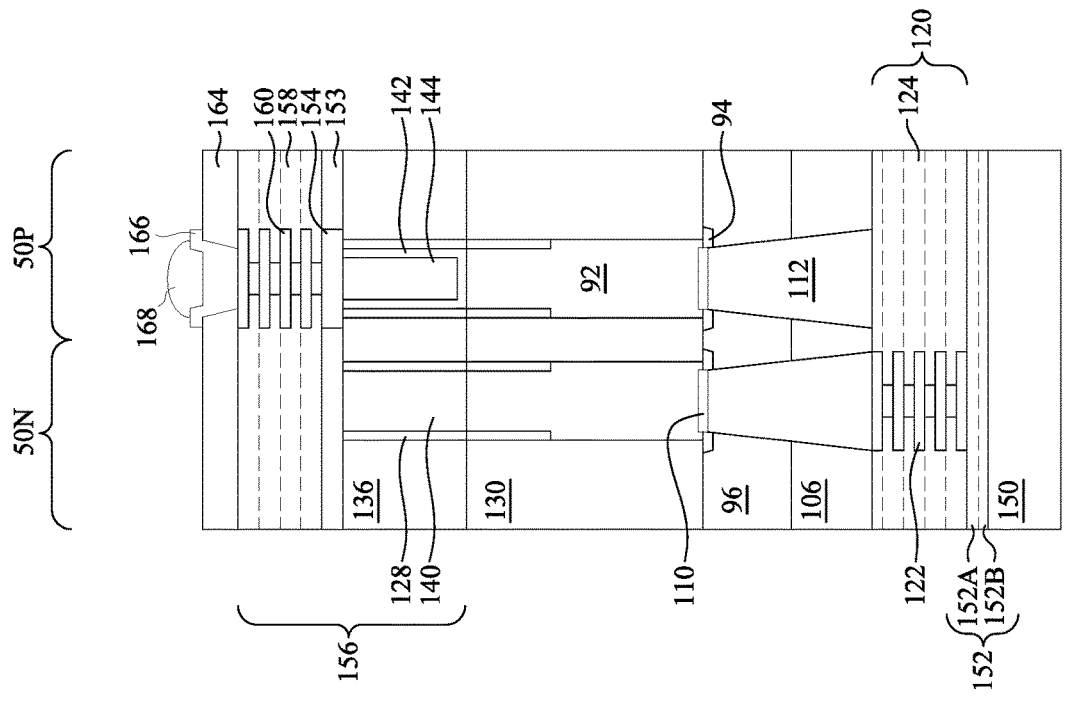
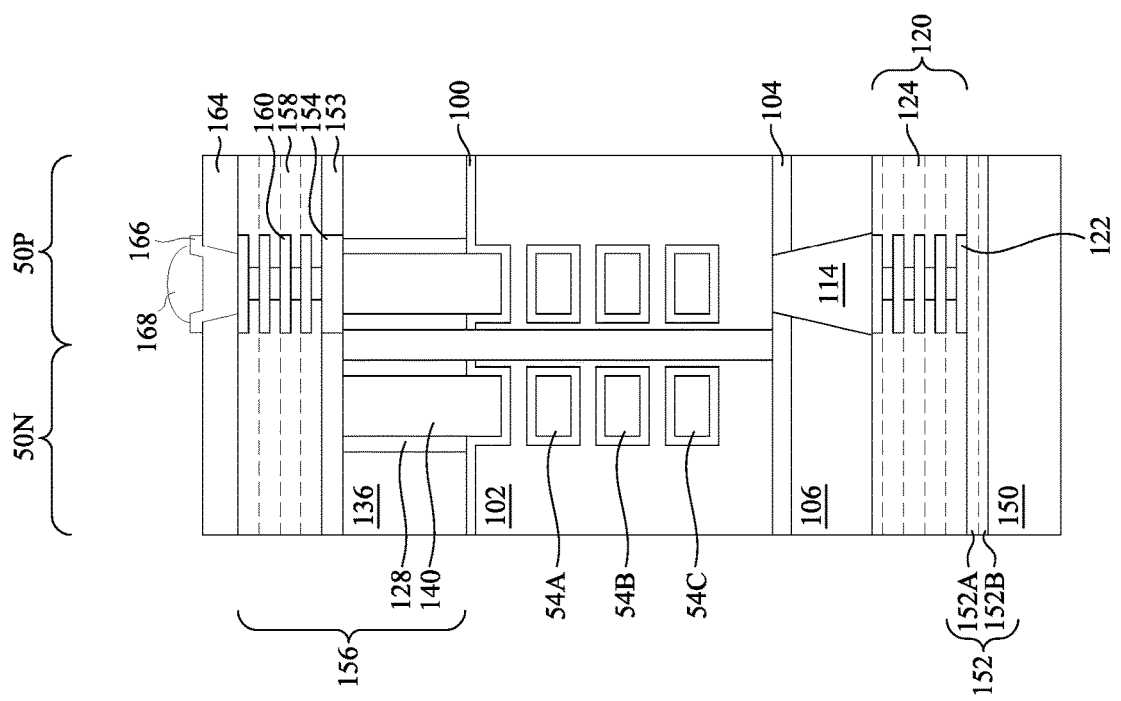
Fig. 38A
Fig. 38B

SELF-ALIGNED ETCH IN SEMICONDUCTOR DEVICES

PRIORITY CLAIM AND CROSS-REFERENCE

This application is a continuation of U.S. patent application Ser. No. 17/733,169, entitled "Self-Aligned Etch in Semiconductor Devices," filed Apr. 29, 2022, now U.S. Pat. No. 11,810,917, issued Nov. 7, 2023, which is a continuation of U.S. patent application Ser. No. 16/944,025, entitled "Self-Aligned Etch in Semiconductor Devices," filed Jul. 30, 2020, now U.S. Pat. No. 11,342,326 issued May 24, 2022, which application claims the benefit of U.S. Provisional Application No. 63/016,391, filed on Apr. 28, 2020, and entitled "SPR with Backside Cut MG and Backside Cut EPI," which applications are hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6A, 6B, 6C, 7A, 7B, 7C 8A, 8B, 8C, 9A, 9B, 9C, 10A, 10B, 10C, 11A, 11B, 11C, 11D, 12A, 12B, 12C, 13A, 13B, 13C, 14A, 14B, 14C, 14D, 14E, 14F, 15A, 15B, 15C, 16A, 16B, 16C, 17A, 17B, 17C, 18A, 18B, 18C, 19A, 19B, 19C, 20A, 20B, 20C, 21A, 21B, 21C, 22A, 22B, 22C, 23A, 23B, 23C, 24A, 24B, 24C, 25A, 25B, 25C, 25D, 26A, 26B, 26C, 26D, 27A, 27B, 27C, 27D, 28A, 28B, 28C, 28D, 29A, 29B, 29C, 29D, 30A, 30B, 30C, 30D, 30E, 31A, 31B, 31C, 31D, 31E, 32A, 32B, 32C, 32D, 32E, 32F, 32G, 33A, 33B, 33C, 33D, 34A, 34B, 34C, 34D, 35A, 35B, 35C, 35D, 36A, 36B, 36C, 37A, 37B, 37C, 38A, 38B, and 38C are cross-sectional views and backside views of intermediate stages in the manufacturing of nano-FETs, in accordance with some embodiments.

DETAILED DESCRIPTION

Figure 1:
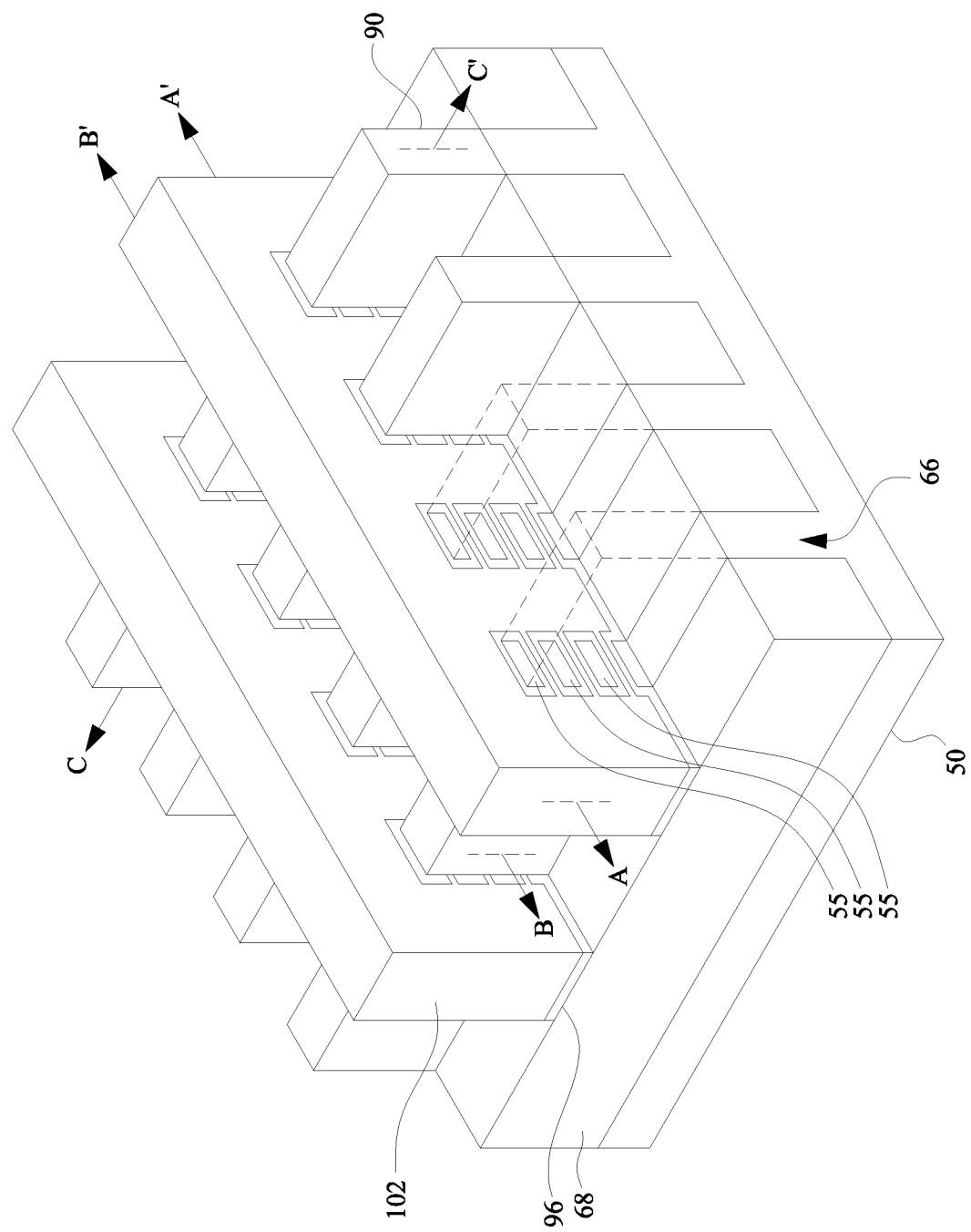
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide methods for performing backside etching/trimming processes on gate structures and epitaxial source/drain regions of semiconductor devices and semiconductor devices formed by the same. The backside etching/trimming processes may be self-aligned processes, which use spacers formed along sidewalls of semiconductor fins as masks to etch the gate structures and the epitaxial source/drain regions. Etching/trimming the gate structures and the epitaxial source/drain regions using self-aligned backside processes results in the gate structures and the epitaxial source/drain regions being etched with greater accuracy, which allows for feature sizes to be decreased and device density to be increased. Further, low-k dielectric materials and/or air gaps may be formed adjacent the gate structures and the epitaxial source/drain regions following the etching and may provide reduced parasitic capacitance, which results in improved device performance.

Some embodiments discussed herein are described in the context of a die including nano-FETs. However, various embodiments may be applied to dies including other types of transistors (e.g., fin field effect transistors (FinFETs), planar transistors, or the like) in lieu of or in combination with the nano-FETs.

FIG. 1 illustrates an example of nano-FETs (e.g., nanowire FETs, nanosheet FETs, or the like) in a three-dimensional view, in accordance with some embodiments. The nano-FETs include nanostructures 55 (e.g., nanosheets, nanowires, or the like) over fins 66 on a substrate 50 (e.g., a semiconductor substrate, a silicon-on-insulator substrate, or the like). The nanostructures 55 act as channel regions for the nano-FETs. The nanostructures 55 may include p-type nanostructures, n-type nanostructures, or combinations thereof. Shallow trench isolation (STI) regions 68 are disposed between adjacent the fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the STI regions. Additionally, although bottom portions of the fins 66 are illustrated as being single, continuous materials with the substrate 50, the bottom portions of the fins 66 and/or the substrate 50 may include a single material or a plurality of materials. In this context, the fins 66 refer to the portion extending between the neighboring STI regions 68.

Gate dielectric layers 100 are along top surfaces and sidewalls of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is parallel to cross-section A-A' and extends through the epitaxial source/drain regions 92 of the nano-FETs. Cross-section C-C' is perpendicular to cross-section A-A' and is parallel to the longitudinal axis of the fin 66 of the nano-FET and in a direction of, for example, a current flow between the epitaxial source/drain regions 92 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

FIGS. 2 through 38C are cross-sectional views and backside views of intermediate stages in the manufacturing of nano-FETs, in accordance with some embodiments. FIGS. 2 through 5, 6A, 7A, 8A, 9A, 10A, 11A, 12A, 13A, 14A, 15A, 16A, 17A, 18A, 19A, 20A, 21A, 22A, 23A, 24A, 25A, 26A, 27A, 28A, 29A, 30A, 31A, 31E, 32A, 32E, 32G, 33A, 34A, 35A, 36A, 37A, and 38A illustrate reference cross-section A-A' illustrated in FIG. 1. FIGS. 6B, 7B, 8B, 9B, 10B, 11B, 12B, 13B, 14B, 14D, 14E, 15B, 16B, 17B, 18B, 19B, 20B, 21B, 22B, 23B, 24B, 25B, 26B, 27B, 28B, 29B, 30B, 30E, 31B, 32B, 32F, 33B, 34B, 35B, 36B, 37B, and 38B illustrate reference cross-section B-B' illustrated in FIG. 1. FIGS. 6C, 7C, 8C, 9C, 10C, 11C, 12C, 13C, 14C, 14F, 15C, 16C, 17C, 18C, 19C, 20C, 21C, 22C, 23C, 24C, 25C, 26C, 27C, 28C, 29C, 30C, 31C, 32C, 33C, 34C, 35C, 36C, 37C, and 38C illustrate reference cross-section C-C' illustrated in FIG. 1. FIGS. 25D, 26D, 27D, 28D, 29D, 30D, 31D, 32D, 33D, 34D, and 35D are backside views.

Figure 2:
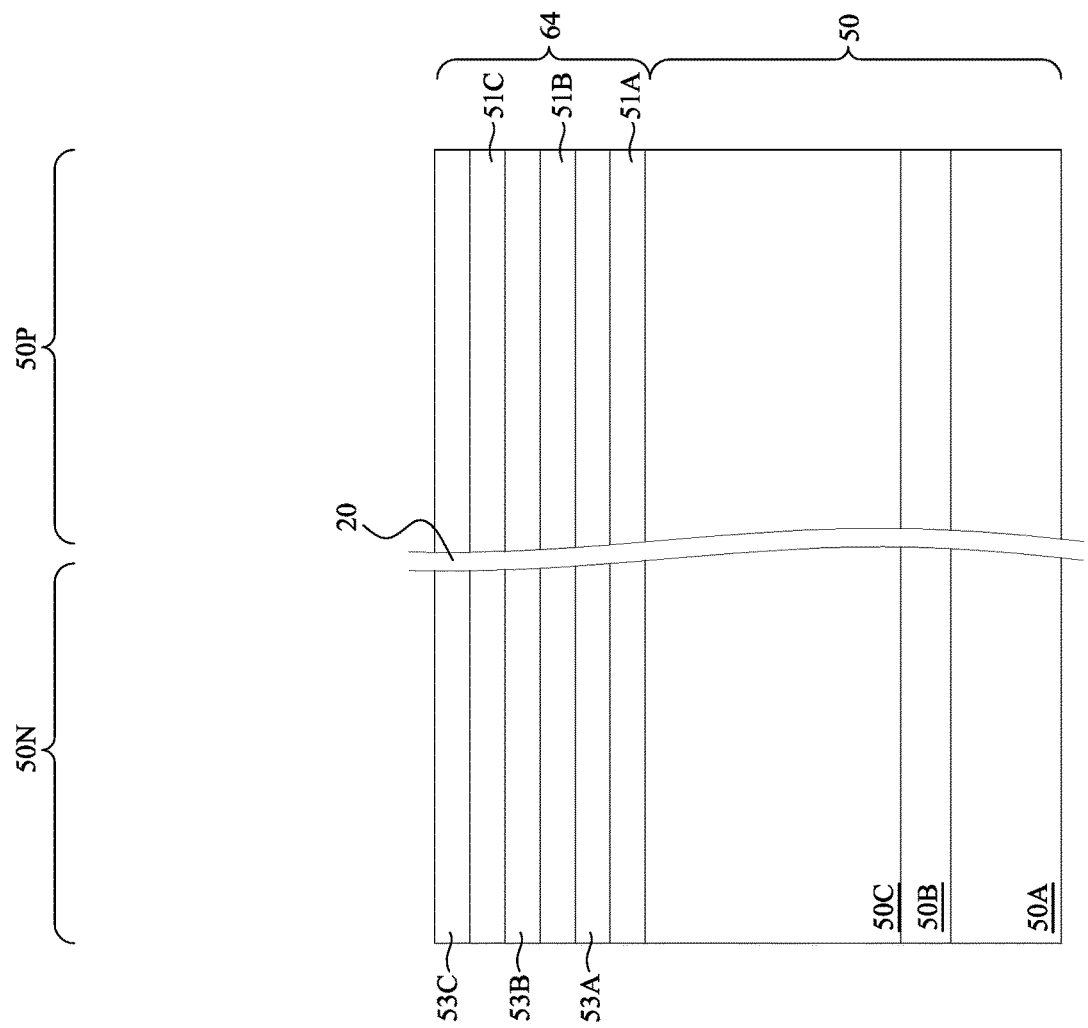

In FIG. 2, a silicon-on-insulator substrate 50 is provided. The silicon-on-insulator substrate 50 includes a first substrate 50A, a first insulation layer 50B, and a second substrate 50C. The first substrate 50A may be a silicon or glass substrate. In some embodiments, the first substrate 50A may be a wafer, such as a silicon wafer. The first insulation layer 50B may be, for example, a buried oxide (BOX) layer, a silicon oxide layer, or the like. The second substrate 50C may be a semiconductor substrate, such as a bulk semiconductor, or the like, which may be doped (e.g., with a p-type or an n-type dopant) or undoped. The semiconductor material of the second substrate 50C may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

The silicon-on-insulator substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Further in FIG. 2, a multi-layer stack 64 is formed over the silicon-on-insulator substrate 50. The multi-layer stack 64 includes alternating layers of first semiconductor layers 51A-C (collectively referred to as first semiconductor layers 51) and second semiconductor layers 53A-C (collectively referred to as second semiconductor layers 53). For purposes of illustration and as discussed in greater detail below, the first semiconductor layers 51 will be removed and the second semiconductor layers 53 will be patterned to form channel regions of nano-FETs in both the n-type region 50N and the p-type region 50P. However, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P. In some embodiments the second semiconductor layers 53 may be removed and the first semiconductor layers 51 may be patterned to form channel regions of nano-FETs in the n-type region 50N, and the first semiconductor layers 51 may be removed and the second semiconductor layers 53 may be patterned to form channel regions of nano-FETs in the p-type region 50P. In some embodiments, the second semiconductor layers 53 may be removed and the first semiconductor layers 51 may be patterned to form channel regions of nano-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbide, or the like. Although the multi-layer stack 64 is illustrated as including a first semiconductor layer 51 as the bottommost layer, in some embodiments, the bottommost layer of the multi-layer stack 64 may be a second semiconductor layer 53.

The first semiconductor materials and the second semiconductor materials may be materials having a high etch selectivity to one another. As such, the first semiconductor layers 51 of the first semiconductor material may be removed without significantly removing the second semiconductor layers 53 of the second semiconductor material thereby allowing the second semiconductor layers 53 to be patterned to form channel regions of nano-FETs. Similarly, in embodiments in which the second semiconductor layers 53 are removed and the first semiconductor layers 51 are patterned to form channel regions, the second semiconductor layers 53 of the second semiconductor material may be removed without significantly removing the first semiconductor layers 51 of the first semiconductor material, thereby allowing the first semiconductor layers 51 to be patterned to form channel regions of nano-FETs.

Figure 3:
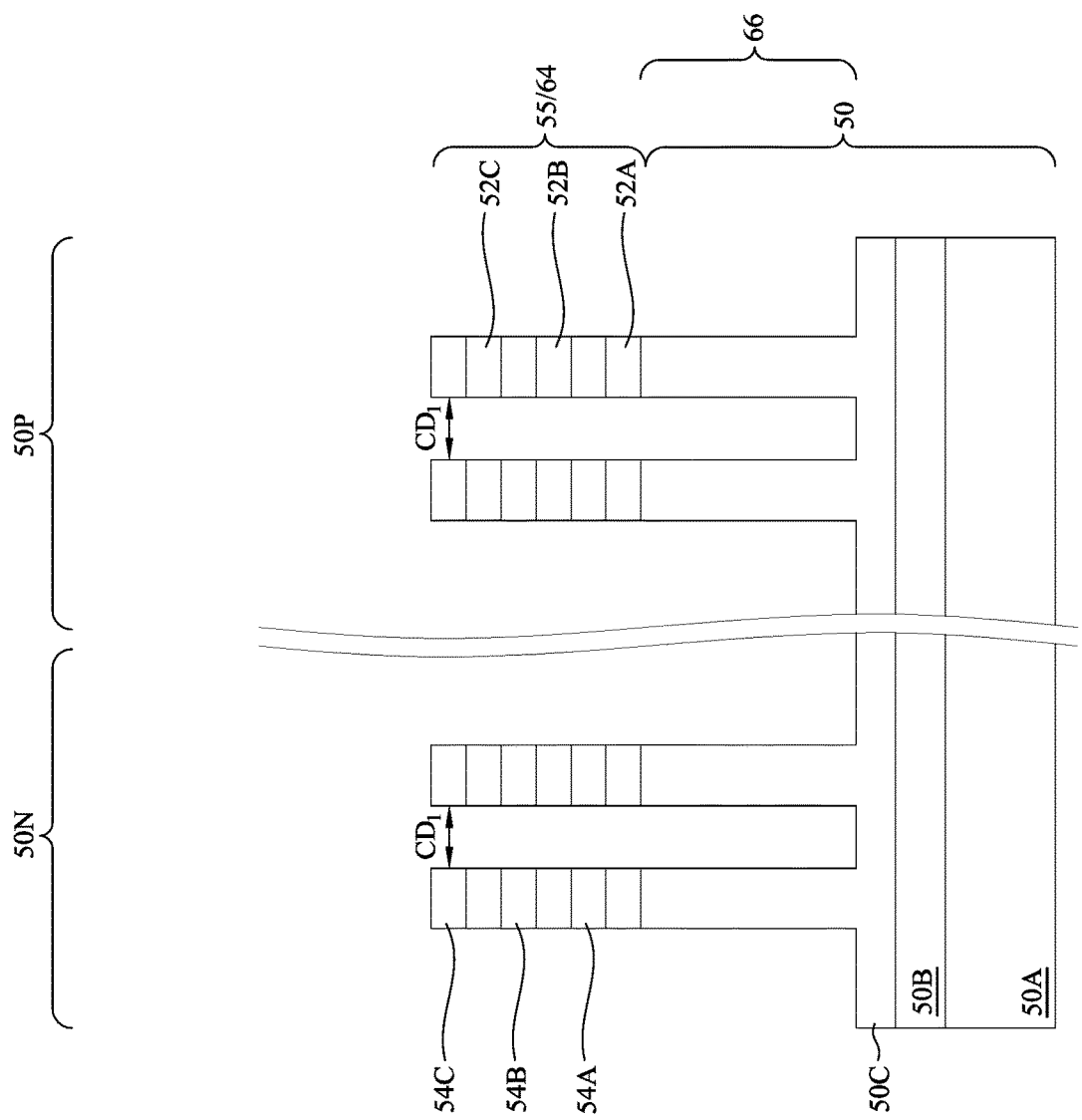

Referring now to FIG. 3, fins 66 are formed in the second substrate 50C and nanostructures 55 are formed in the multi-layer stack 64, in accordance with some embodiments. In some embodiments, the nanostructures 55 and the fins 66 may be formed in the multi-layer stack 64 and the second substrate 50C, respectively, by etching trenches in the multi-layer stack 64 and the second substrate 50C. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-C (collectively referred to as the first nanostructures 52) from the first semiconductor layers 51 and second nanostructures 54A-C (collectively referred to as the second nanostructures 54) from the second semiconductor layers 53. The first nanostructures 52 and the second nanostructures 54 may be collectively referred to as nanostructures 55. A distance $CD_1$ between adjacent fins 66 and nanostructures 55 may be from about 18 nm to about 100 nm.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 3 illustrates the fins 66 and the nanostructures 55 in the n-type region 50N and the p-type region 50P as having substantially equal widths for illustrative purposes. In some embodiments, widths of the fins 66 and the nanostructures 55 in the n-type region 50N may be greater or thinner than the fins 66 and the nanostructures 55 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the semiconductor-on-insulator substrate 50. In such embodiments, each of the nanostructures 55 may have a different width and be trapezoidal in shape.

Figure 4:
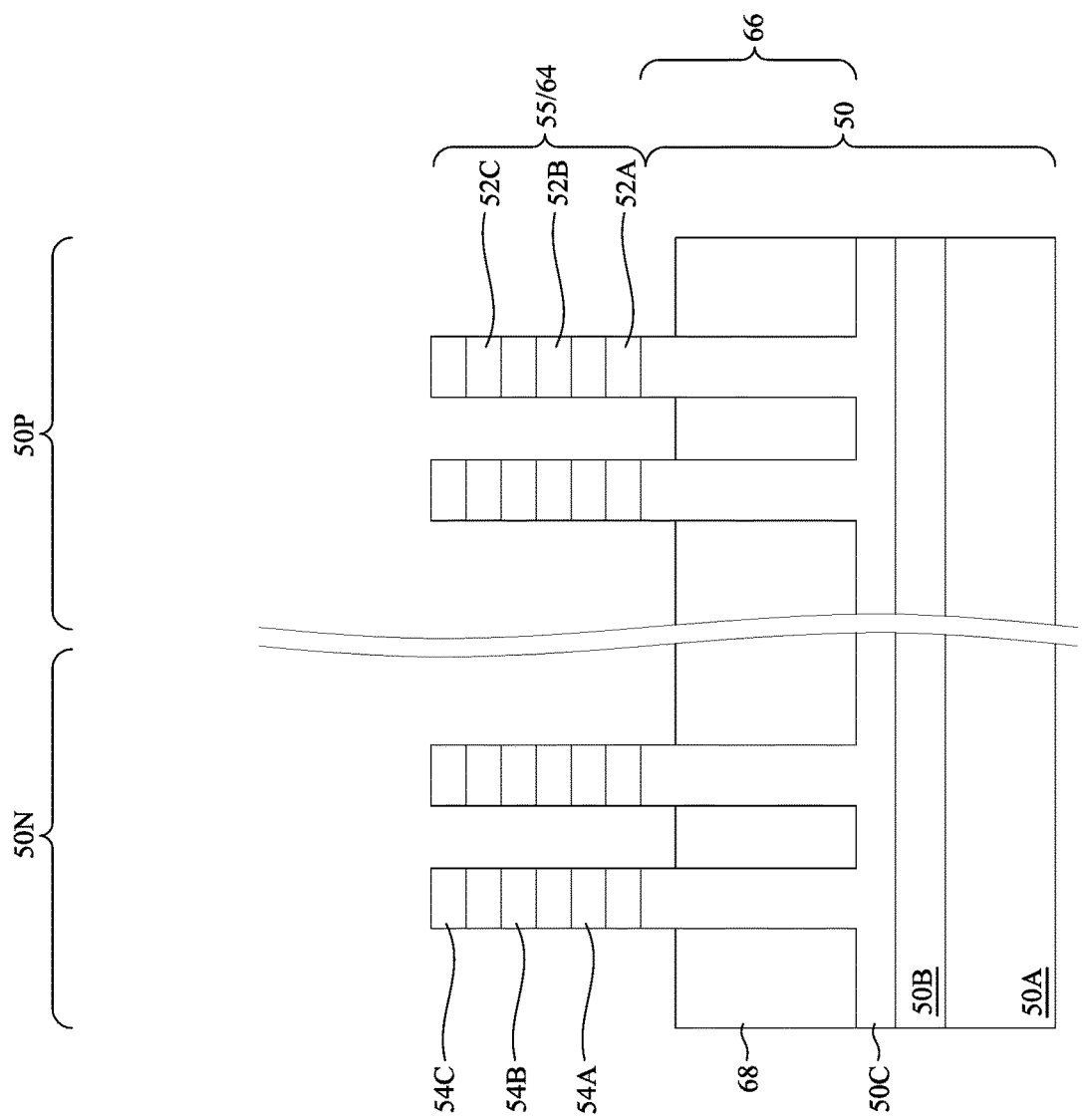

In FIG. 4, shallow trench isolation (STI) regions 68 are formed adjacent the fins 66. The STI regions 68 may be formed by depositing an insulation material over the second substrate 50C, the fins 66, and nanostructures 55, and between adjacent fins 66 and nanostructures 55. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In some embodiments, the insulation material is formed such that excess insulation material covers the nanostructures 55. Although the insulation material is illustrated as a single layer, some embodiments may utilize multiple layers. For example, in some embodiments a liner (not separately illustrated) may first be formed along surfaces of the second substrate 50C, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that the nanostructures 55 and upper portions of the fins 66 protrude from between neighboring STI regions 68 in the n-type region 50N and the p-type region 50P. Further, the top surfaces of the STI regions 68 may have flat surfaces as illustrated, convex surfaces, concave surfaces (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric acid (dHF) may be used.

The process described above with respect to FIGS. 2 through 4 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the second substrate 50C, and trenches can be etched through the dielectric layer to expose the underlying second substrate 50C. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 4, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the nanostructures 55, the fins 66, and the STI regions 68 in the n-type region 50N and the p-type region 50P. The photoresist may be patterned to expose the p-type region 50P. The photoresist may be formed by using a spin-on technique and may be patterned using acceptable photolithography techniques. Once the photoresist is patterned, an n-type impurity implant may be performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist may be removed, such as by an acceptable ashing process.

Following or prior to the implanting of the p-type region 50P, a photoresist or other masks (not separately illustrated) may be formed over the nanostructures 55, the fins 66, and the STI regions 68 in the p-type region 50P and the n-type region 50N. The photoresist may be patterned to expose the n-type region 50N. The photoresist may be formed by using a spin-on technique and may be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins and nanostructures may be in situ doped during growth, which may obviate the implantations, although in situ and implantation doping may be used together.

Figure 5:
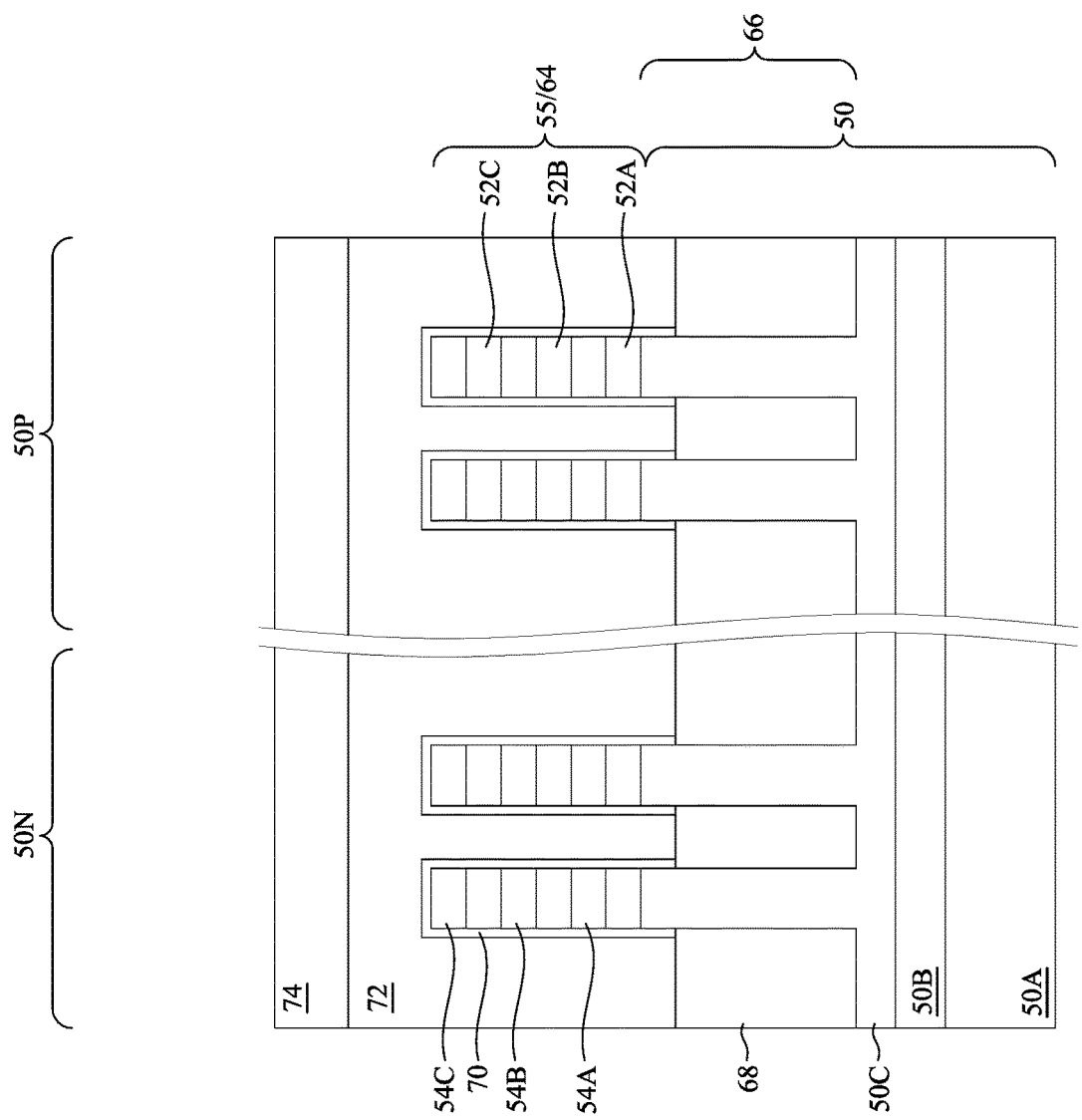

In FIG. 5, a dummy dielectric layer 70 is formed over the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive, semi-conductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of STI regions 68. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68 and the dummy dielectric layer 70 extends between the dummy gate layer 72 and the STI regions 68.

FIGS. 6A through 38C illustrate various additional steps in the manufacturing of embodiment devices. FIGS. 6C, 7C, 8C, 9C, 10C, 11C, 11D, 12C, 13C, 14C, 14F, 15C, 16C, 17C, 18C, 19C, 20C, 21C, 22C, 23C, 24C, 25C, 26C, 27C, 28C, 29C, 30C, 31C, 32C, 33C, 34C, 35C, 36C, 37C, and 38C illustrate features in either the n-type region 50N or the p-type region 50P. The remainder of FIGS. 6A through 38C illustrate features in both the n-type region 50N and the p-type region 50P.

Figure 6B:
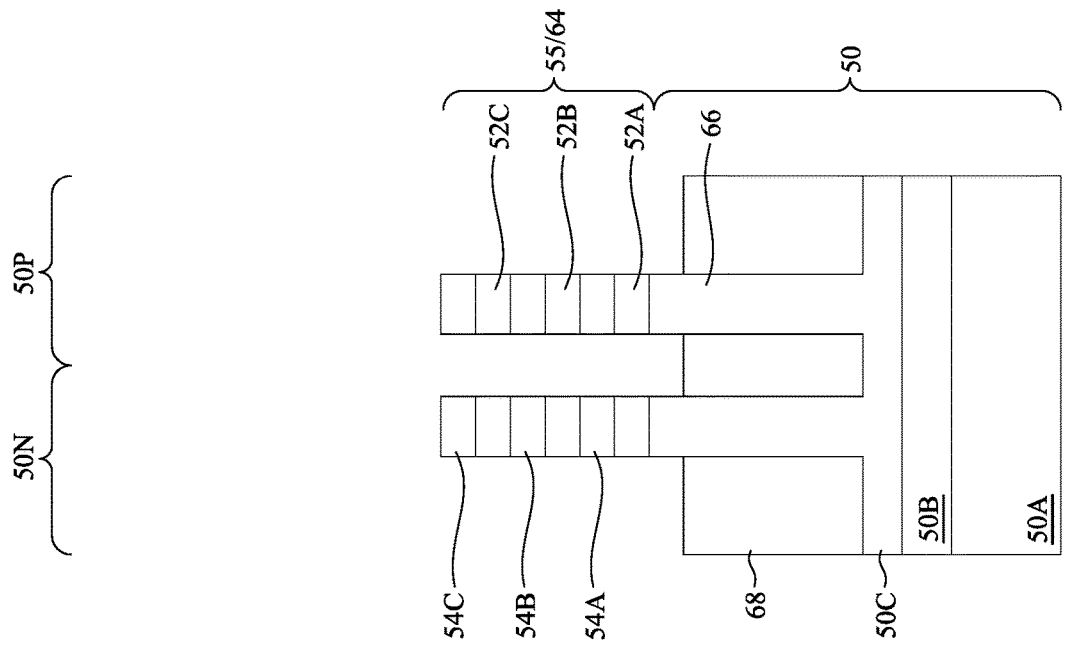
Figure 6A:
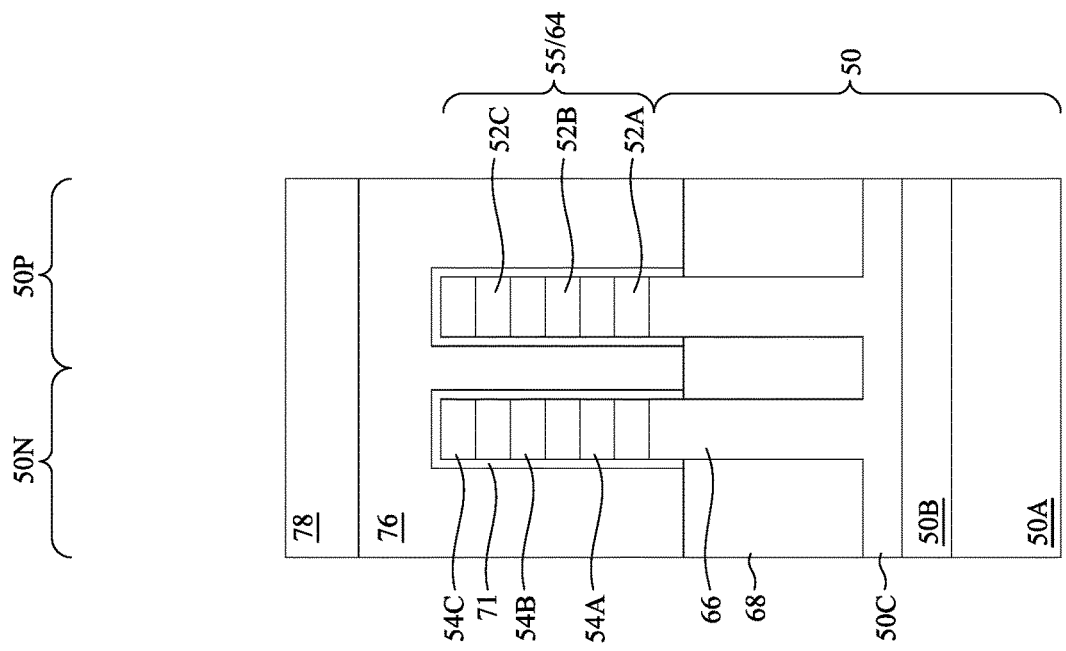
Figure 6C:
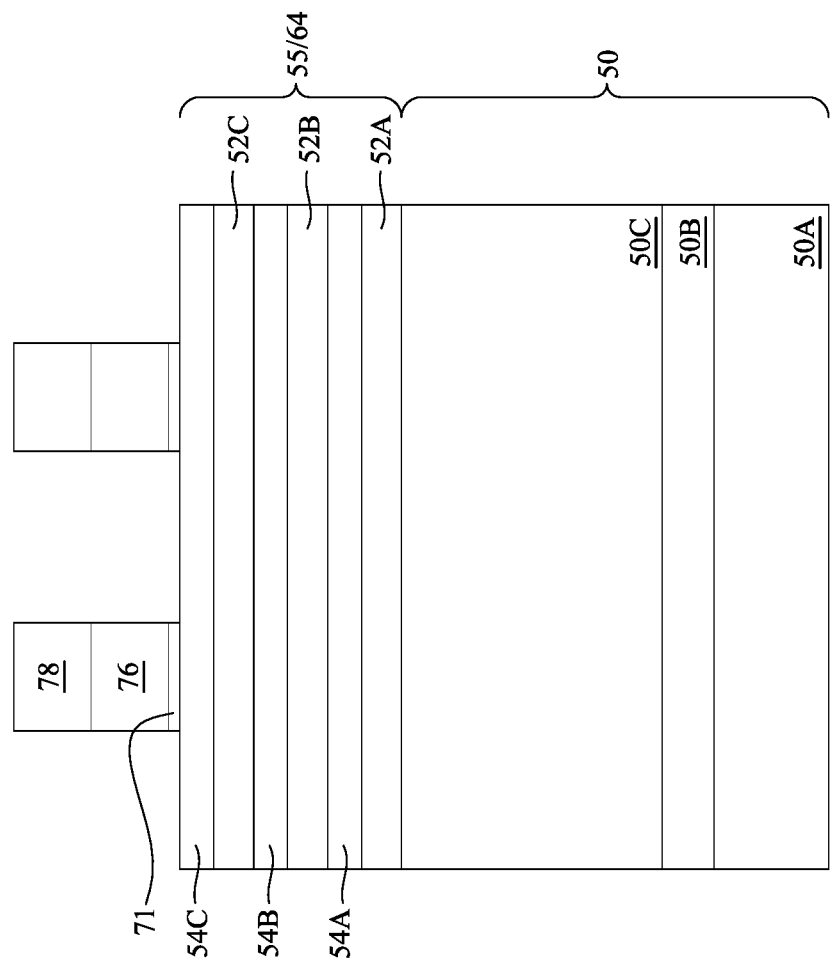

In FIGS. 6A through 6C, the mask layer 74 (see FIG. 5) may be patterned using acceptable photolithography and etching techniques to form masks 78. The pattern of the masks 78 then may be transferred to the dummy gate layer 72 and the dummy dielectric layer 70 to form dummy gates 76 and dummy gate dielectrics 71, respectively. The dummy gates 76 cover respective channel regions of the nanostructures 55. The pattern of the masks 78 may be used to physically separate each of the dummy gates 76 from adjacent dummy gates 76. The dummy gates 76 may have a lengthwise direction substantially perpendicular to the lengthwise direction of respective fins 66.

Figure 7B:
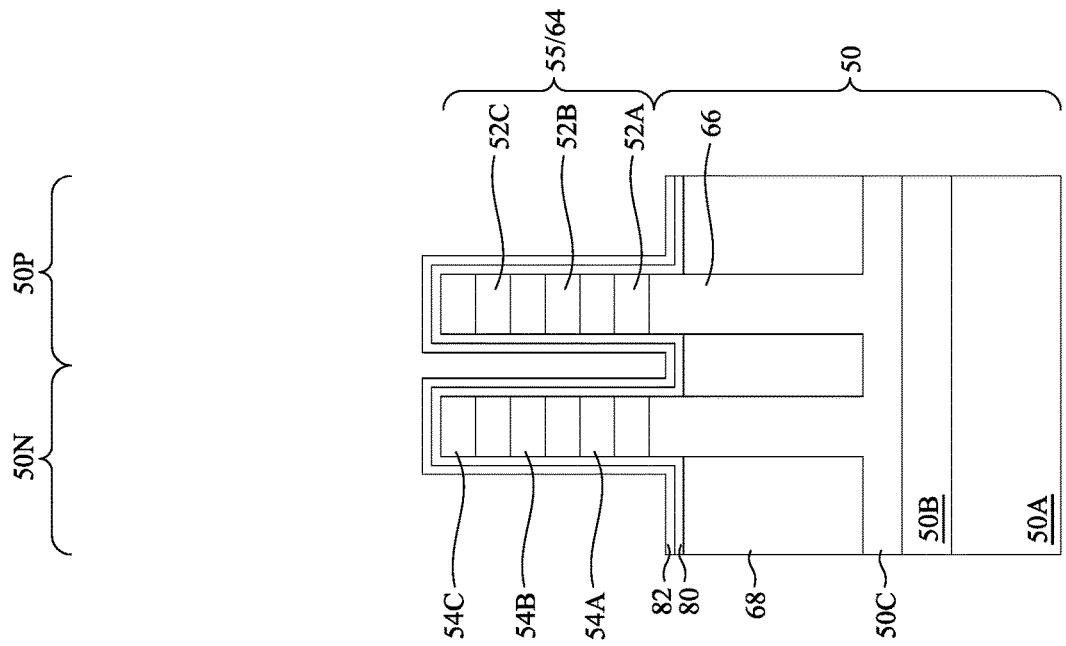
Figure 7A:
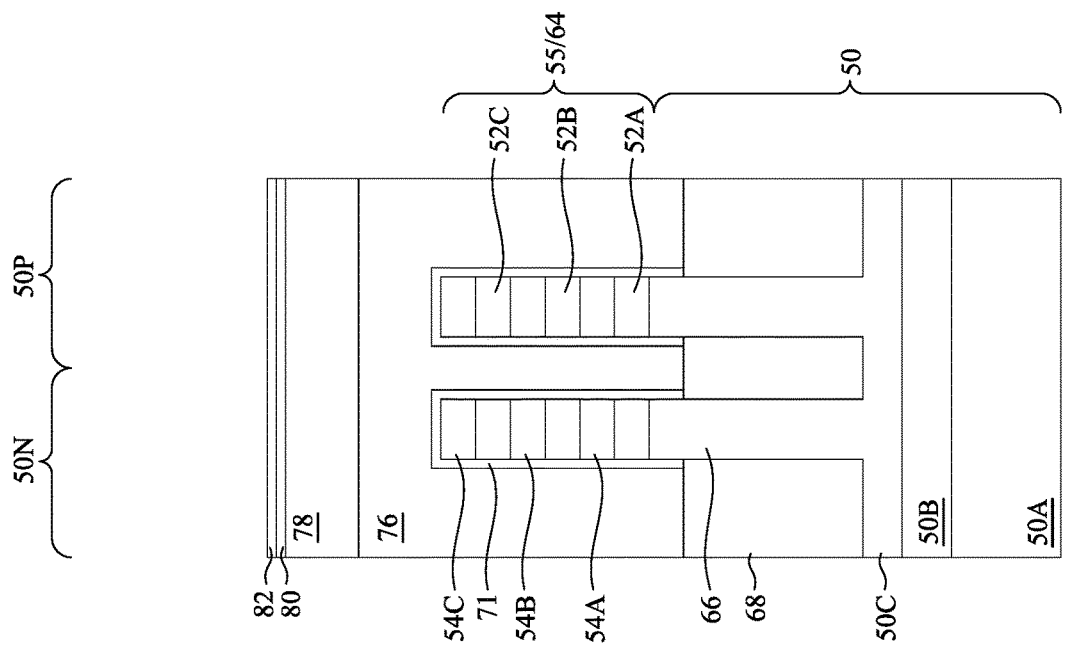
Figure 7C:
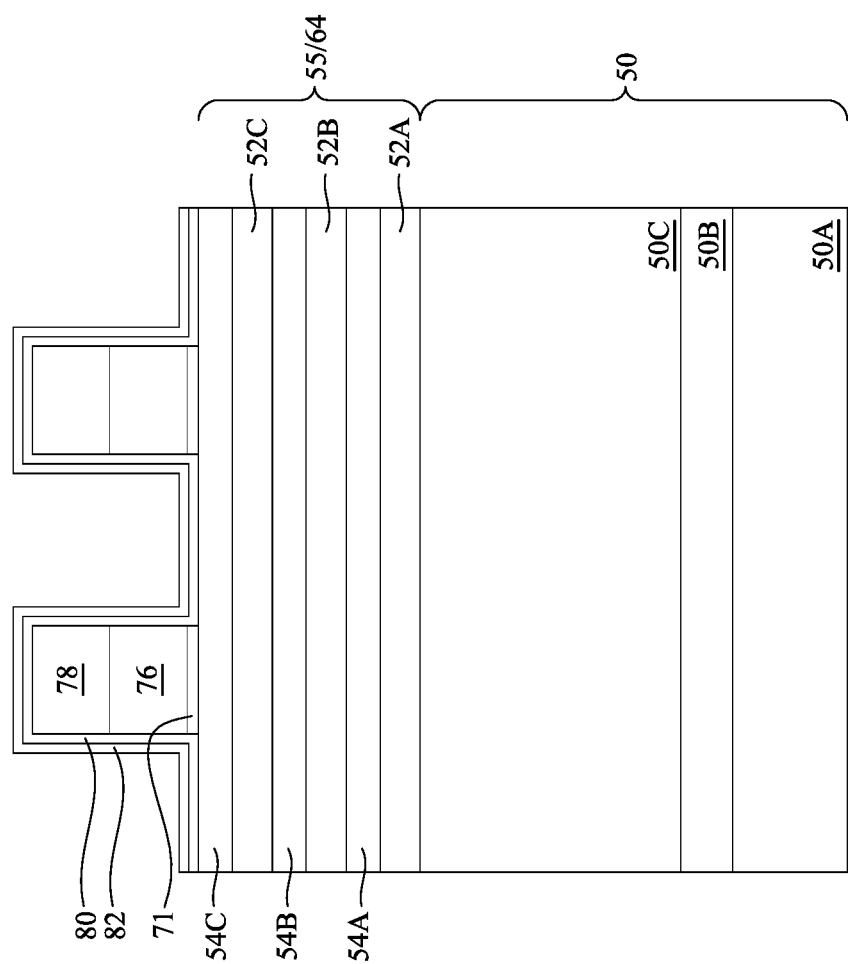

In FIGS. 7A through 7C, a first spacer layer 80 and a second spacer layer 82 are formed over the structures illustrated in FIGS. 6A through 6C, respectively. The first spacer layer 80 and the second spacer layer 82 will be subsequently patterned to act as spacers for forming self-aligned source/drain regions. In FIGS. 7A through 7C, the first spacer layer 80 is formed on top surfaces and sidewalls of the masks 78 and the nanostructures 55; top surfaces of the STI regions 68; and sidewalls of the fins 66, the dummy gates 76, and the dummy gate dielectrics 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 4, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 8B:
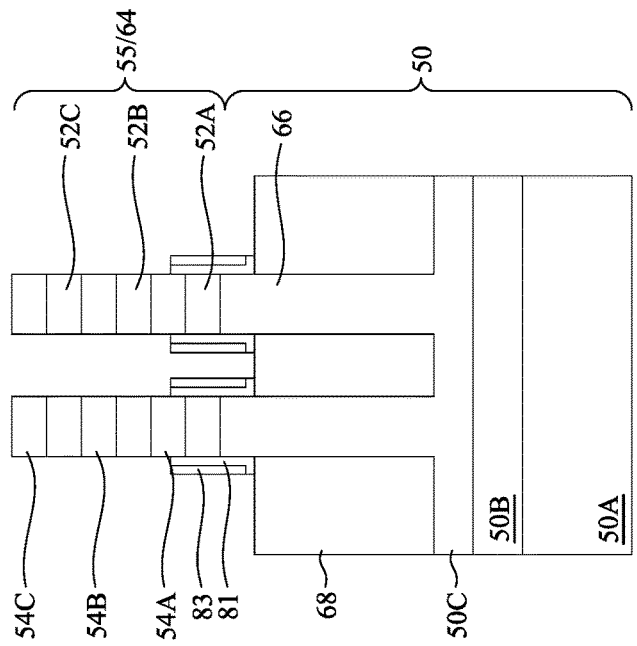
Figure 8A:
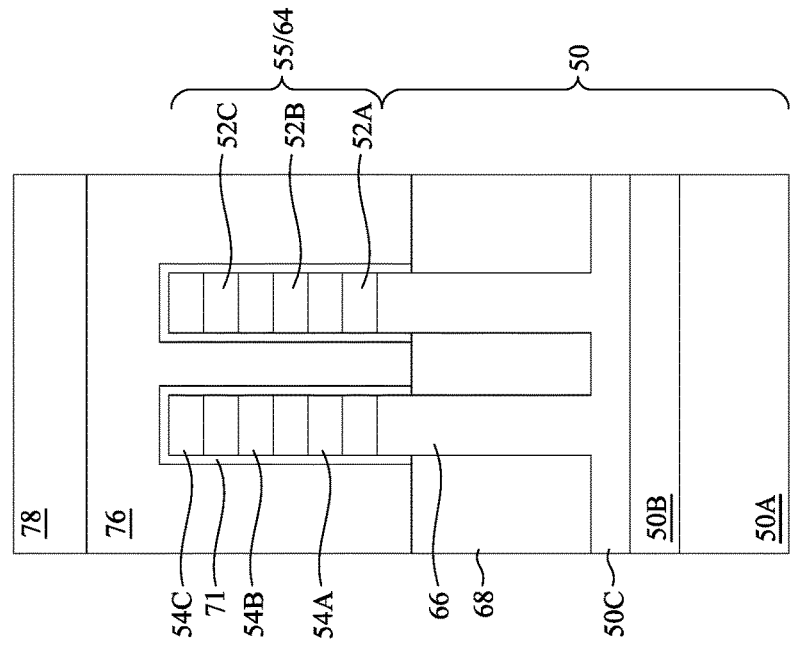
Figure 8C:
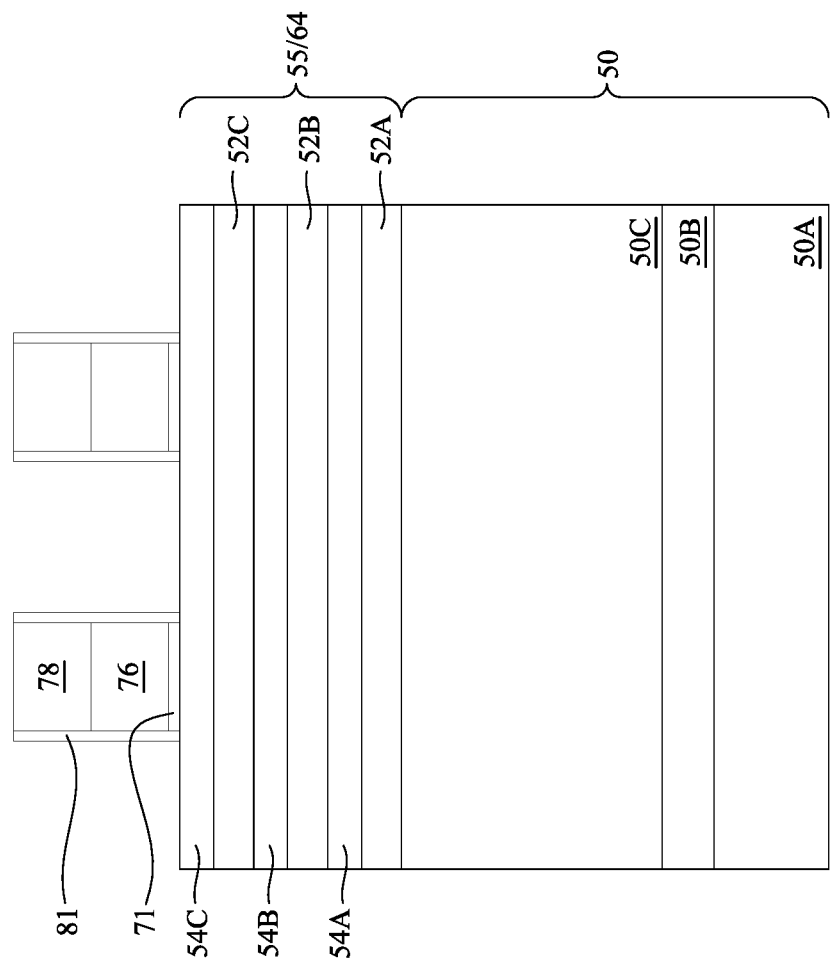

In FIGS. 8A through 8C, the first spacer layer 80 and the second spacer layer 82 are etched to form first spacers 81 and second spacers 83. As will be discussed in greater detail below, the first spacers 81 and the second spacers 83 may be used to self-align subsequently formed source drain regions, as well as to protect sidewalls of the fins 66 and/or nanostructure 55 during subsequent processing. The first spacer layer 80 and the second spacer layer 82 may be etched using suitable etching processes, such as isotropic etching processes (e.g., wet etching processes), anisotropic etching processes (e.g., dry etching processes), multiple processes or combinations thereof, or the like. In some embodiments, the material of the second spacer layer 82 has a different etch rate than the material of the first spacer layer 80, such that the first spacer layer 80 may act as an etch stop layer when patterning the second spacer layer 82. The second spacer layer 82 may also act as a mask when patterning the first spacer layer 80. For example, the second spacer layer 82 may be etched using an anisotropic etching process while the first spacer layer 80 acts as an etch stop layer. Remaining portions of the second spacer layer 82 may form second spacers 83, as illustrated in FIG. 8B. Thereafter, the second spacers 83 act as a mask while etching exposed portions of the first spacer layer 80, thereby forming first spacers 81, as illustrated in FIGS. 8B and 8C.

As illustrated in FIG. 8B, the first spacers 81 and the second spacers 83 are disposed on sidewalls of the fins 66 and/or the nanostructures 55. As illustrated in FIG. 8C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 71. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 9B:
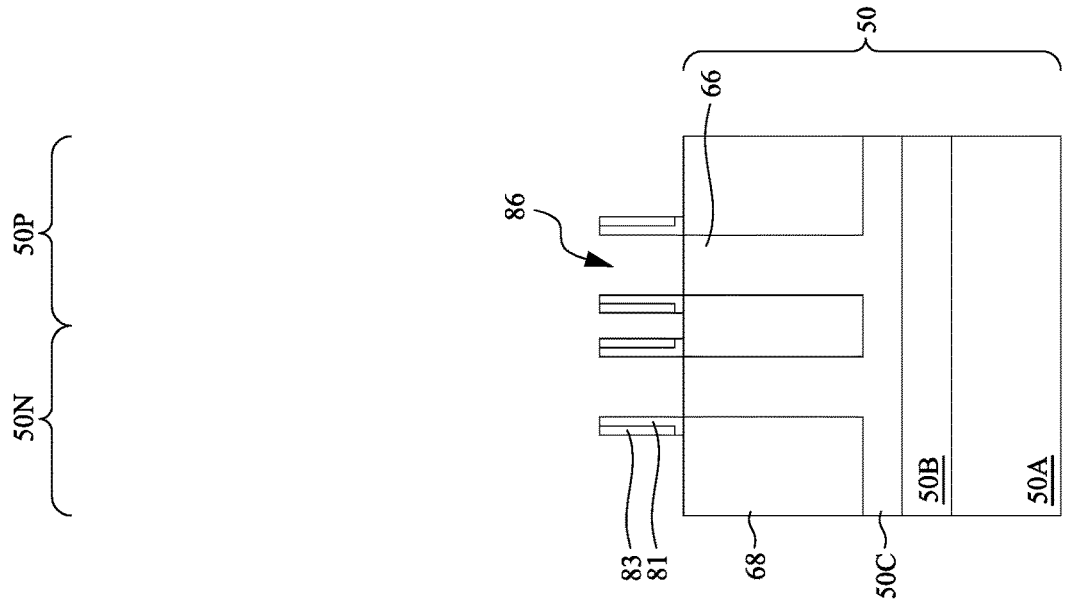
Figure 9A:
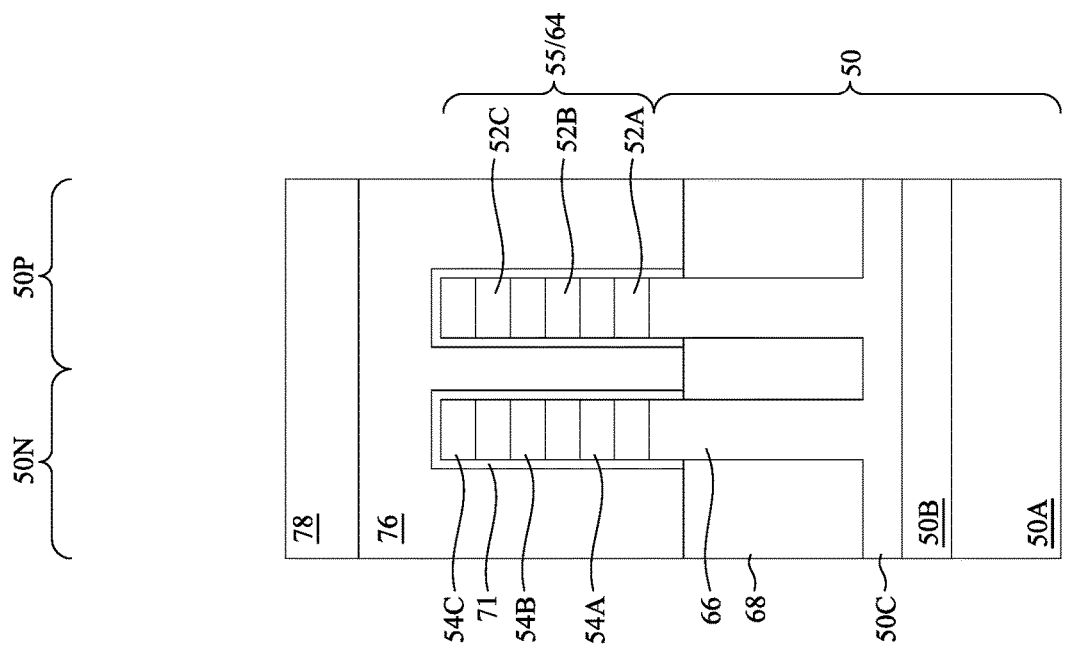
Figure 9C:
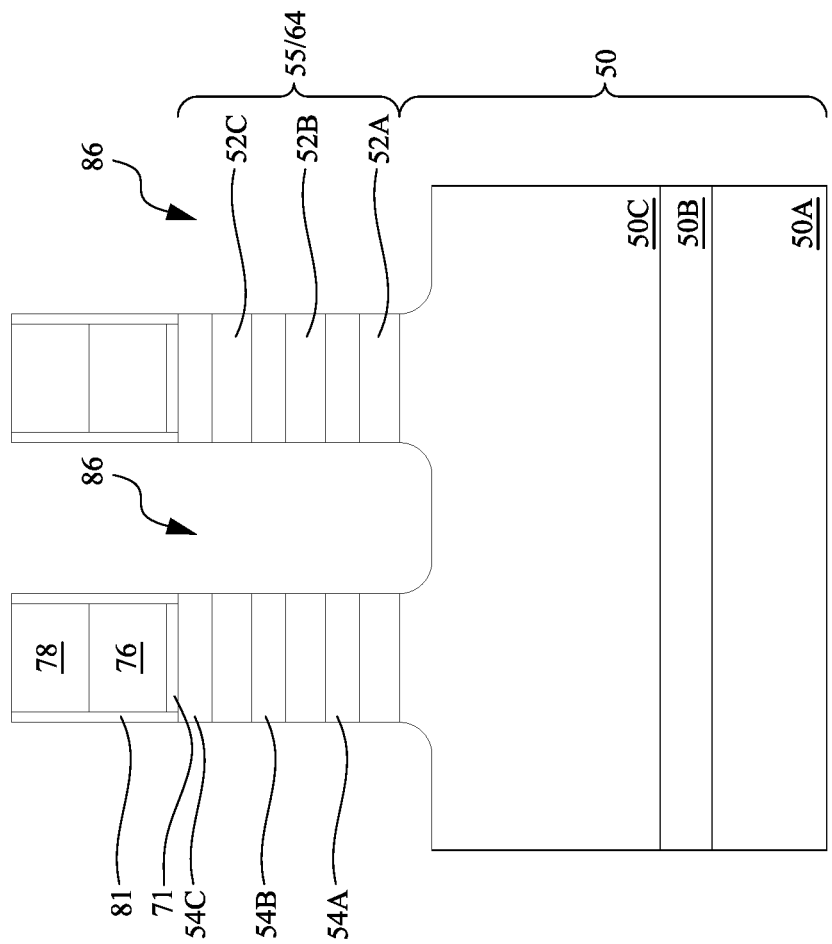

In FIGS. 9A through 9C, first recesses 86 are formed in the nanostructures 55, the fins 66, and the second substrate 50C, in accordance with some embodiments. Epitaxial source/drain regions will be subsequently formed in the first recesses 86. The first recesses 86 may extend through the first nanostructures 52 and the second nanostructures 54, and into the second substrate 50C. As illustrated in FIG. 9B, top surfaces of the STI regions 68 may be level with bottom surfaces of the first recesses 86. In various embodiments, the fins 66 may be etched such that bottom surfaces of the first recesses 86 are disposed below the top surfaces of the STI regions 68 or the like. The first recesses 86 may be formed by etching the nanostructures 55, the fins 66, and the second substrate 50C using anisotropic etching processes, such as RIE, NBE, or the like. The first spacers 81, the second spacers 83, and the masks 78 mask portions of the nanostructures 55, the fins 66, and the second substrate 50C during the etching processes used to form the first recesses 86. A single etching process or multiple etching processes may be used to etch each layer of the nanostructures 55, the fins 66, and/or the second substrate 50C. Timed etching processes may be used to stop the etching of the first recesses 86 after the first recesses 86 reach a desired depth.

Figure 10B:
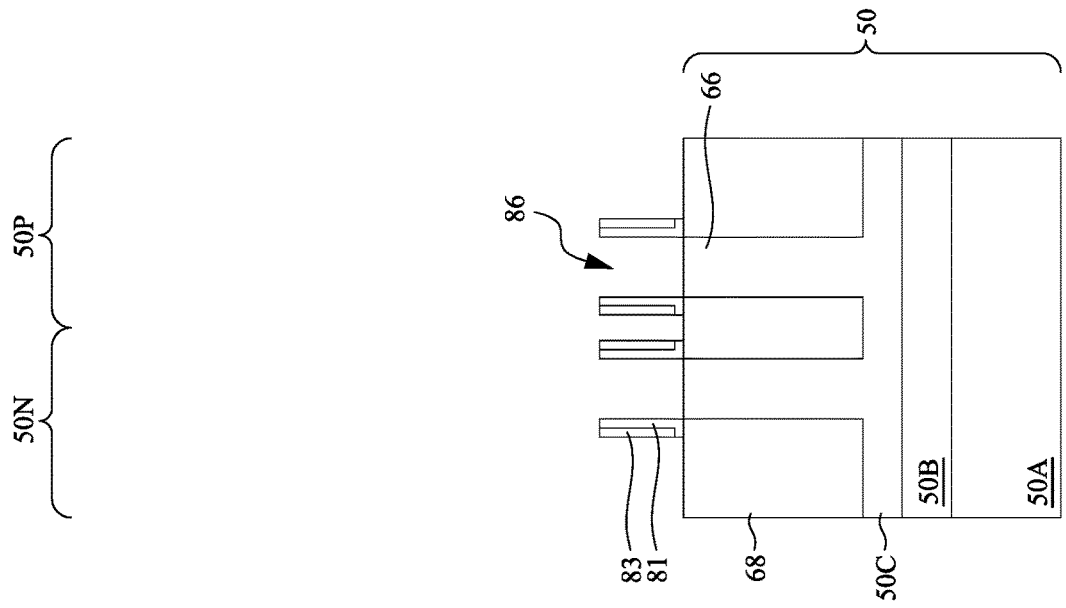
Figure 10A:
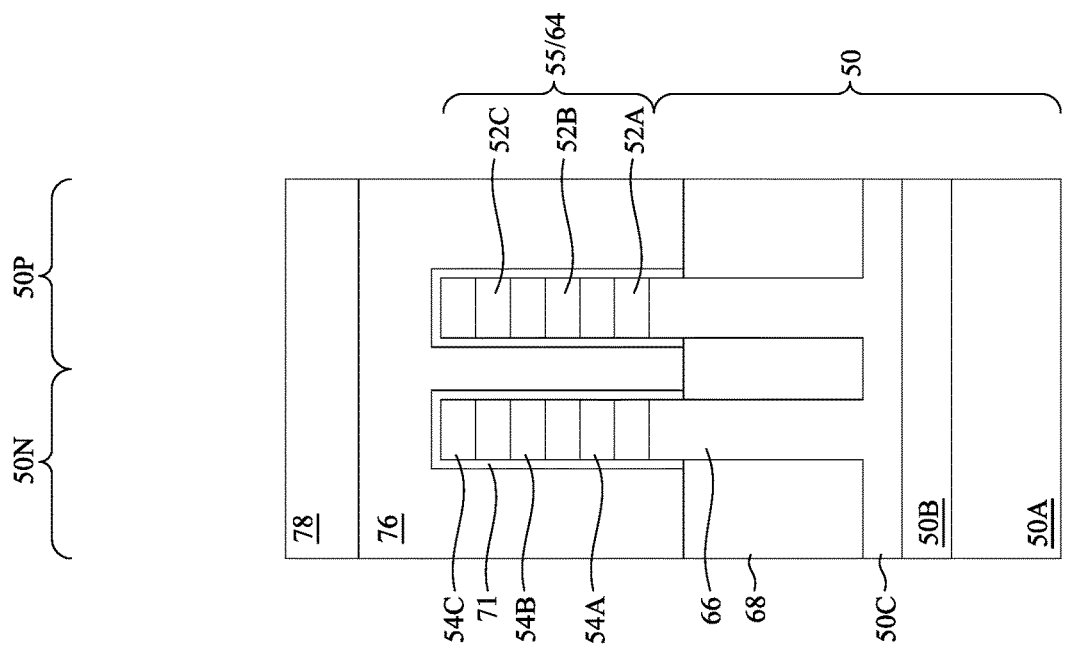
Figure 10C:
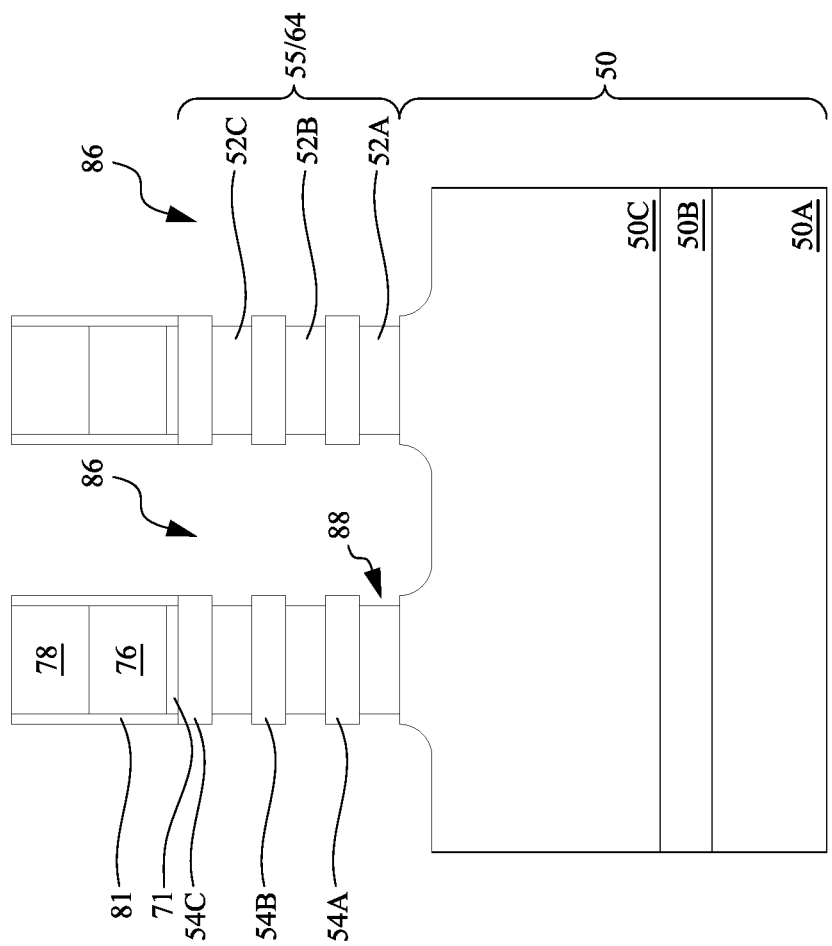

In FIGS. 10A through 10C, portions of sidewalls of the layers of the multi-layer stack 64 formed of the first semiconductor materials (e.g., the first nanostructures 52) exposed by the first recesses 86 are etched to form sidewall recesses 88. Although sidewalls of the first nanostructures 52 adjacent the sidewall recesses 88 are illustrated as being straight in FIG. 10C, the sidewalls may be concave or convex. The sidewalls may be etched using isotropic etching processes, such as wet etching or the like. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52.

Figure 11B:
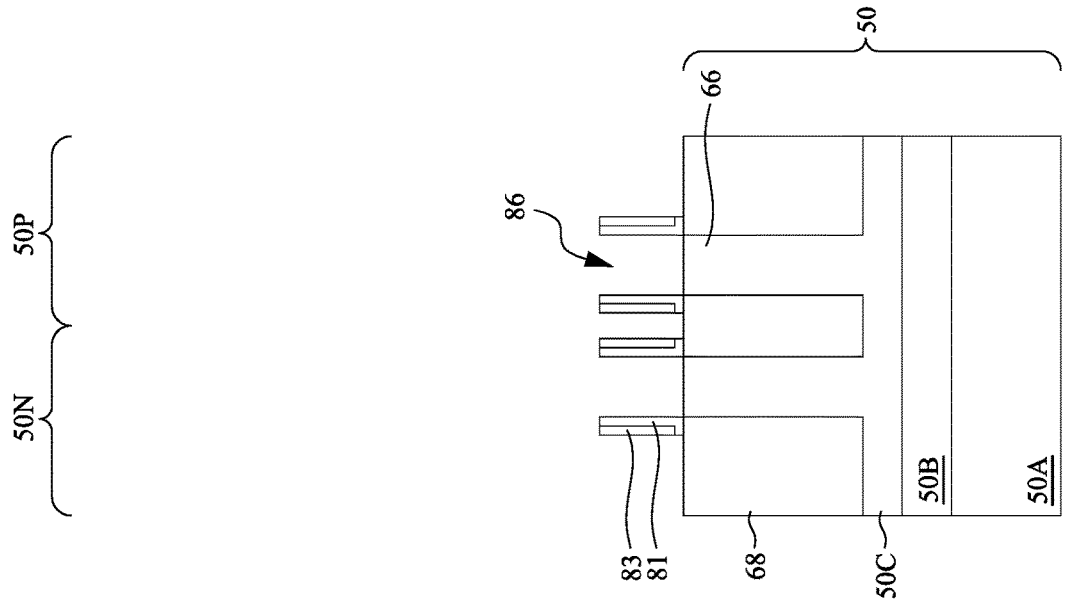
Figure 11A:
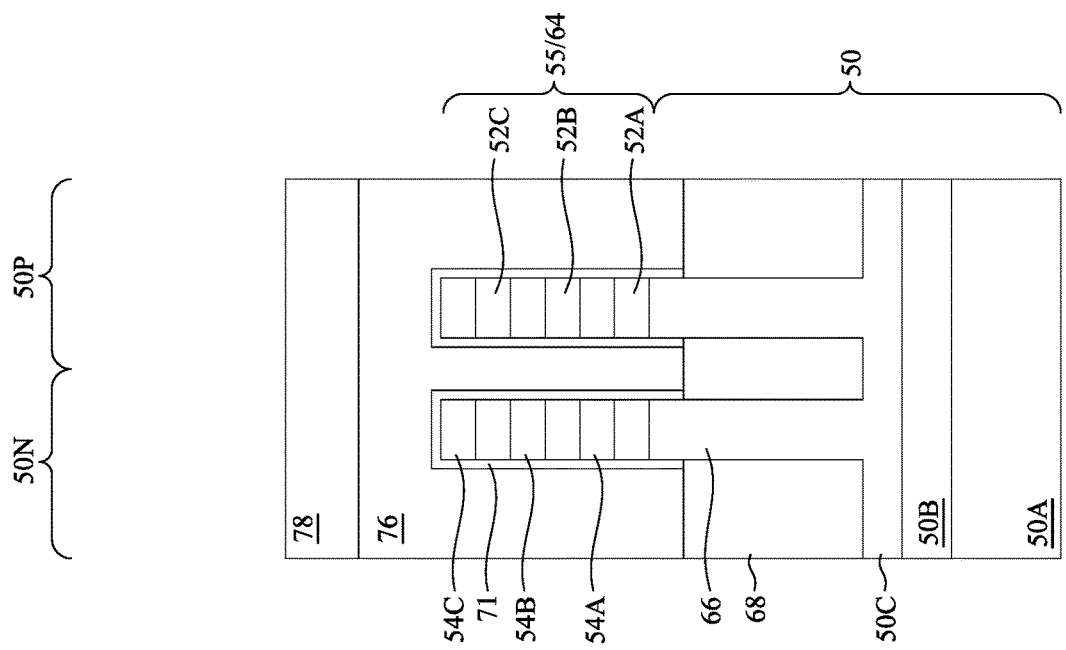
Figure 11C:
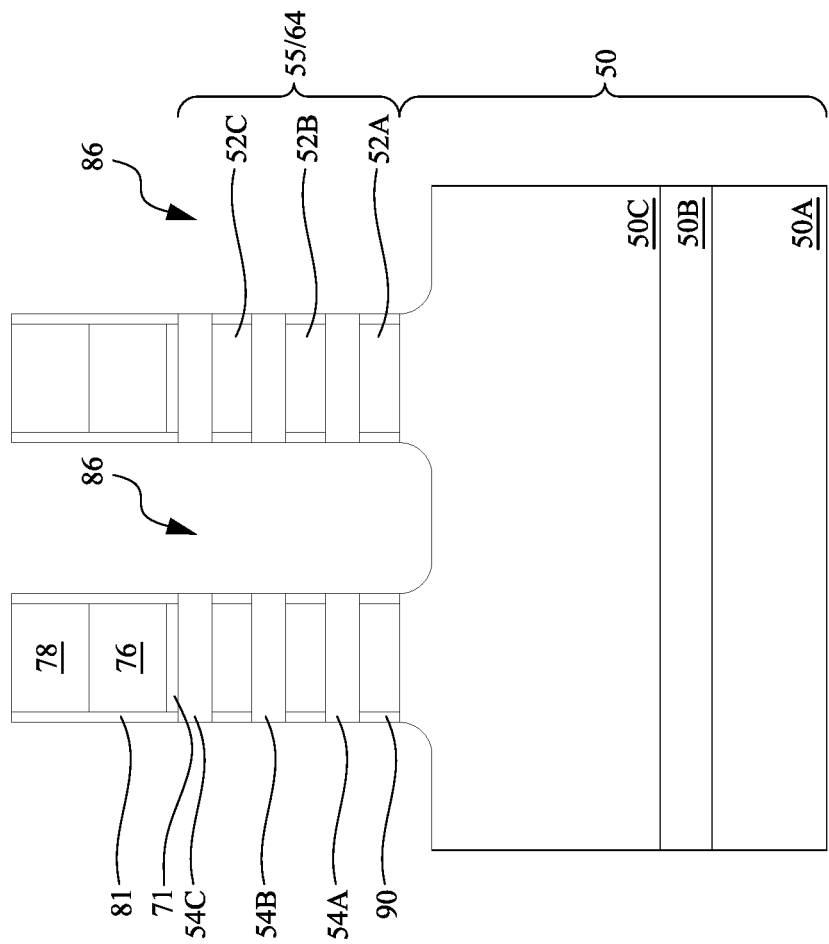
Figure 11D:
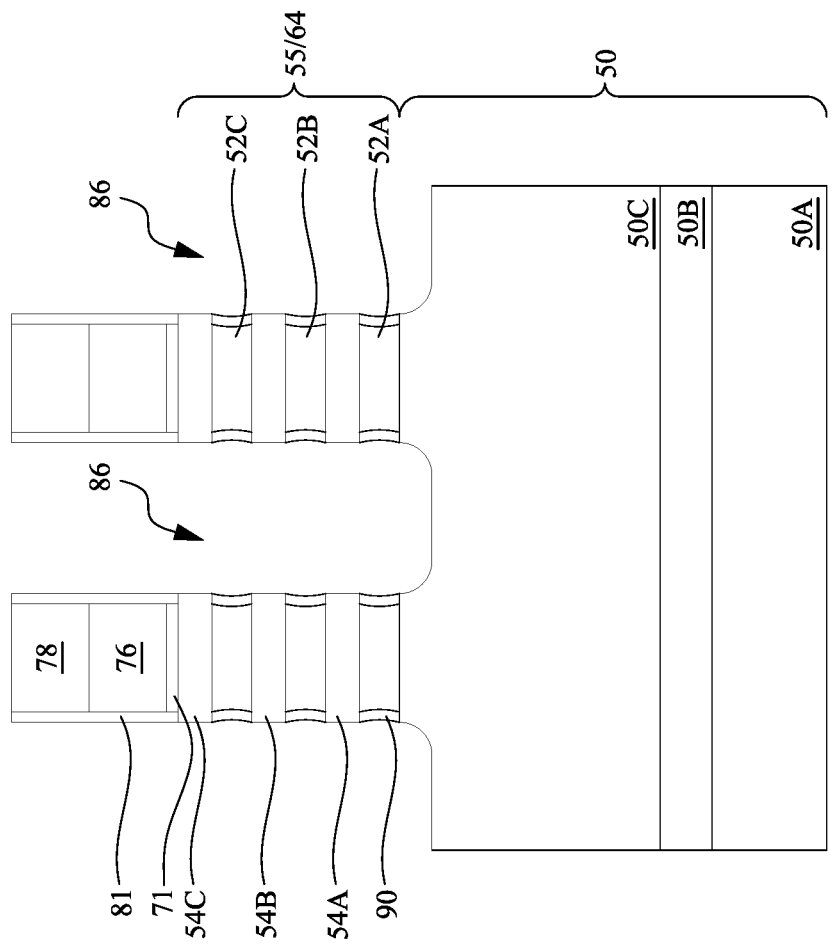

In FIGS. 11A through 11D, first inner spacers 90 are formed in the sidewall recess 88. The first inner spacers 90 may be formed by depositing an inner spacer layer (not separately illustrated) over the structures illustrated in FIGS. 10A through 10C. The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may be etched by an anisotropic etching process, such as RIE, NBE, or the like, to form the first inner spacers 90. Although outer sidewalls of the first inner spacers 90 are illustrated as being flush with sidewalls of the second nanostructures 54, the outer sidewalls of the first inner spacers 90 may extend beyond or be recessed from sidewalls of the second nanostructures 54. Moreover, although the outer sidewalls of the first inner spacers 90 are illustrated as being straight in FIG. 11C, the outer sidewalls of the first inner spacers 90 may be concave or convex. As an example, FIG. 11D illustrates an embodiment in which sidewalls of the first nanostructures 52 are concave, outer sidewalls of the first inner spacers 90 are concave, and the first inner spacers are recessed from sidewalls of the second nanostructures 54.

The first inner spacers 90 act as isolation features between subsequently formed source/drain regions (such as the epitaxial source/drain regions 92, discussed below with respect to FIGS. 14A through 14E) and subsequently formed gate structures (such as the gate structures including gate dielectric layers 100 and gate electrodes 102, discussed below with respect to FIGS. 19A through 19C). As will be discussed in greater detail below, the source/drain regions will be formed in the first recesses 86, while the first nanostructures 52 will be replaced with corresponding gate structures. The first inner spacers 90 may also be used to prevent damage to the source/drain regions by subsequent etching processes, such as etching processes used to form the gate structures.

Figure 12B:
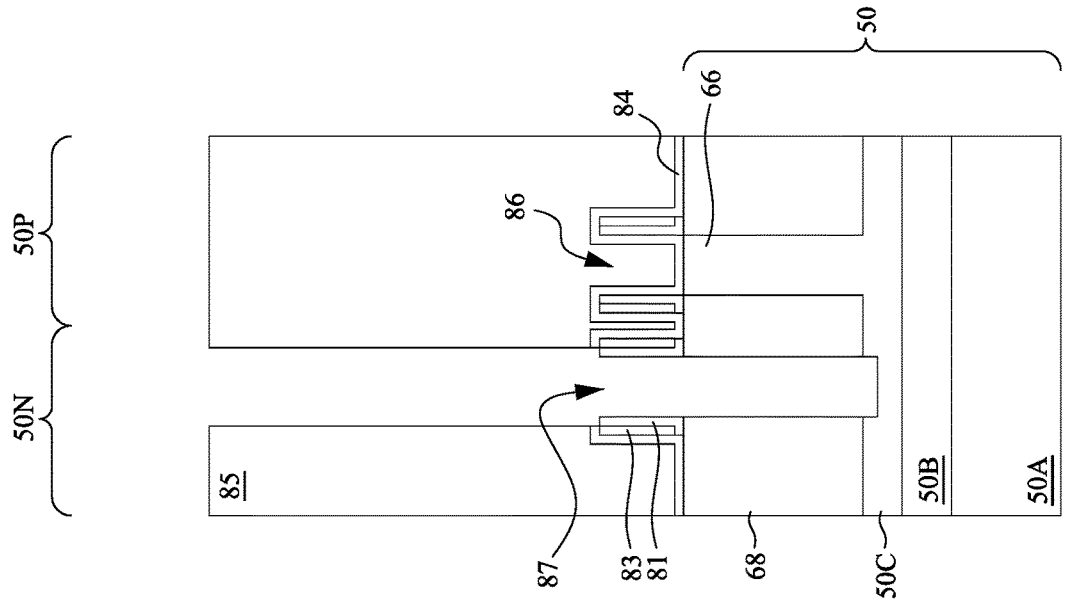
Figure 12A:
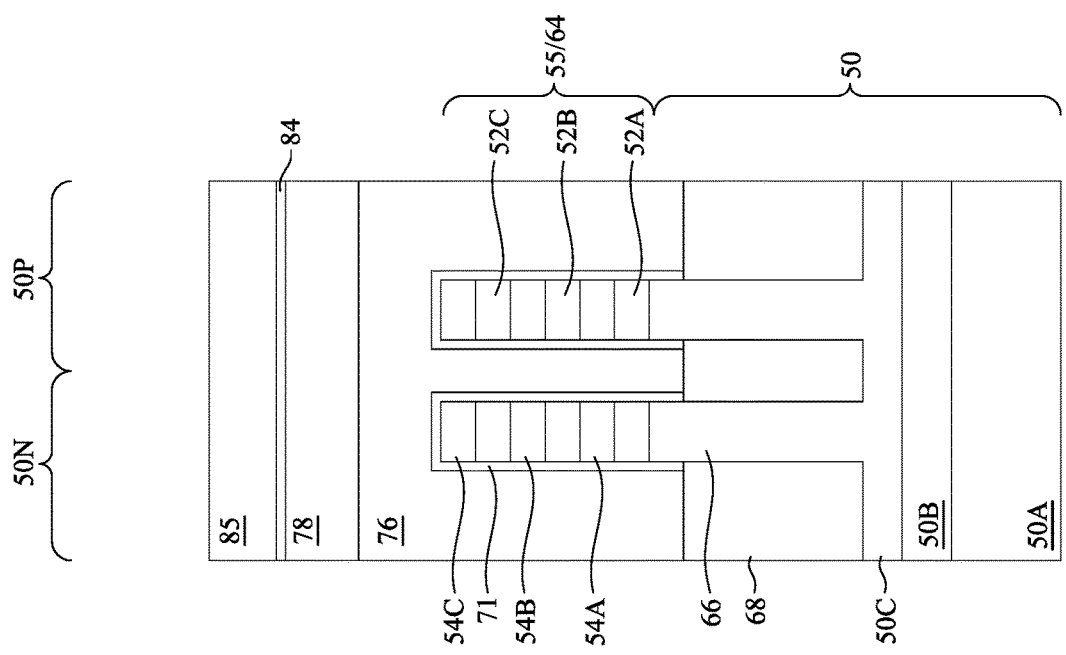
Figure 12C:
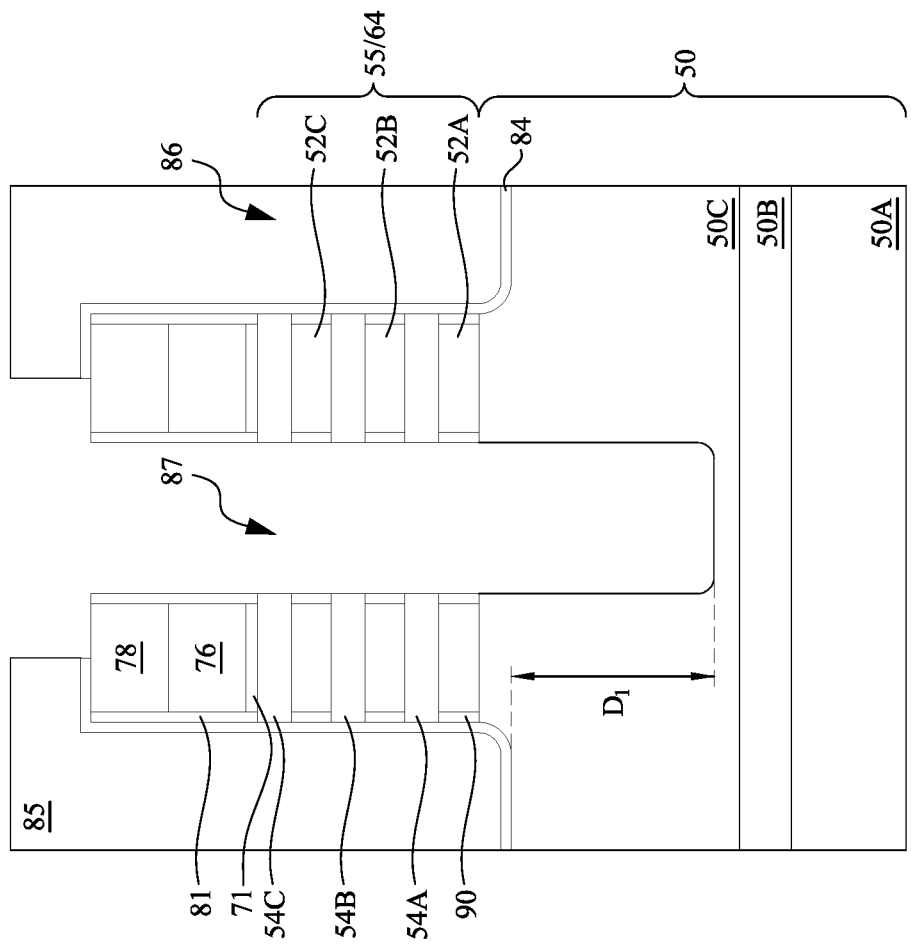

In FIGS. 12A through 12C, a first patterned hard mask layer 84 and a first patterned photoresist layer 85 are formed over the structures illustrated in FIGS. 11A through 11C, respectively. The first patterned hard mask layer 84 and the first patterned photoresist layer 85 may act as a mask for etching the second substrate 50C to extend the first recesses 86 in selected regions of the second substrate 50C. In some embodiments, the selected regions of the second substrate 50C may correspond to locations of subsequently formed backside source/drain contacts (such as the backside vias 144, discussed below with respect to FIGS. 35A through 35D). A first hard mask layer (not separately illustrated) may be deposited on top surfaces of the masks 78 and the STI regions 68; top surfaces and sidewalls of the first spacers 81, the second spacers 83, and the second substrate 50C; and sidewalls of the first inner spacers 90 and the second nanostructures 54. The first hard mask layer may be deposited by CVD, ALD, or the like. The first hard mask layer may comprise silicon oxide, silicon nitride, silicon carbide, amorphous silicon, titanium nitride, silicon oxynitride, silicon carbonitride, combinations or multiple layers thereof, or the like.

A first photoresist layer (not separately illustrated) may then be deposited over the first hard mask layer. The first photoresist layer may be deposited using spin-on coating or the like. The first photoresist layer may then be patterned by exposing the photoresist layer to a patterned energy source (e.g., a patterned light source) and developing the first photoresist layer to remove an exposed or unexposed portion of the first photoresist layer, thereby forming the first patterned photoresist layer 85. The hard mask layer may be etched by a suitable etching process, such as an anisotropic etching process, to transfer the pattern of the first patterned photoresist layer 85 to the first hard mask layer, forming the first patterned hard mask layer 84. In some embodiments, the etching process may include reactive ion etching (RIE), neutral beam etching (NBE), the like, or a combination thereof.

Further in FIGS. 12A through 12C, the first patterned photoresist layer 85 and the first patterned hard mask layer 84 are used as masks to etch the second substrate 50C. The second substrate 50C may be etched to extend the first recesses 86, forming second recesses 87. Sacrificial materials will be subsequently formed in the second recesses 87 and subsequently replaced by back-side vias. The second recesses 87 may extend into the second substrate 50C a depth $D_1$ below bottom surfaces of the first recesses 86. In some embodiments, the depth $D_1$ may be from about 15 nm to about 50 nm. As illustrated in FIGS. 12B and 12C, at least a portion of the second substrate 50C may remain underneath the second recesses 87, between the second recesses 87 and the first insulation layer 50B. As illustrated in FIG. 12B, the second recesses 87 may extend through a fin 66. The second recesses 87 may be formed by etching the fins 66 and the second substrate 50C using anisotropic etching processes, such as RIE, NBE, or the like. A single etching process or multiple etching processes may be used to etch the fins 66 and/or the second substrate 50C. Timed etching processes may be used to stop the etching of the second recesses 87 after the second recesses 87 reach a desired depth.

Figure 13B:
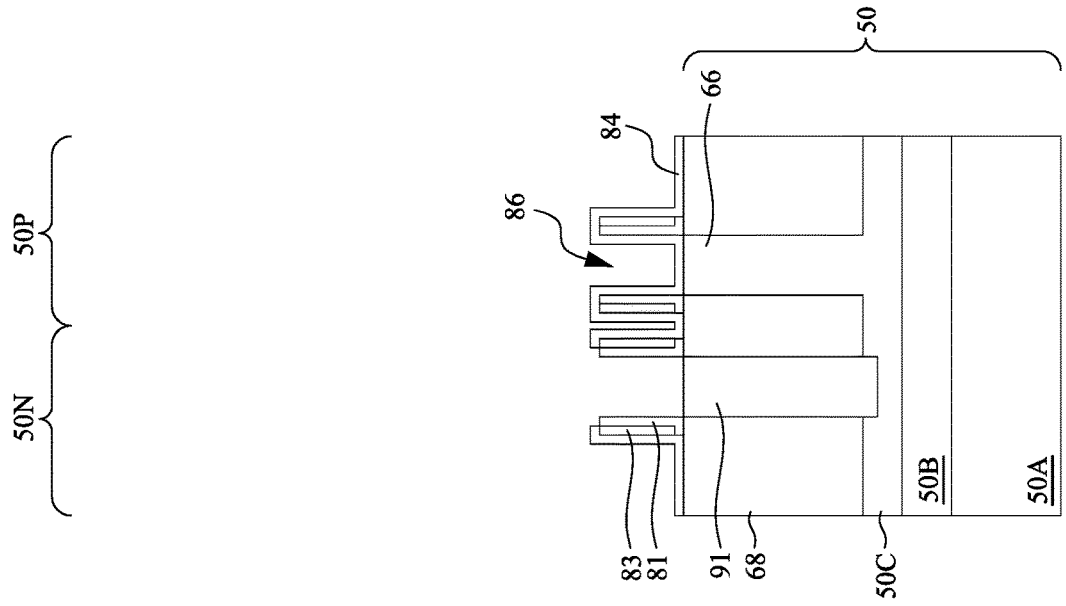
Figure 13A:
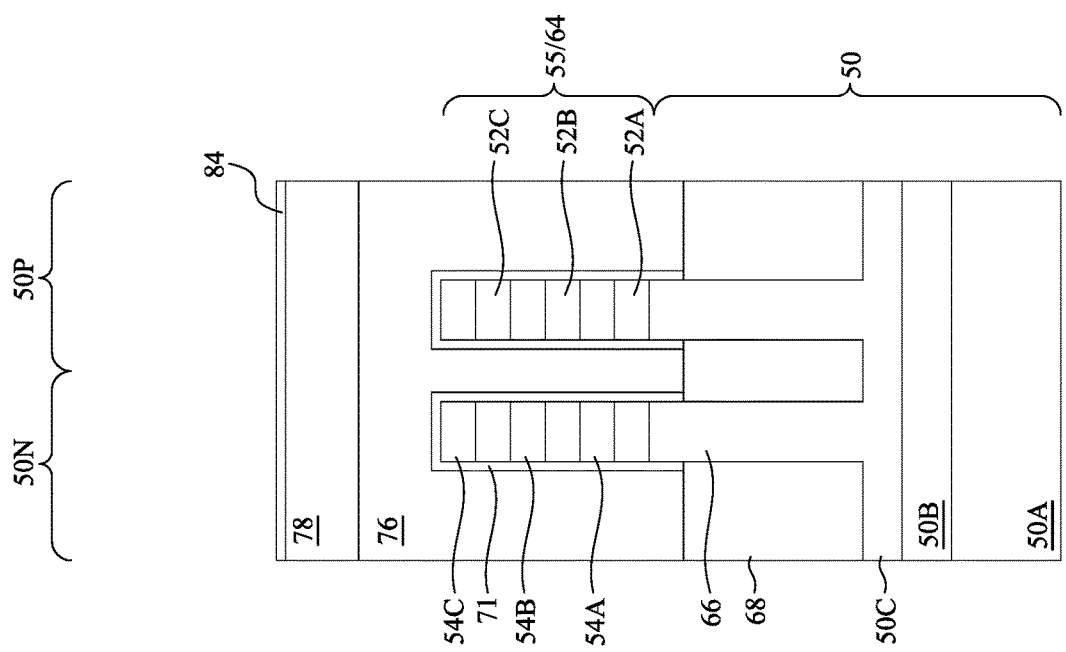
Figure 13C:
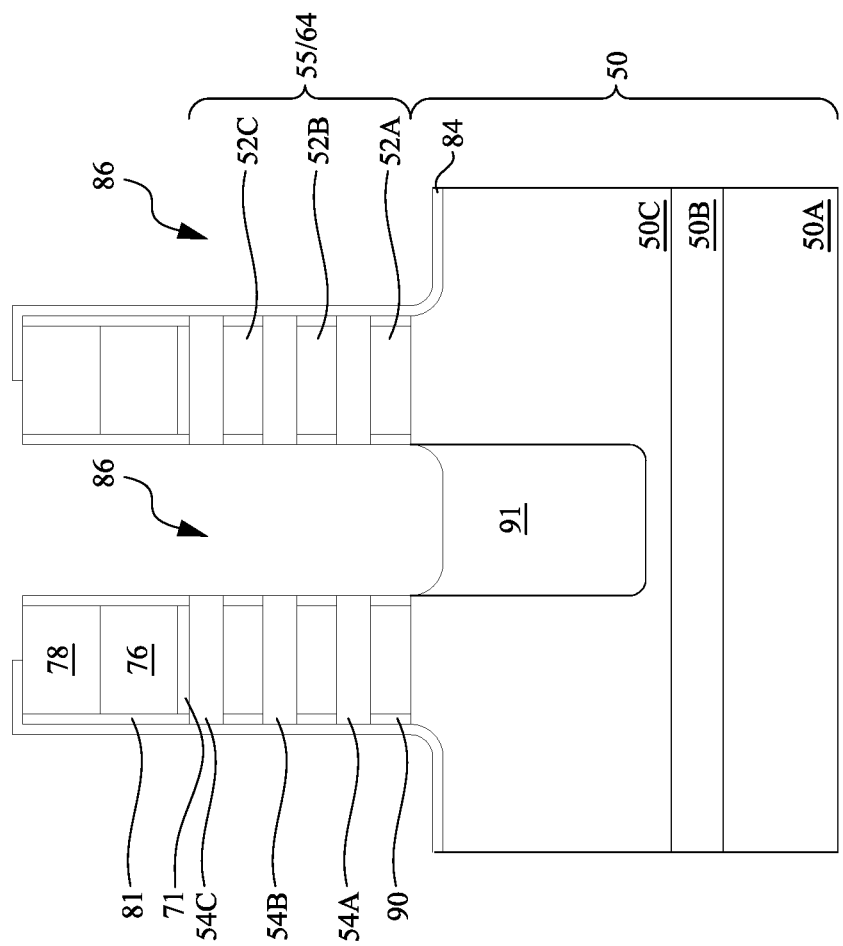

In FIGS. 13A through 13C, a first epitaxial material 91 is formed in the second recesses 87. In some embodiments, the first epitaxial material 91 may be a sacrificial material, which is subsequently removed to form backside vias (such as the backside vias 144, discussed below with respect to FIGS. 35A through 35D). As illustrated in FIGS. 13B and 13C, top surfaces of the first epitaxial material 91 may be level with bottom surfaces of the first recesses 86. However, in some embodiments, top surfaces of the first epitaxial material 91 may be disposed above or below bottom surfaces of the first recesses 86. The first epitaxial material 91 may be epitaxially grown in the second recesses 87 using a process such as chemical vapor deposition (CVD), atomic layer deposition (ALD), vapor phase epitaxy (VPE), molecular beam epitaxy (MBE), or the like. The first epitaxial material 91 may include any acceptable material, such as silicon germanium or the like. In embodiments in which the first epitaxial material 91 includes silicon germanium, a germanium concentration in the first epitaxial material 91 may be greater than germanium concentrations of subsequently formed source/drain regions (such as the epitaxial source/drain regions 92, discussed below with respect to FIGS. 14A through 14F). Providing the first epitaxial material 91 with a germanium concentration greater than that of the epitaxial source/drain regions allows the substrate 50 to be selectively etched with respect to the first epitaxial material 91 in subsequent process steps. Further, providing the first epitaxial material 91 with a germanium concentration greater than that of the epitaxial source/drain regions may also allow for the first epitaxial material 91 to be selectively etched with respect to the subsequently formed source/drain regions and subsequently formed dielectric layers (such as the third spacers 128, the fourth ILD 136, and the fifth ILD 140, discussed below with respect to FIGS. 28A through 28D, 32A through 32G, and 34A through 34D, respectively).

The first epitaxial material 91 may be formed of a material having high etch selectivity to materials of subsequently formed epitaxial source/drain regions (such as the epitaxial source/drain regions 92, discussed below with respect to FIGS. 14A through 14F) and dielectric layers (such as the fourth ILD 136, discussed below with respect to FIGS. 32A through 32G and the third spacers 128, discussed below with respect to FIGS. 28A through 28D). As such, the first epitaxial material 91 may be removed and replaced with the backside vias without significantly removing the epitaxial source/drain regions and the interlayer dielectrics.

Further in FIGS. 13A through 13C, the first patterned photoresist layer 85 may be removed. The first patterned photoresist layer 85 may be removed by any acceptable process, such as an ashing process, a stripping process, the like, or a combination thereof.

In FIGS. 14A through 14F, the first patterned hard mask layer 84 is removed and epitaxial source/drain regions 92 are formed in the first recesses 86. The first patterned hard mask layer 84 may be removed by a suitable etching process, which may be an isotropic etching process, such as a wet etching process. The etching process may have a high etch selectivity to materials of the first patterned hard mask layer 84. As such, the first patterned hard mask layer 84 may be removed without significantly removing materials of the masks 78, the STI regions 68, the second spacers 83, the first spacers 81, the fins 66, the first epitaxial material 91, the first inner spacers 90, or the second nanostructures 54.

Figure 14B:
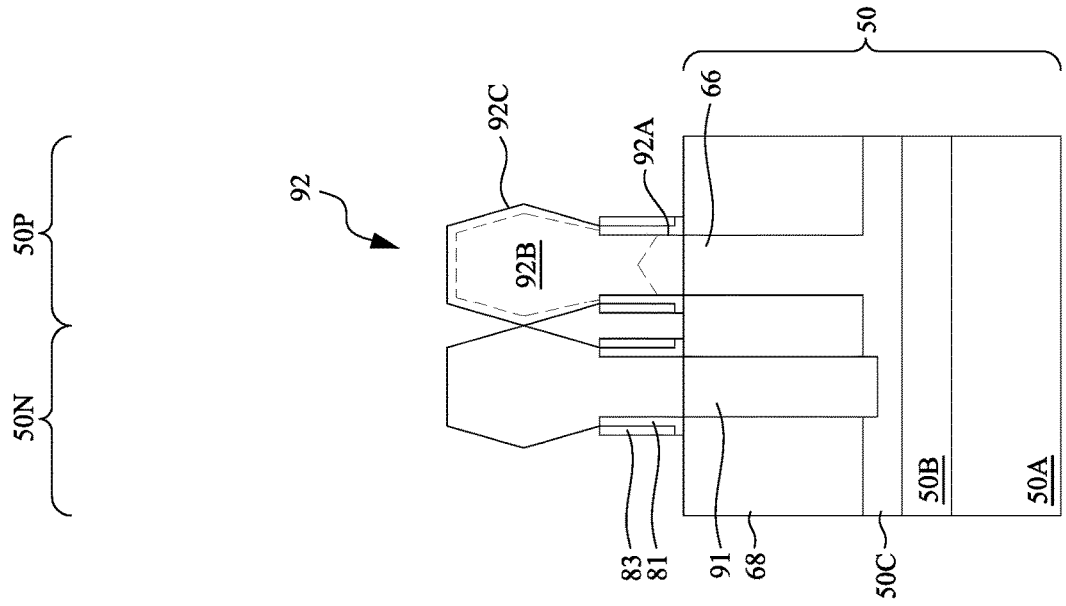

In some embodiments, the epitaxial source/drain regions 92 may exert stress on the second nanostructures 54, thereby improving performance. As illustrated in FIG. 14C, the epitaxial source/drain regions 92 are formed in the first recesses 86 such that each dummy gate 76 is disposed between respective neighboring pairs of the epitaxial source/drain regions 92. The epitaxial source/drain regions 92 may have thicknesses $T_1$ ranging from about 50 nm to about 60 nm. In some embodiments, the first spacers 81 are used to separate the epitaxial source/drain regions 92 from the dummy gates 76 and the first inner spacers 90 are used to separate the epitaxial source/drain regions 92 from the first nanostructures 52 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 in the p-type region 50P. The epitaxial source/drain regions 92 may include any acceptable material appropriate for p-type nano-FETs. For example, if the second nanostructures 54 are silicon, the epitaxial source/drain regions 92 may comprise materials exerting a compressive strain on the second nanostructures 54, such as silicon-germanium, boron doped silicon-germanium, germanium, germanium tin, or the like. The epitaxial source/drain regions 92 may also have surfaces raised from respective surfaces of the multi-layer stack 56 and may have facets.

The epitaxial source/drain regions 92, the first nanostructures 52, the second nanostructures 54, and/or the second substrate 50C may be implanted with dopants to form source/drain regions, similar to the process previously discussed for forming lightly-doped source/drain regions, followed by an anneal. The source/drain regions may have an impurity concentration of between about $1 \times 10^{19}$ atoms/cm$^3$ and about $1 \times 10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to contact or come close to contacting, as illustrated by FIG. 14B. In some embodiments, these facets cause adjacent epitaxial source/drain regions 92 of a same nano-FET to merge, as illustrated by FIG. 14D. In some embodiments, adjacent epitaxial source/drain regions 92 remain separated after the epitaxy process is completed, as illustrated by FIG. 14E. In the embodiments illustrated in FIGS. 14B, 14D, and 14E, the first spacers 81 may be formed extending from top surfaces of the STI regions 68 thereby blocking the epitaxial growth. In some other embodiments, the first spacers 81 may cover portions of the sidewalls of the nanostructures 55 further blocking the epitaxial growth. In some embodiments, the etching process used to form the first spacers 81 may be adjusted to remove the spacer material and allow the epitaxial source/drain regions 92 to extend to the surfaces of the STI regions 68.

The epitaxial source/drain regions 92 may include one or more semiconductor material layers. For example, the epitaxial source/drain regions 92 may include a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 include three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

Figure 14A:
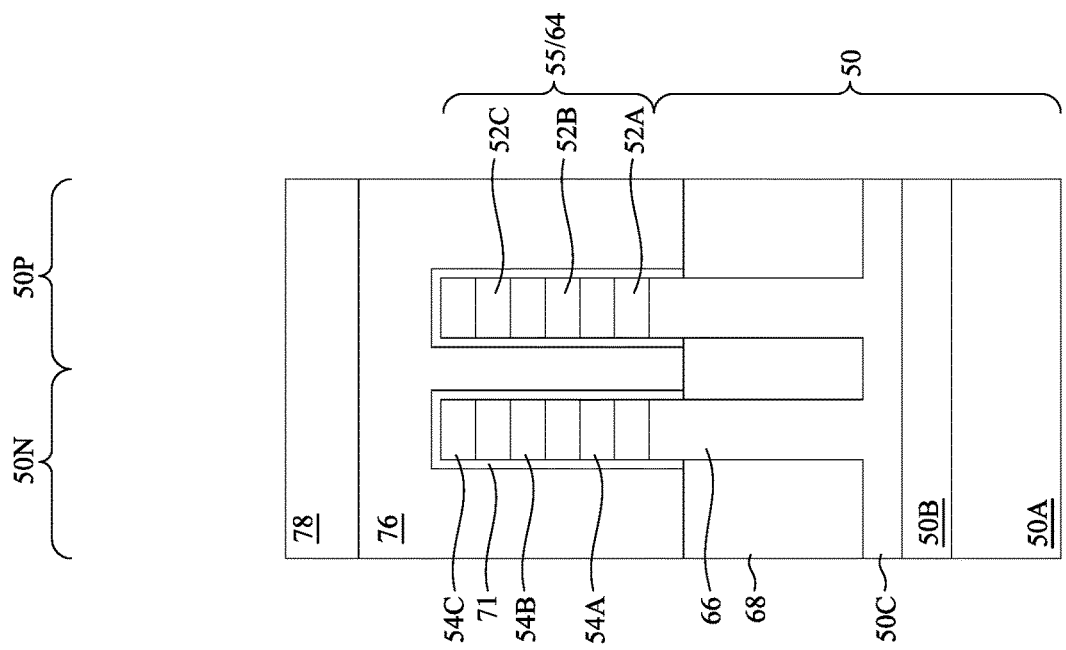
Figure 14C:
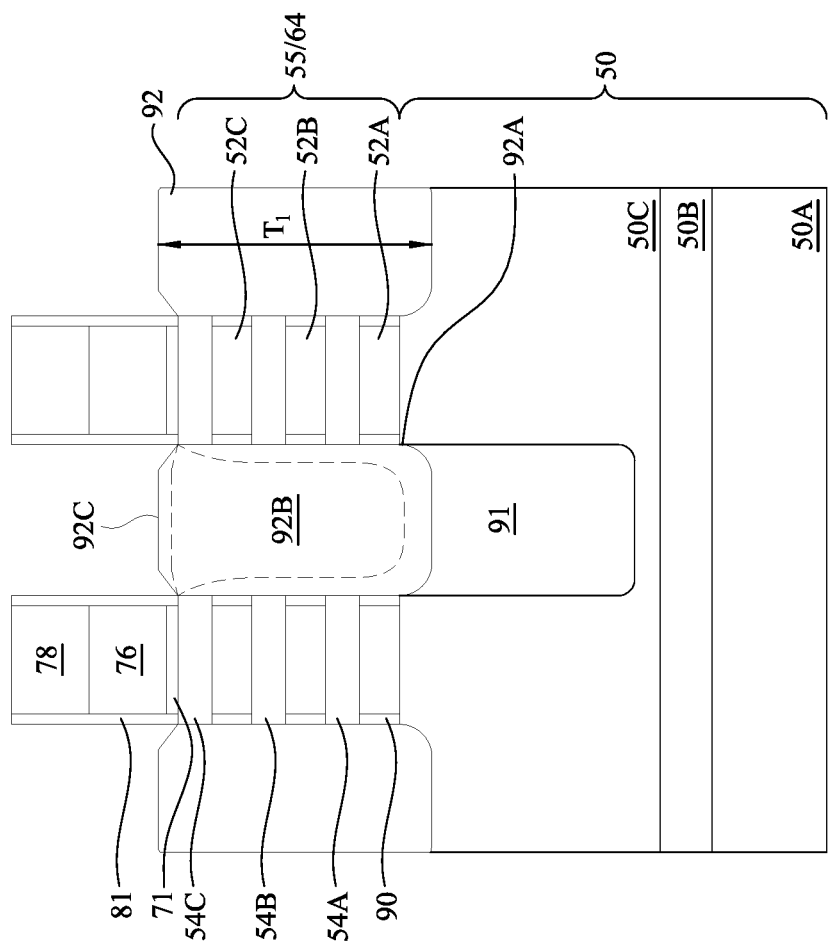
Figure 14E:
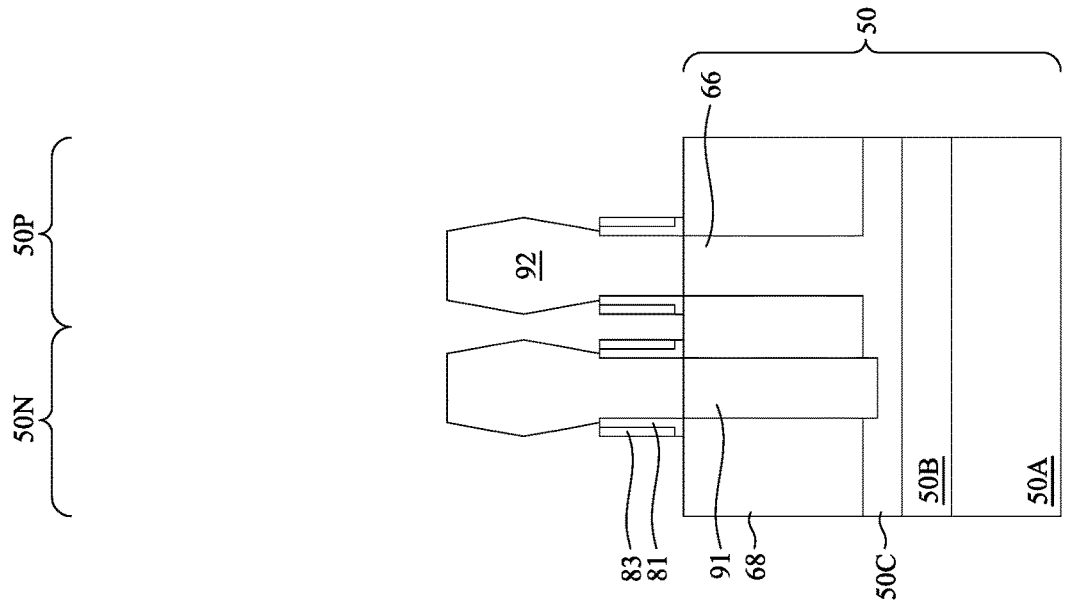
Figure 14D:
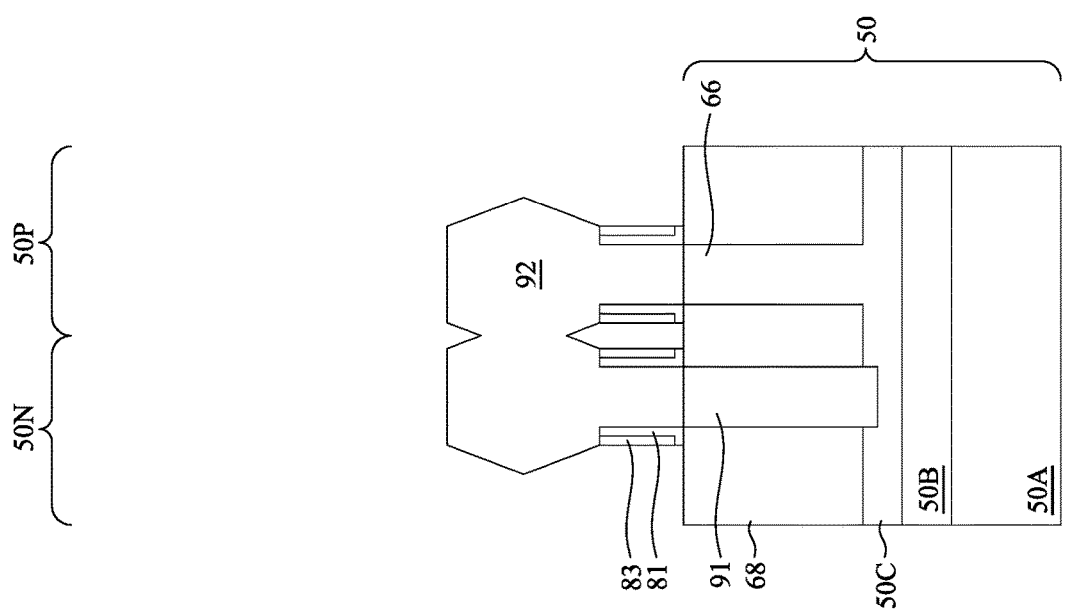
Figure 14F:
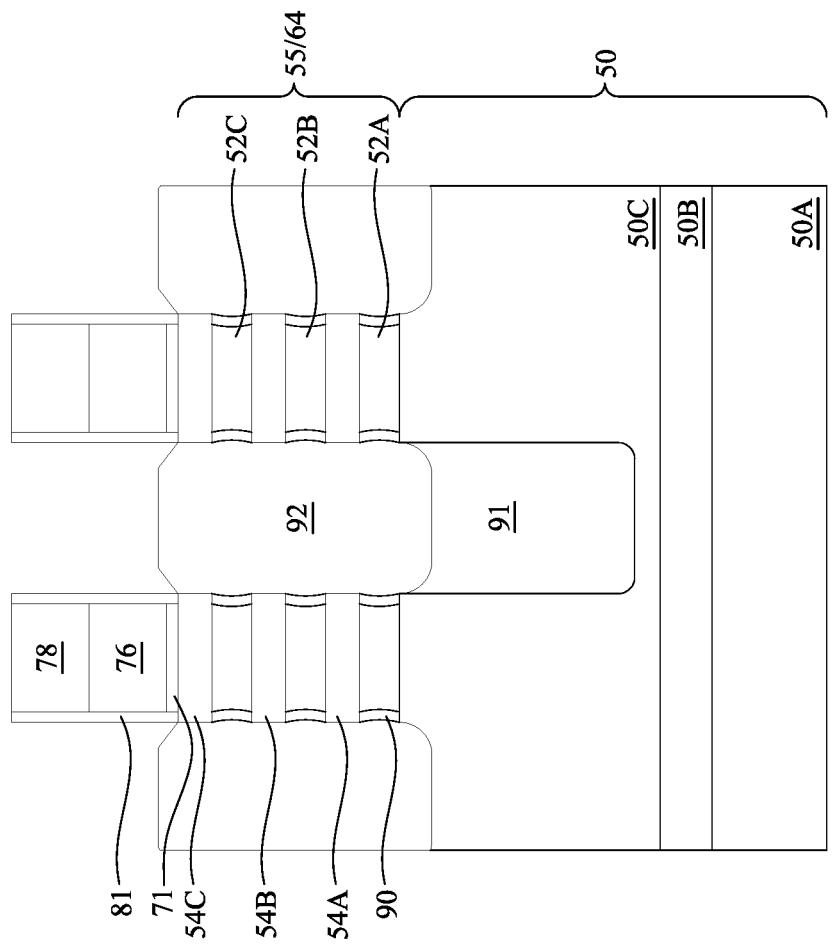

FIG. 14F illustrates an embodiment in which sidewalls of the first nanostructures 52 are concave, outer sidewalls of the first inner spacers 90 are concave, and the first inner spacers 90 are recessed from sidewalls of the second nanostructures 54. As illustrated in FIG. 14F, the epitaxial source/drain regions 92 may be formed in contact with the first inner spacers 90 and may extend past sidewalls of the second nanostructures 54.

Figure 15B:
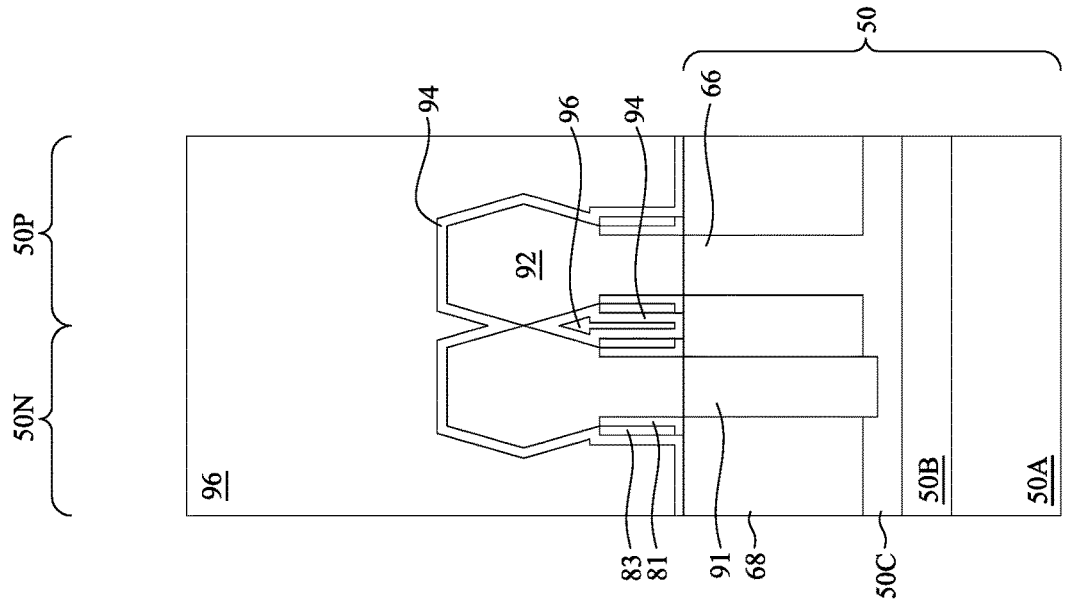
Figure 15A:
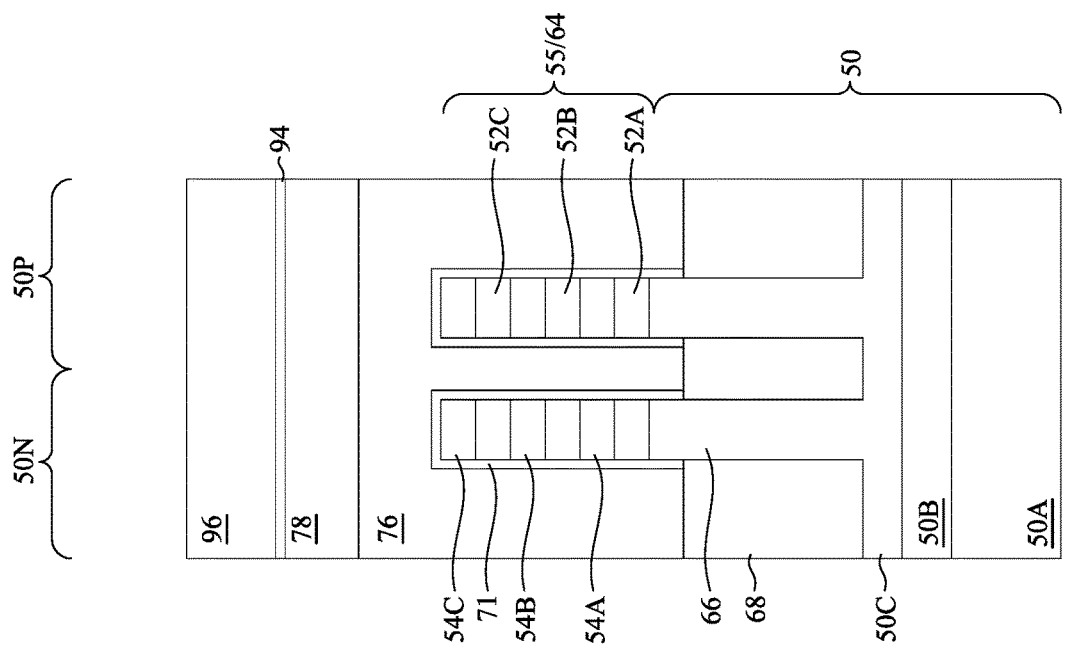
Figure 15C:
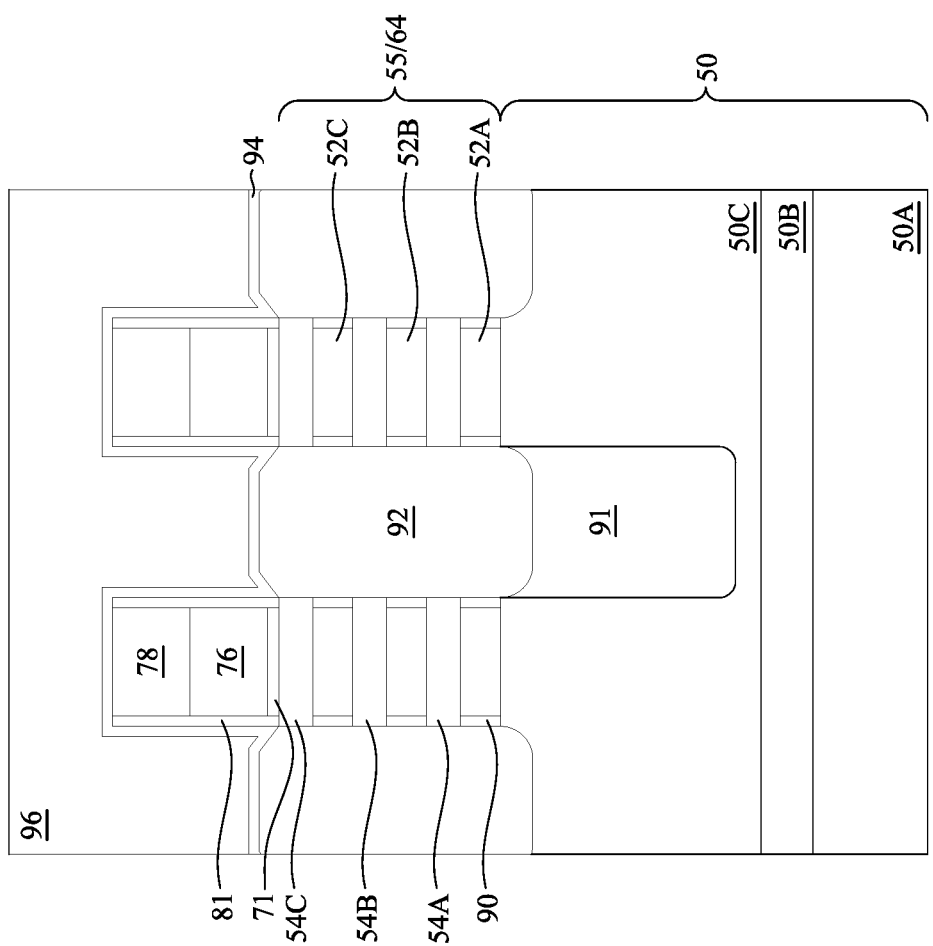

In FIGS. 15A through 15C, a first interlayer dielectric (ILD) 96 is deposited over the structure illustrated in FIGS. 14A through 14C, respectively. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, the first spacers 81, the second spacers 83, and the STI regions 68. The CESL 94 may include a dielectric material, such as, silicon nitride, silicon oxide, silicon oxynitride, or the like. In some embodiments, the CESL 94 may include a material having a different etch rate than the material of the overlying first ILD 96.

Figure 16B:
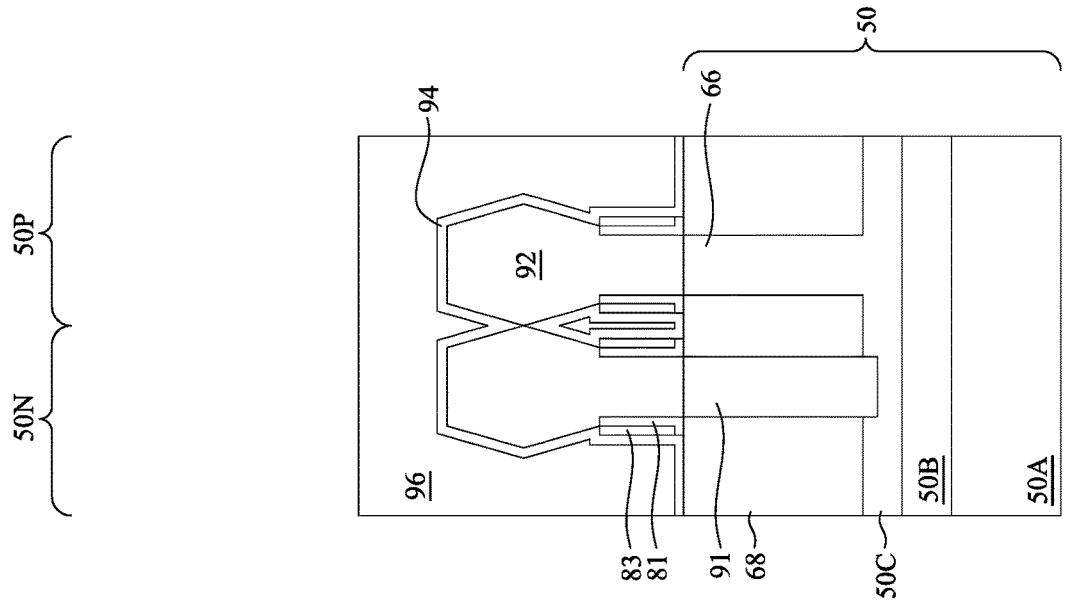
Figure 16A:
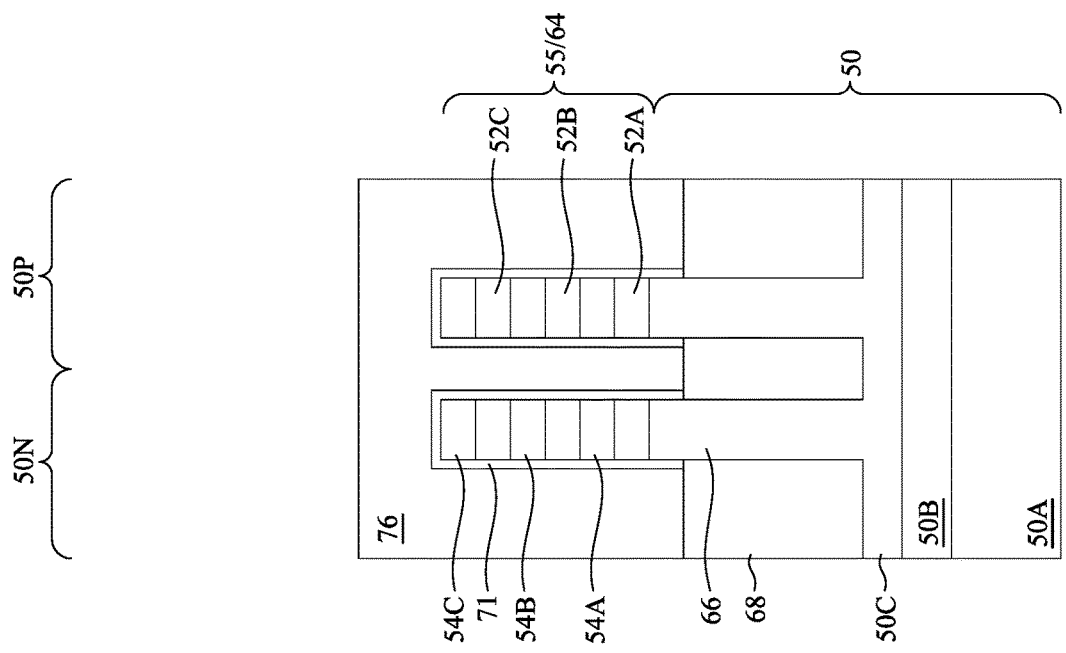
Figure 16C:
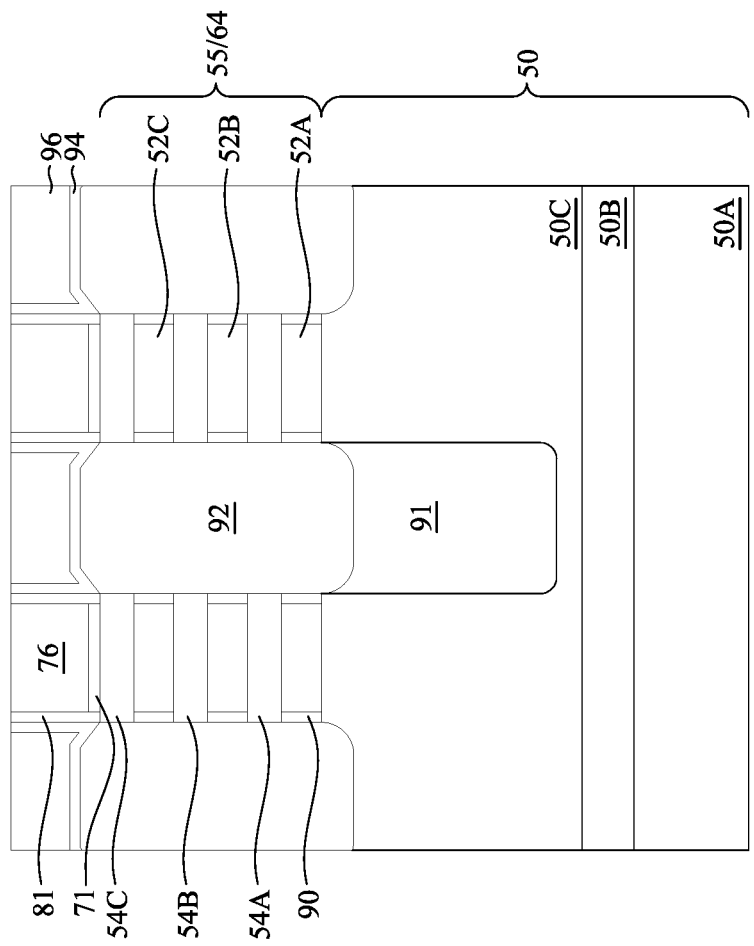

In FIGS. 16A through 16C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 may be level, within process variations. Accordingly, the top surfaces of the dummy gates 76 are exposed through the first ILD 96. In some embodiments, the masks 78 may remain, in which case the planarization process levels the top surface of the first ILD 96 with top surfaces of the masks 78 and the first spacers 81.

Figure 17B:
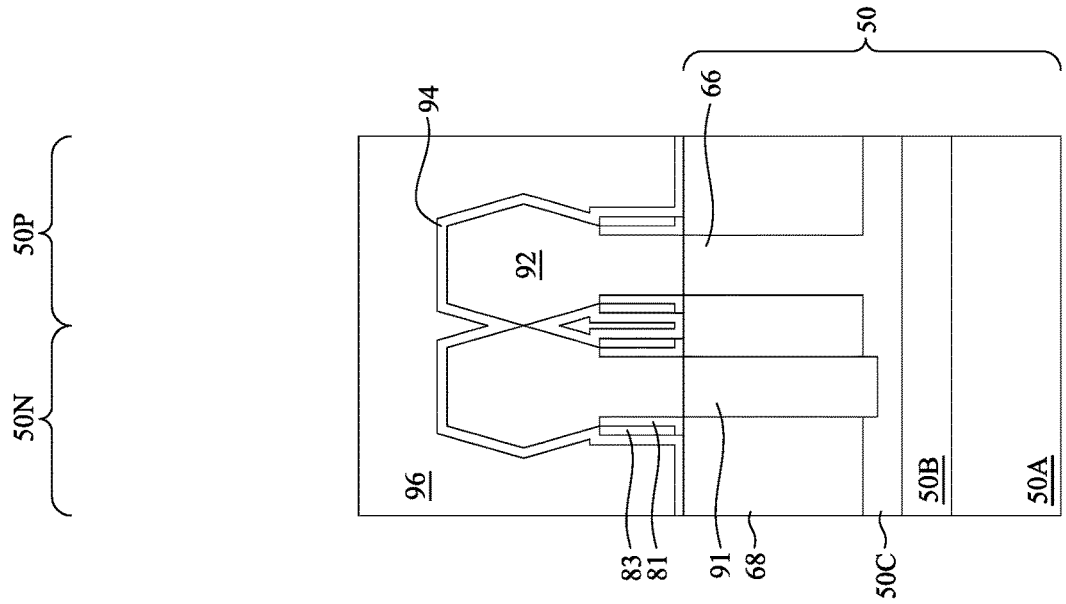
Figure 17A:
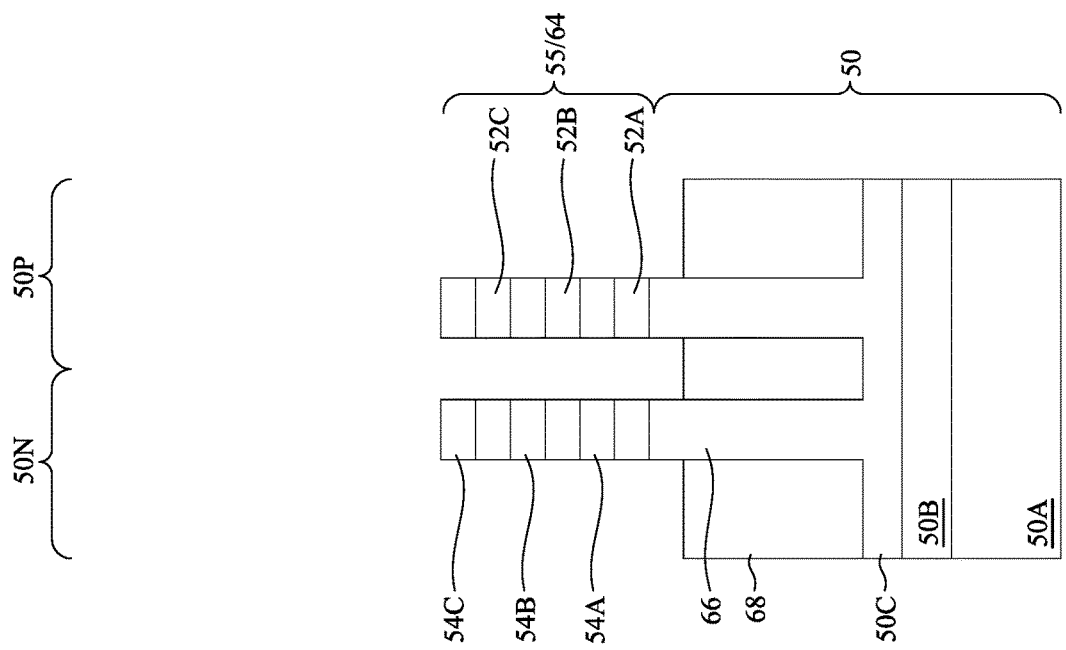
Figure 17C:
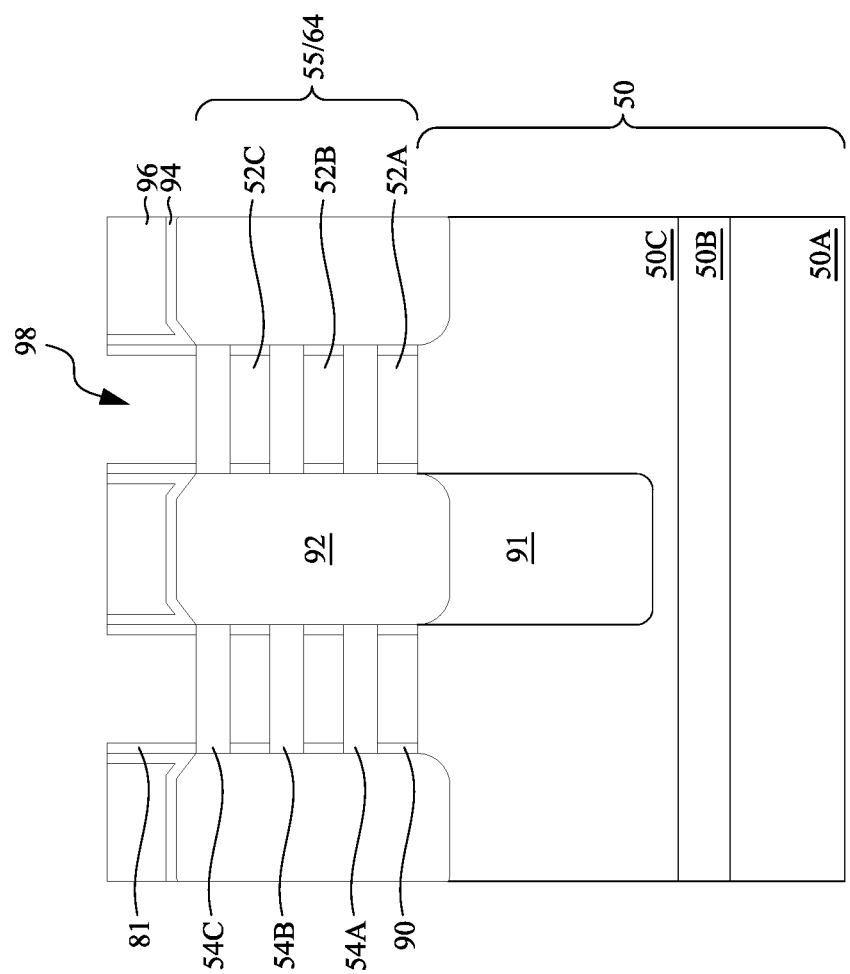

In FIGS. 17A through 17C, the dummy gates 76, and the masks 78 if present, are removed in one or more etching steps, so that second recesses 98 are formed. Portions of the dummy gate dielectrics 71 in the second recesses 98 are also be removed. In some embodiments, the dummy gates 76 and the dummy gate dielectrics 71 are removed by an anisotropic dry etch process. For example, the etching process may include a dry etch process using reaction gas(es) that selectively etch the dummy gates 76 at a faster rate than the first ILD 96 or the first spacers 81. Each of the second recesses 98 exposes and/or overlies portions of nanostructures 55, which act as channel regions in subsequently completed nano-FETs. Portions of the nanostructures 55 which act as the channel regions are disposed between neighboring pairs of the epitaxial source/drain regions 92. During the removal, the dummy gate dielectrics 71 may be used as etch stop layers when the dummy gates 76 are etched. The dummy gate dielectrics 71 may then be removed after the removal of the dummy gates 76.

Figure 18B:
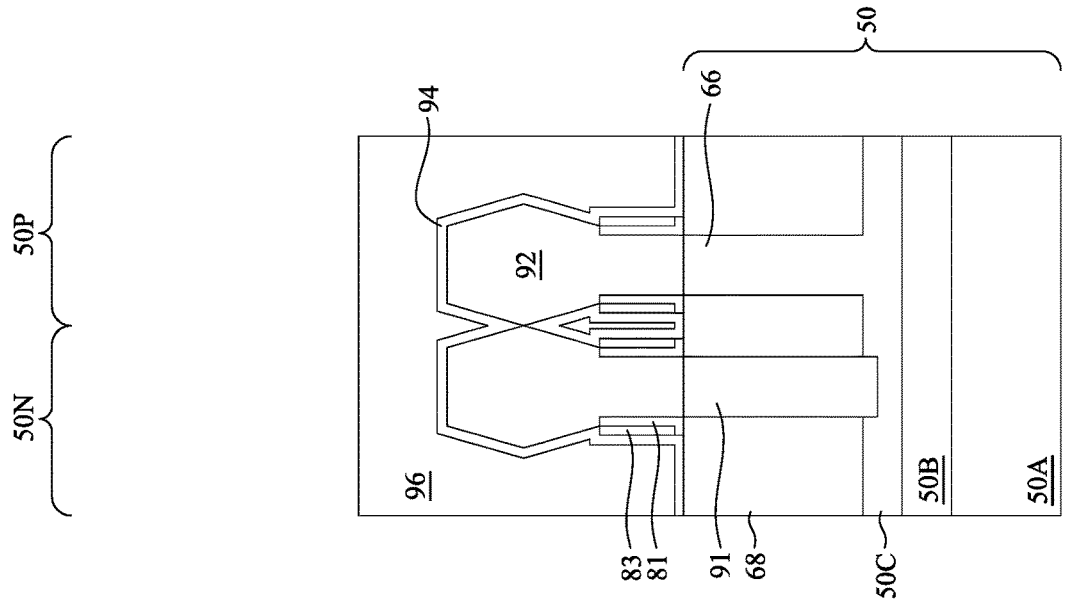
Figure 18A:
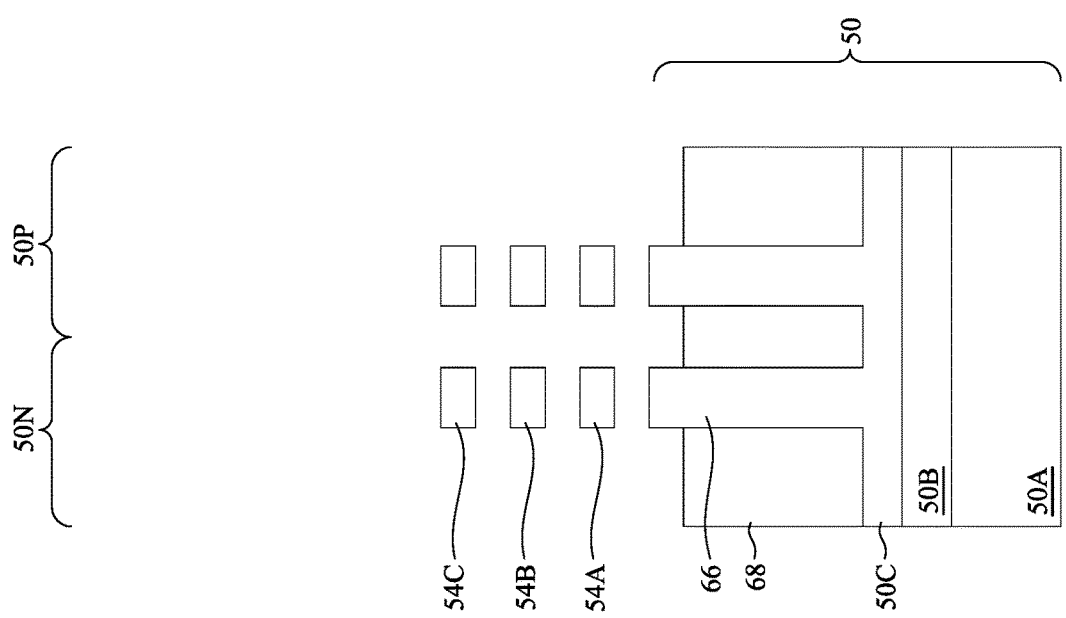
Figure 18C:
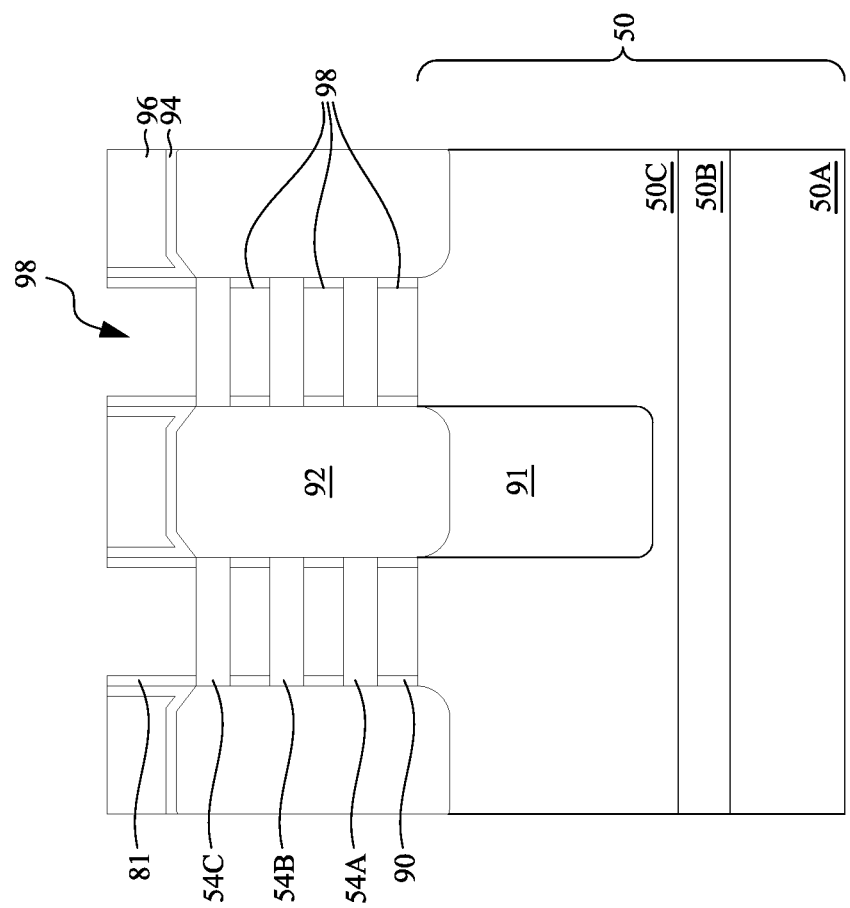

In FIGS. 18A through 18C, the first nanostructures 52 are removed extending the second recesses 98. The first nanostructures 52 may be removed by performing an isotropic etching process, such as wet etching or the like using etchants which are selective to the materials of the first nanostructures 52, while the second nanostructures 54, the second substrate 50C, the STI regions 68 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52.

Figure 19B:
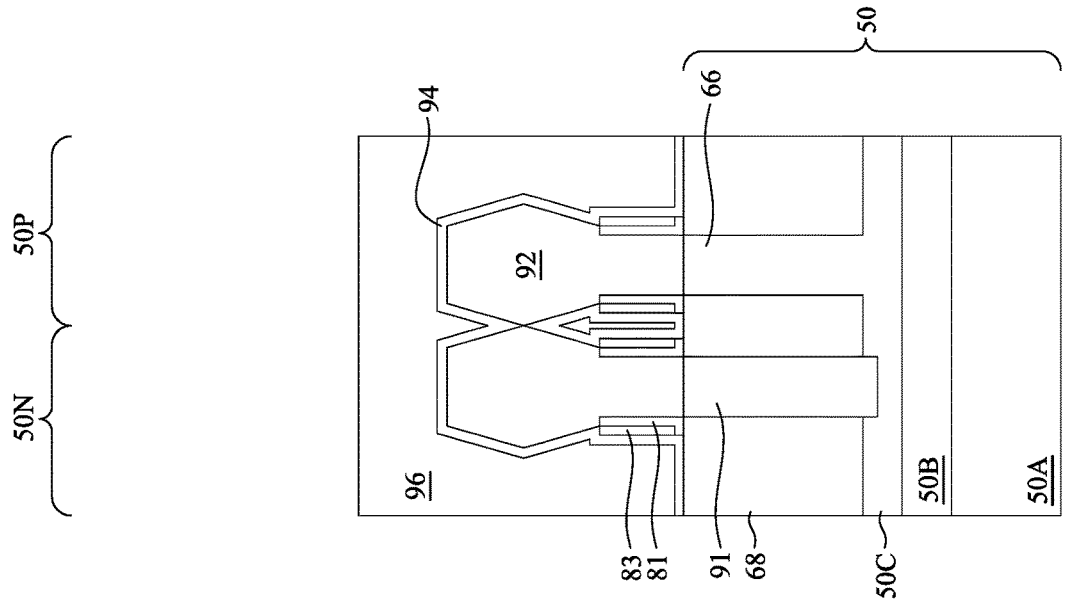
Figure 19A:
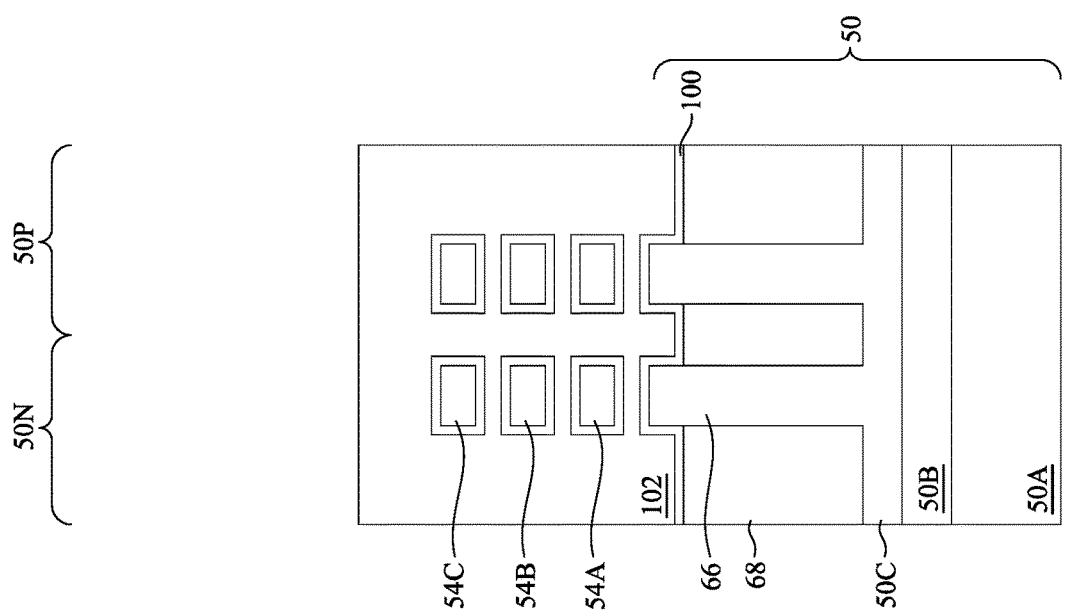
Figure 19C:
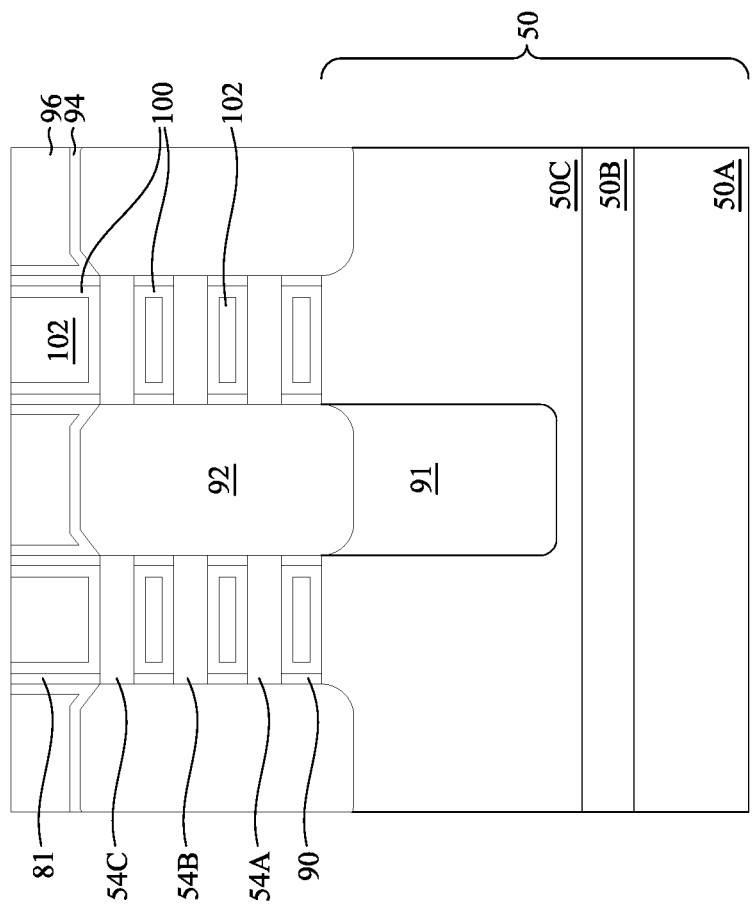

In FIGS. 19A through 19C, gate dielectric layers 100 and gate electrodes 102 are formed for replacement gates. The gate dielectric layers 100 are deposited conformally in the second recesses 98. The gate dielectric layers 100 may be formed on top surfaces and sidewalls of the fins 66 and on top surfaces, sidewalls, and bottom surfaces of the second nanostructures 54. The gate dielectric layers 100 may also be deposited on top surfaces of the first ILD 96, the CESL 94, the first spacers 81, and the STI regions 68 and on sidewalls of the first inner spacers 90.

In accordance with some embodiments, the gate dielectric layers 100 include one or more dielectric layers, such as an oxide, a metal oxide, the like, or combinations thereof. For example, in some embodiments, the gate dielectric layers 100 may include a silicon oxide layer and a metal oxide layer over the silicon oxide layer. In some embodiments, the gate dielectric layers 100 include a high-k dielectric material, and in these embodiments, the gate dielectric layers 100 may have a k-value greater than about 7.0. The gate dielectric layers 100 may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the second recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 19A and 19C, the gate electrodes 102 may comprise any number of liner layers, any number of work function tuning layers, and a fill material. Any combination of the layers which make up the gate electrodes 102 may be deposited in the n-type region 50N and the p-type region 50P between adjacent ones of the second nanostructures 54 and between the second nanostructure 54A and the second substrate 50C.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the second recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 20B:
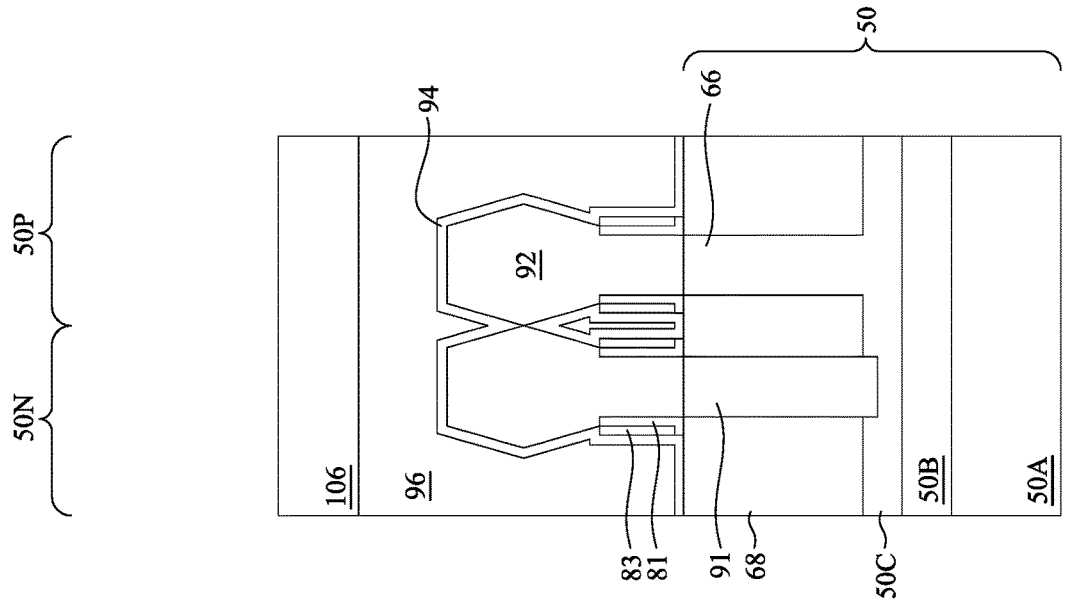
Figure 20A:
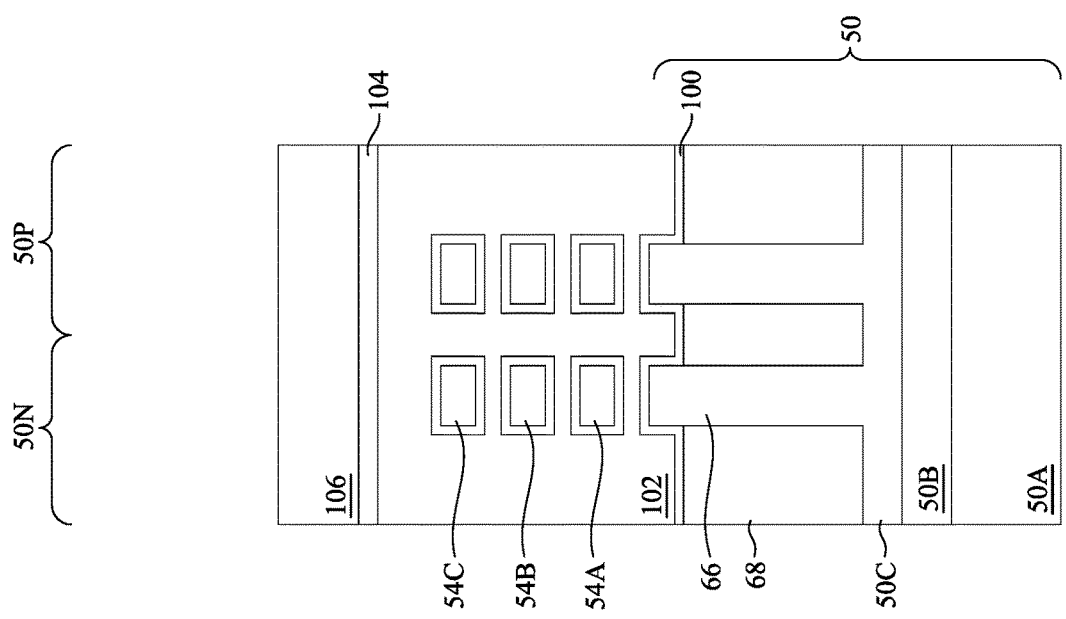
Figure 20C:
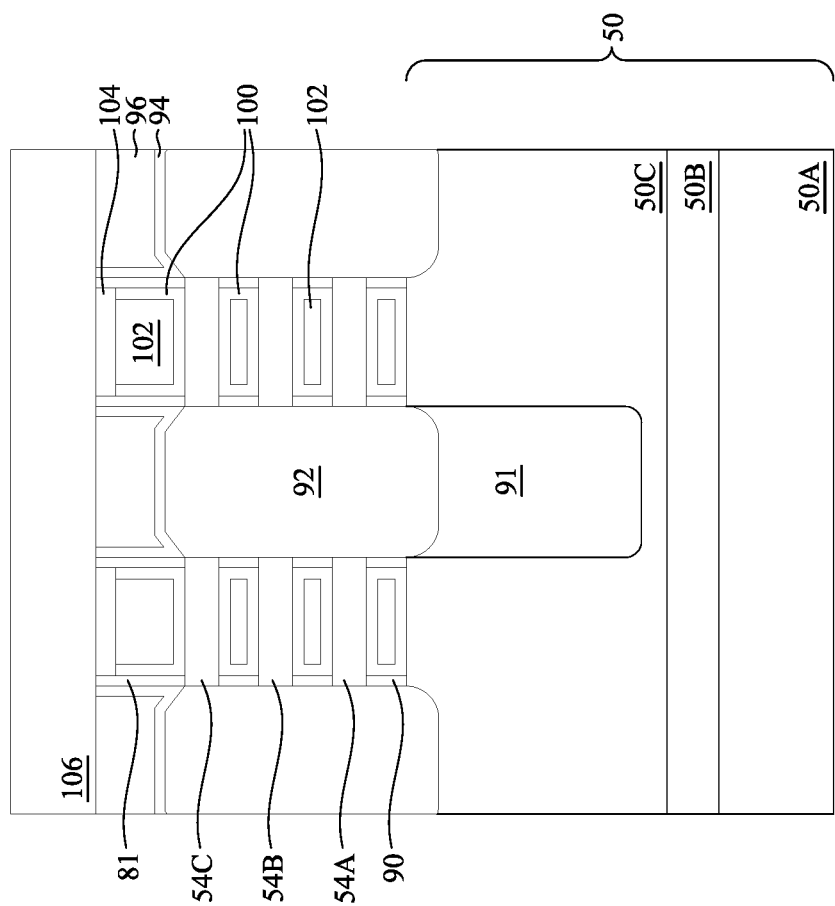

In FIGS. 20A through 20C, the gate structures (including the gate dielectric layers 100 and the corresponding overlying gate electrodes 102) are recessed, so that recesses are formed directly over the gate structures and between opposing portions of first spacers 81. Gate masks 104 including one or more layers of dielectric material, such as silicon nitride, silicon oxynitride, or the like, are filled in the recesses, followed by a planarization process to remove excess portions of the dielectric material extending over the first ILD 96. Subsequently formed gate contacts (such as the gate contacts 114, discussed below with respect to FIGS. 22A through 22C) penetrate through the gate masks 104 to contact top surfaces of the recessed gate electrodes 102.

As further illustrated by FIGS. 20A through 20C, a second ILD 106 is deposited over the first ILD 96, the gate masks 104, the first spacers 81, and the CESL 94. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 21B:
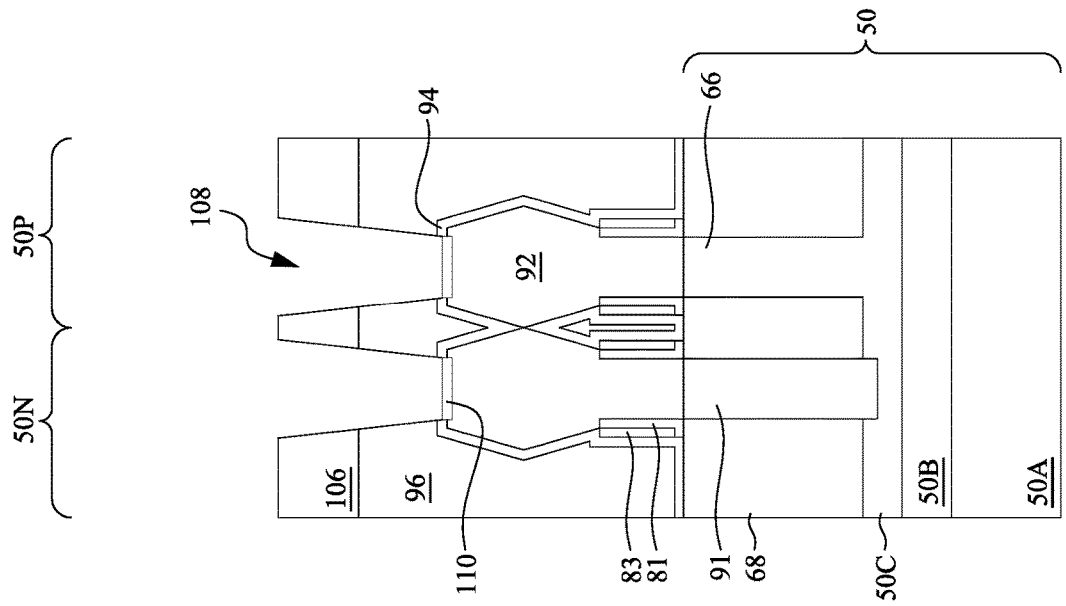
Figure 21A:
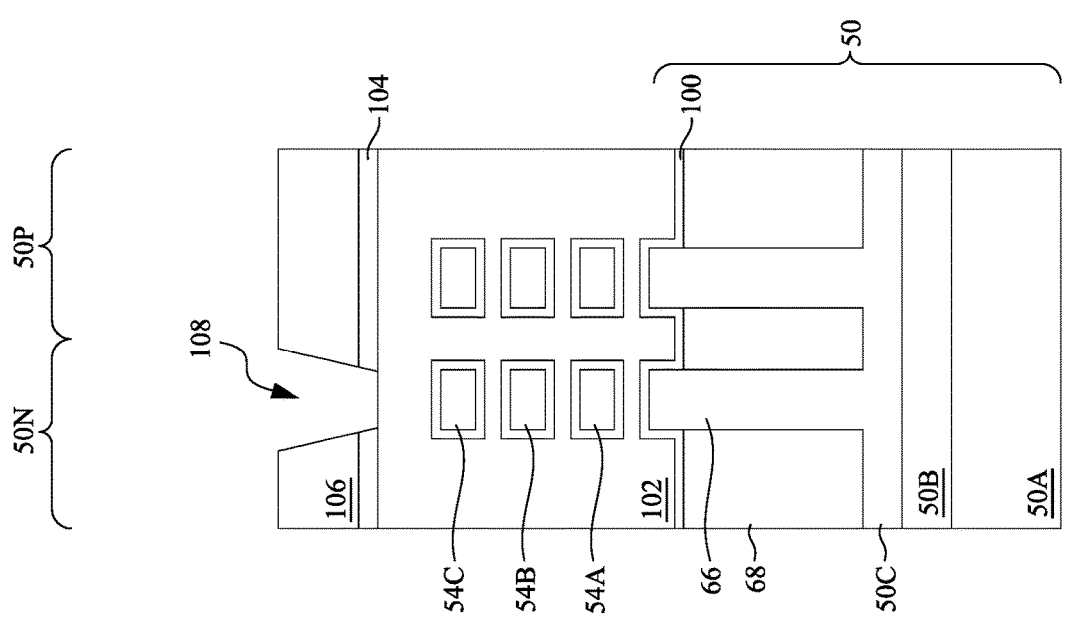
Figure 21C:
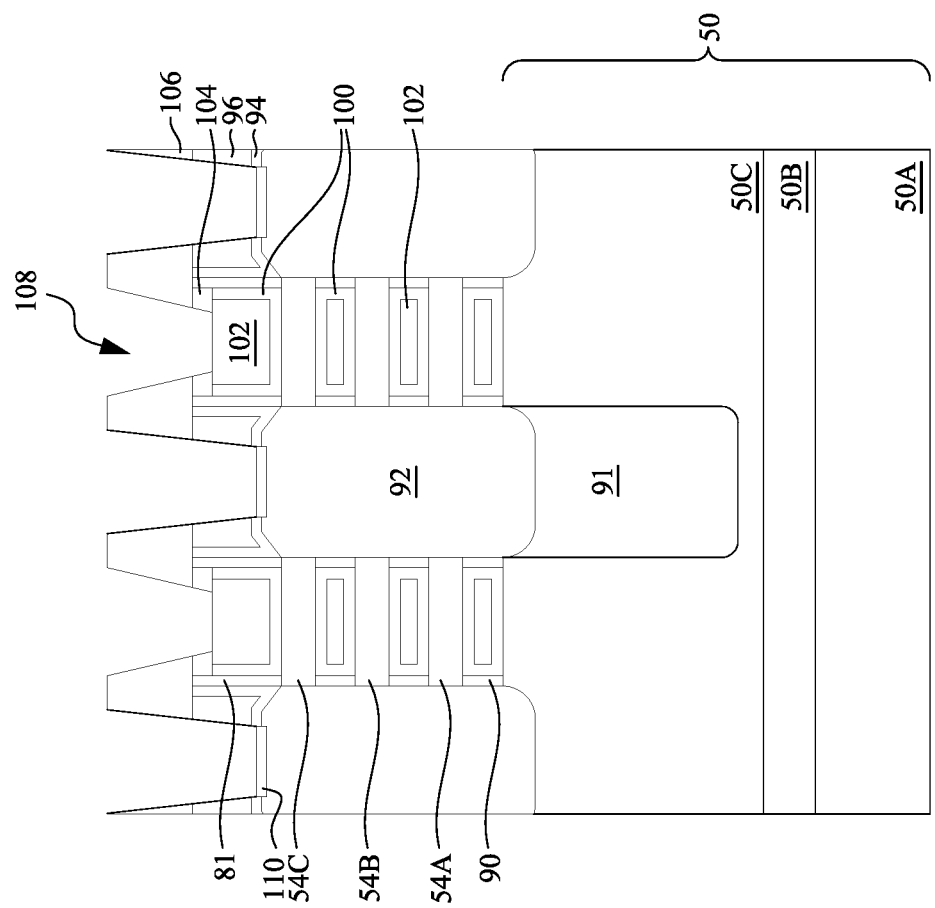

In FIGS. 21A through 21C, the second ILD 106, the first ILD 96, the CESL 94, and the gate masks 104 are etched to form third recesses 108 exposing surfaces of the epitaxial source/drain regions 92 and/or the gate structures. The third recesses 108 may be formed by etching using an anisotropic etching process, such as RIE, NBE, or the like. In some embodiments, the third recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the third recesses 108 extend into the epitaxial source/drain regions 92 and/or the gate structures, and a bottom of the third recesses 108 may be level with (e.g., at a same level, or having a same distance from the substrate), or lower than (e.g., closer to the substrate) top surfaces of the epitaxial source/drain regions 92 and/or the gate structures. Although FIG. 21C illustrates the third recesses 108 as exposing the epitaxial source/drain regions 92 and the gate structures in a same cross-section, in various embodiments, the epitaxial source/drain regions 92 and the gate structures may be exposed in different cross-sections, thereby reducing the risk of shorting subsequently formed contacts.

After the third recesses 108 are formed, silicide regions 110 are formed over the epitaxial source/drain regions 92. In some embodiments, the silicide regions 110 are formed by first depositing a metal (not separately illustrated) capable of reacting with the semiconductor materials of the underlying epitaxial source/drain regions 92 (e.g., silicon, silicon germanium, germanium, or the like) to form silicide or germanide regions. The metal may include as nickel, cobalt, titanium, tantalum, platinum, tungsten, other noble metals, other refractory metals, rare earth metals or their alloys. The metal may be deposited over the exposed portions of the epitaxial source/drain regions 92. A thermal anneal process may then be performed to form the silicide regions 110. The un-reacted portions of the deposited metal are then removed, e.g., by an etching process. Although the silicide regions 110 are referred to as silicide regions, the silicide regions 110 may be germanide regions or silicon germanide regions (e.g., regions including silicide, germanide, or combinations thereof). In an embodiment, the silicide region 110 includes TiSi, and has a thickness ranging from about 2 nm to about 10 nm.

Figure 22B:
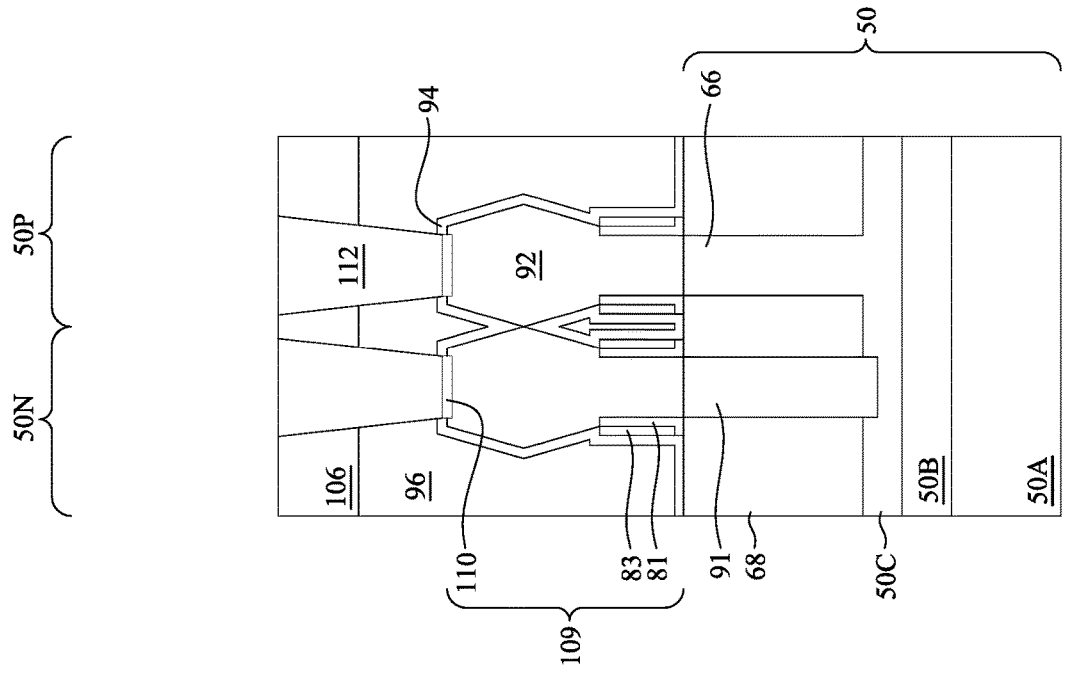
Figure 22A:
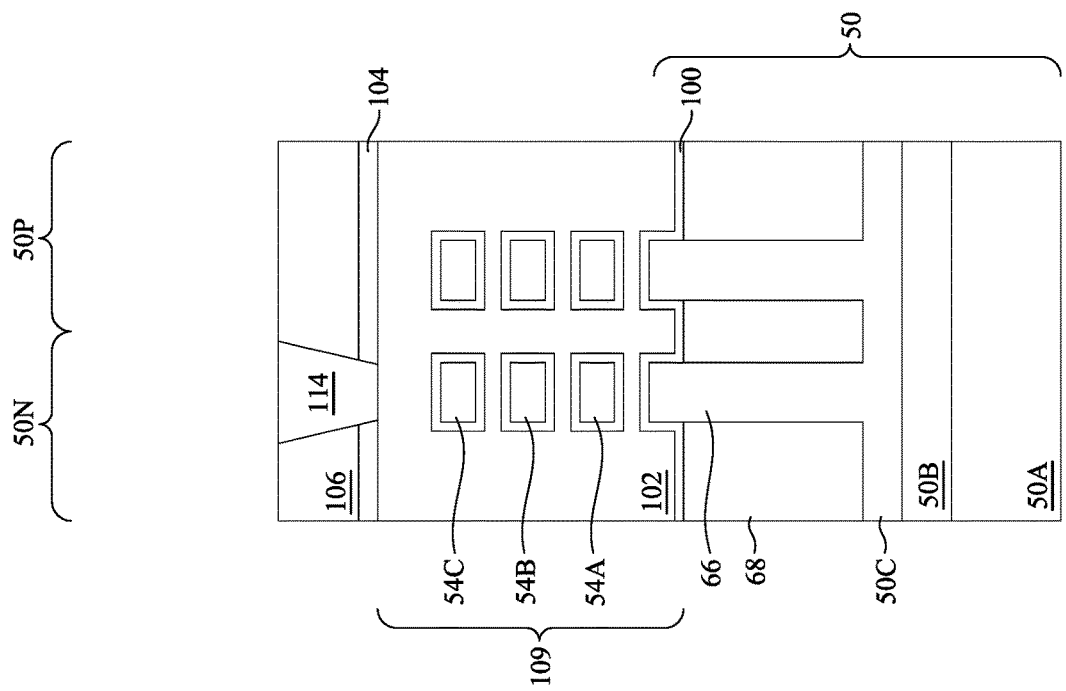
Figure 22C:
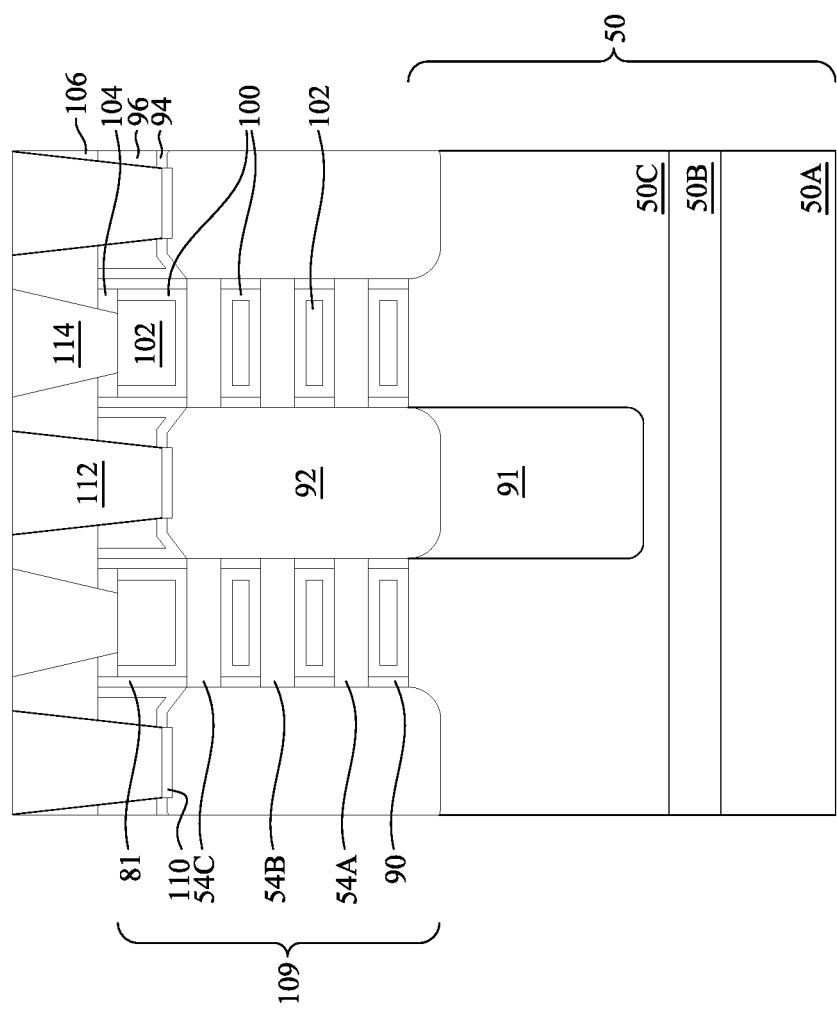

In FIGS. 22A through 22C, source/drain contacts 112 and gate contacts 114 (each of which may alternatively be referred to as contact plugs) are formed in the third recesses 108. The source/drain contacts 112 and the gate contacts 114 may each comprise one or more layers, such as barrier layers, diffusion layers, and fill materials. For example, in some embodiments, the source/drain contacts 112 and the gate contacts 114 may each include a barrier layer and a conductive material, and may be electrically coupled to an underlying conductive feature (e.g., the gate structures and/ or the silicide regions 110). The gate contacts 114 are electrically coupled to the gate electrodes 102 and the source/drain contacts 112 are electrically coupled to the silicide regions 110. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from surfaces of the second ILD 106. The epitaxial source/drain regions, the second nanostructures 54, the gate structures (including the gate dielectric layers 100 and the gate electrodes 102 may collectively be referred to as transistor structures 109.

Although FIGS. 22A through 22C illustrate a source/drain contact 112 extending to each of the epitaxial source/drain regions 92, source/drain contacts 112 may be omitted from certain ones of the epitaxial source/drain regions 92. For example, as explained in greater detail below, backside vias (e.g., power rails) may be subsequently attached through a backside of one or more of the epitaxial source/drain regions 92. For these particular epitaxial source/drain regions 92, the source/drain contacts 112 may be omitted or may be dummy contacts that are not electrically connected to any overlying conductive lines.

FIGS. 23A through 38C illustrate intermediate steps of forming front-side and back-side interconnect structures on the device layer 109. The front-side and back-side interconnect structures may each comprise conductive features that are electrically connected to the nano-FETs formed in the device layer 109. In FIGS. 23A, 24A, 25A, 26A, 27A, 28A, 29A, 30A, 31A, 31E, 32A, 32E, 32G, 33A, 34A, 35A, 36A, 37A, and 38A, the illustrated cross-sections are taken along line A-A' of FIG. 1. In FIGS. 23B, 24B, 25B, 26B, 27B, 28B, 29B, 30B, 30E, 31B, 32B, 32F, 33B, 34B, 35B, 36B, 37B, and 38B, the illustrated cross-sections are taken along line B-B' of FIG. 1. In FIGS. 23C, 24C, 25C, 26C, 27C, 28C, 29C, 30C, 31C, 32C, 33C, 34C, 35C, 36C, 37C, and 38C, the illustrated cross-sections are taken along line C-C' of FIG. 1. In FIGS. 25D, 26D, 27D, 28D, 29D, 30D, 31D, 32D, 33D, 34D, and 35D backside views are illustrated. The process steps described in FIGS. 23A through 38C may be applied to both the n-type region 50N and the p-type region 50P. Further, as noted above, a backside via (e.g., a power rail) may be connected to one or more of the epitaxial source/drain regions 92. As such, front-side source/drain contacts 112 may be optionally omitted from the epitaxial source/drain regions 92.

Figure 23B:
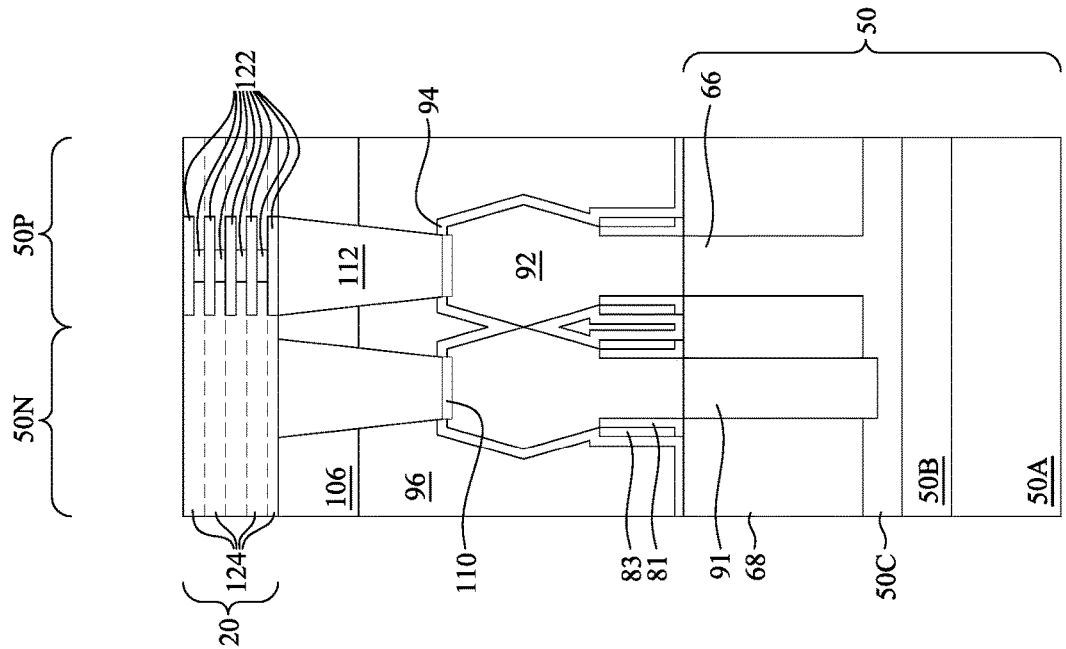
Figure 23A:
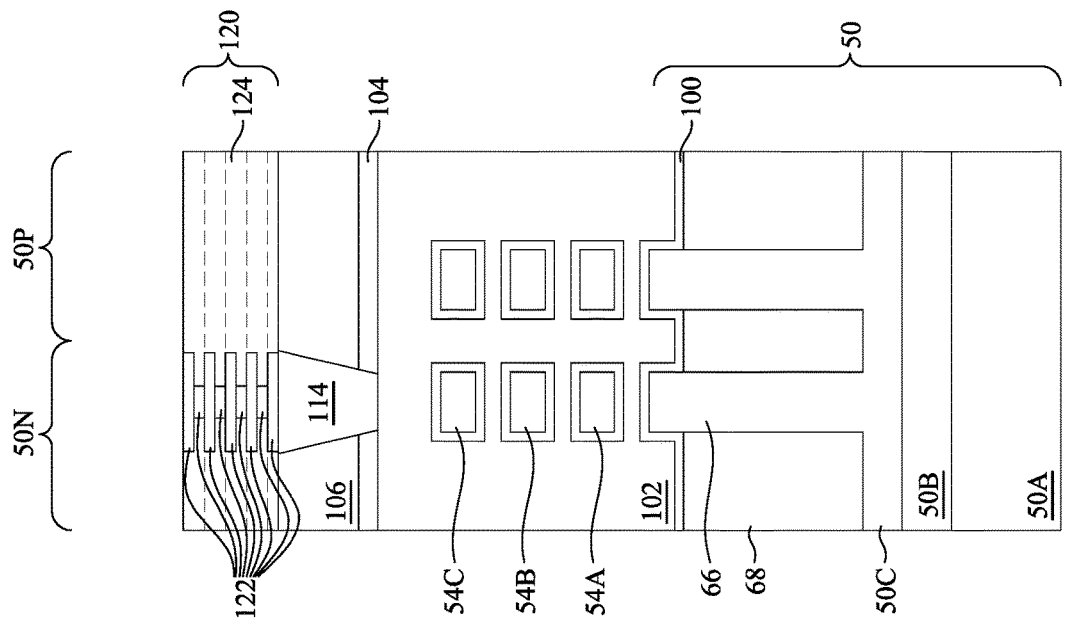
Figure 23C:
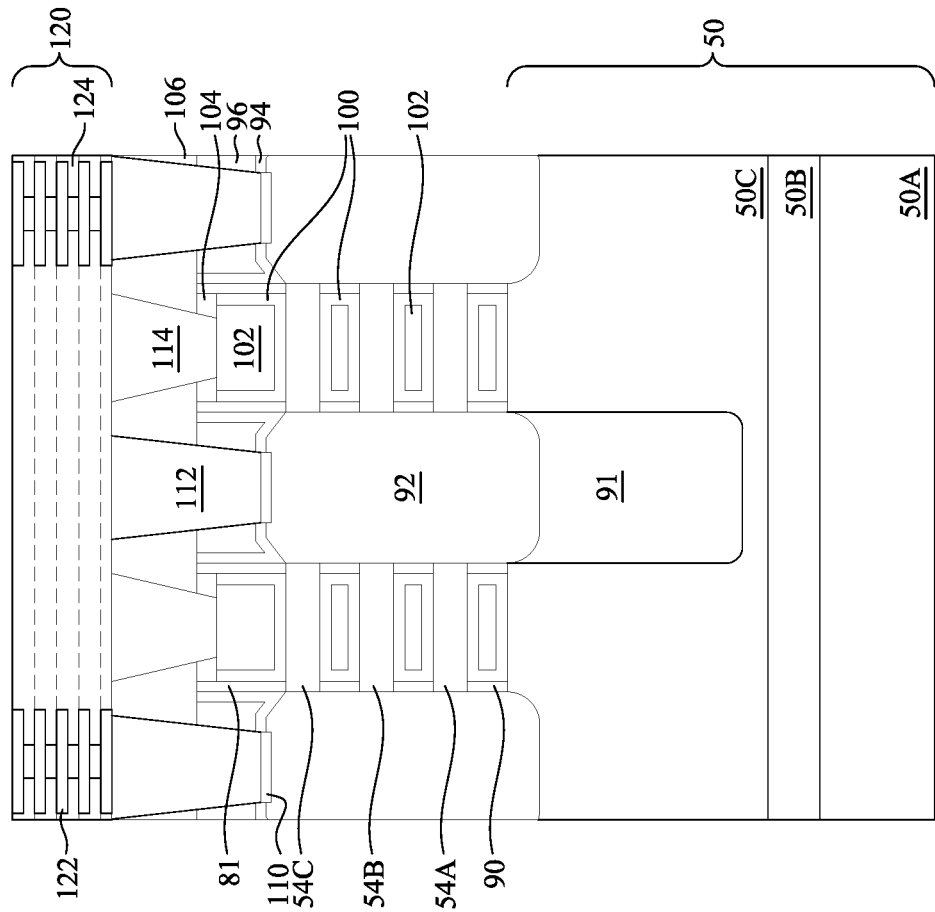

In FIGS. 23A through 23C, a front-side interconnect structure 120 is formed on the second ILD 106. The frontside interconnect structure 120 may be referred to as a front-side interconnect structure because it is formed on a front-side of the silicon-on-insulator substrate 50 (e.g., a side of the silicon-on-insulator substrate 50 on which active devices are formed). The front-side interconnect structure 120 may include one or more layers of conductive features 122 formed in one or more stacked first dielectric layers 124. Each of the stacked first dielectric layers 124 may include a dielectric material, such as a low-k dielectric material, an extra low-k (ELK) dielectric material, or the like. The first dielectric layers 124 may be deposited using appropriate processes, such as, CVD, ALD, PVD, PECVD, or the like.

The conductive features 122 may include conductive lines and conductive vias interconnecting layers of the conductive lines. The conductive vias may extend through respective ones of the first dielectric layers 124 to provide vertical connections between layers of the conductive lines. The conductive features 122 may be formed through any acceptable process, such as a damascene process, a dual damascene process, or the like.

In some embodiments, the conductive features 122 may be formed using a damascene process in which a respective first dielectric layer 124 is patterned utilizing a combination of photolithography and etching techniques to form trenches corresponding to the desired pattern of the conductive features 122. An optional diffusion barrier and/or optional adhesion layer may be deposited in the trenches and the trenches may then be filled with a conductive material. Suitable materials for the barrier layer include titanium, titanium nitride, titanium oxide, tantalum, tantalum nitride, titanium oxide, or other alternatives. Suitable materials for the conductive material include copper, silver, gold, tungsten, aluminum, combinations thereof, or the like. In an embodiment, the conductive features 122 may be formed by depositing a seed layer of copper or a copper alloy, and filling the trenches using electroplating. A chemical mechanical planarization (CMP) process or the like may be used to remove excess conductive material from surfaces of the respective first dielectric layer 124 and to planarize surfaces of the conductive features 122 and the first dielectric layer 124 for subsequent processing.

FIGS. 23A through 23C illustrate five layers of the conductive features 122 and the first dielectric layers 124. However, it should be appreciated that the front-side interconnect structure 120 may include any number of the conductive features 122 disposed in any number of the first dielectric layers 124. The front-side interconnect structure 120 may be electrically connected to the gate contacts 114 and the source/drain contacts 112 to form functional circuits. In some embodiments, the functional circuits formed by the front-side interconnect structure 120 may include logic circuits, memory circuits, image sensor circuits, or the like.

Figure 24B:
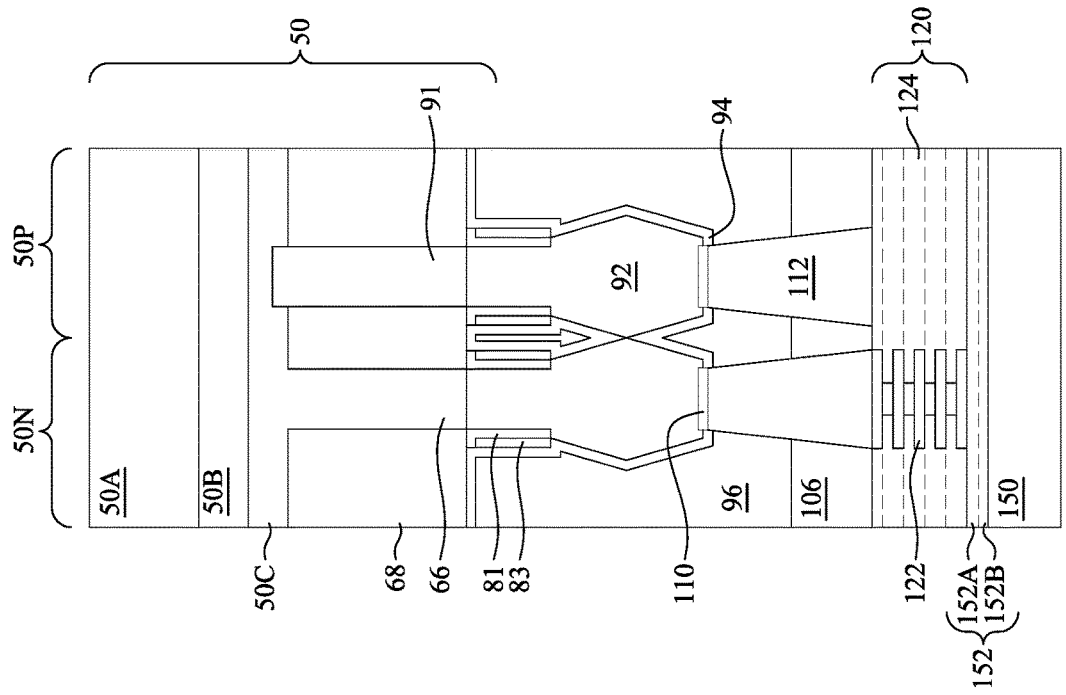
Figure 24A:
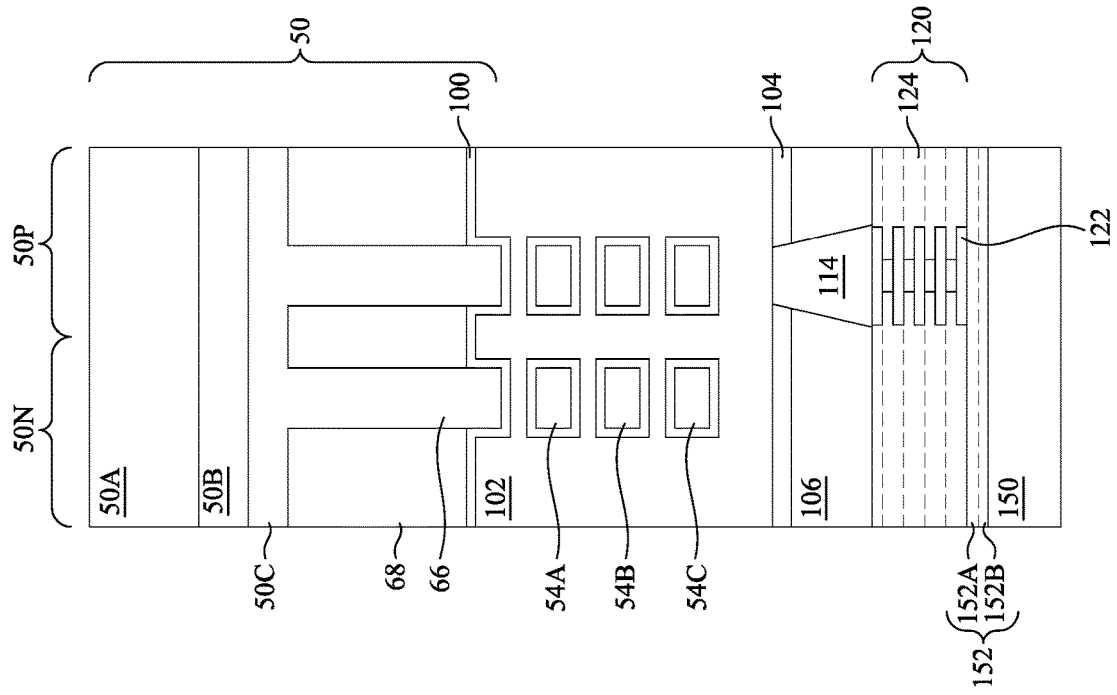
Figure 24C:
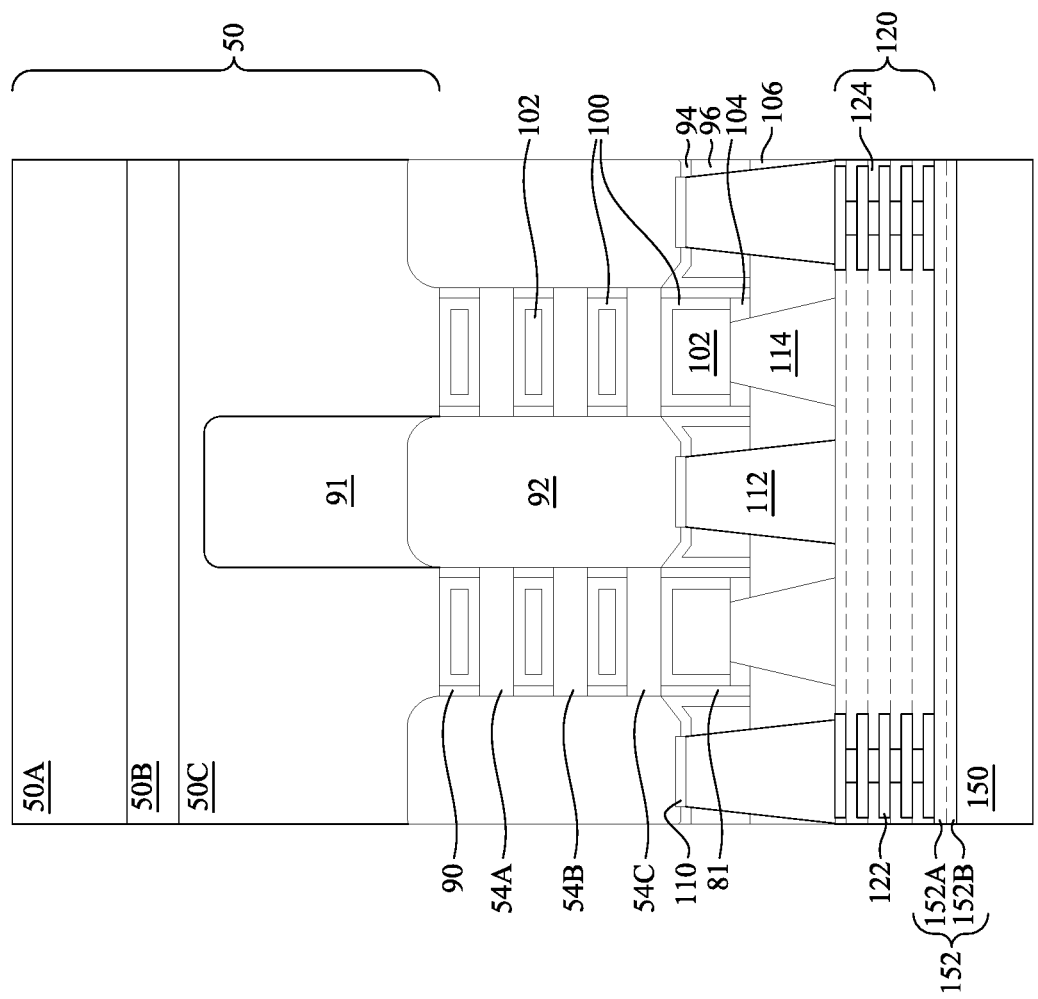

In FIGS. 24A through 24C, a carrier substrate 150 is bonded to a top surface of the front-side interconnect structure 120 by a first bonding layer 152A and a second bonding layer 152B (collectively referred to as a bonding layer 152). The carrier substrate 150 may be a glass carrier substrate, a ceramic carrier substrate, a wafer (e.g., a silicon wafer), or the like. The carrier substrate 150 may provide structural support during subsequent processing steps and in the completed device.

In some embodiments, the carrier substrate 150 may be bonded to the front-side interconnect structure 120 using a suitable technique such as dielectric-to-dielectric bonding, or the like. Dielectric-to-dielectric bonding may include depositing the first bonding layer 152A on the front-side interconnect structure 120. In some embodiments, the first bonding layer 152A includes silicon oxide (e.g., a high density plasma (HDP) oxide or the like) that is deposited by CVD, ALD, PVD, or the like. The second bonding layer 152B may be an oxide layer that is formed on a surface of the carrier substrate 150 prior to bonding using, for example, CVD, ALD, PVD, thermal oxidation, or the like. Other suitable materials may be used as well for the first bonding layer 152A and the second bonding layer 152B.

The dielectric-to-dielectric bonding process may further include applying a surface treatment to one or more of the bonding layers 152. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 152. The carrier substrate 150 is then aligned with the front-side interconnect structure 120 and the two are pressed against each other to initiate a pre-bonding of the carrier substrate 150 to the front-side interconnect structure 120. The pre-bonding may be performed at room temperature (e.g., between about 21° C. and about 25° C.). After the pre-bonding, an annealing process may be applied by, for example, heating the front-side interconnect structure 120 and the carrier substrate 150 to a temperature of about 170° C. to about 500° C.

As further illustrated in FIGS. 24A through 24C, after the carrier substrate 150 is bonded to the front-side interconnect structure 120, the device may be flipped such that a backside of the silicon-on-insulator substrate 50 faces upwards. The backside of the silicon-on-insulator substrate 50 may refer to a side opposite the front-side of the silicon-on-insulator substrate 50 on which active devices are formed.

In FIGS. 25A through 25D, a thinning process is applied to the backside of the substrate 50. The thinning process may include a planarization process (e.g., a mechanical grinding, a chemical mechanical polish (CMP), or the like), an etch back process, combinations thereof, or the like. The thinning process may remove the first substrate 50A, the first insulation layer 50B, and portions of the second substrate 50C and expose surfaces of the first epitaxial material 91, the fins 66, the second substrate 50C, and the STI regions 68 opposite the front-side interconnect structure 120. Further, a portion of the second substrate 50C may remain over the gate structure (e.g., gate electrodes 102 and the gate dielectric layers 100) and the nanostructures 55 after the thinning process. Following the thinning process, the second substrate 50C may have a thickness $T_2$ over the epitaxial source/drain regions 92 ranging from about 30 nm to about 40 nm.

Figure 25B:
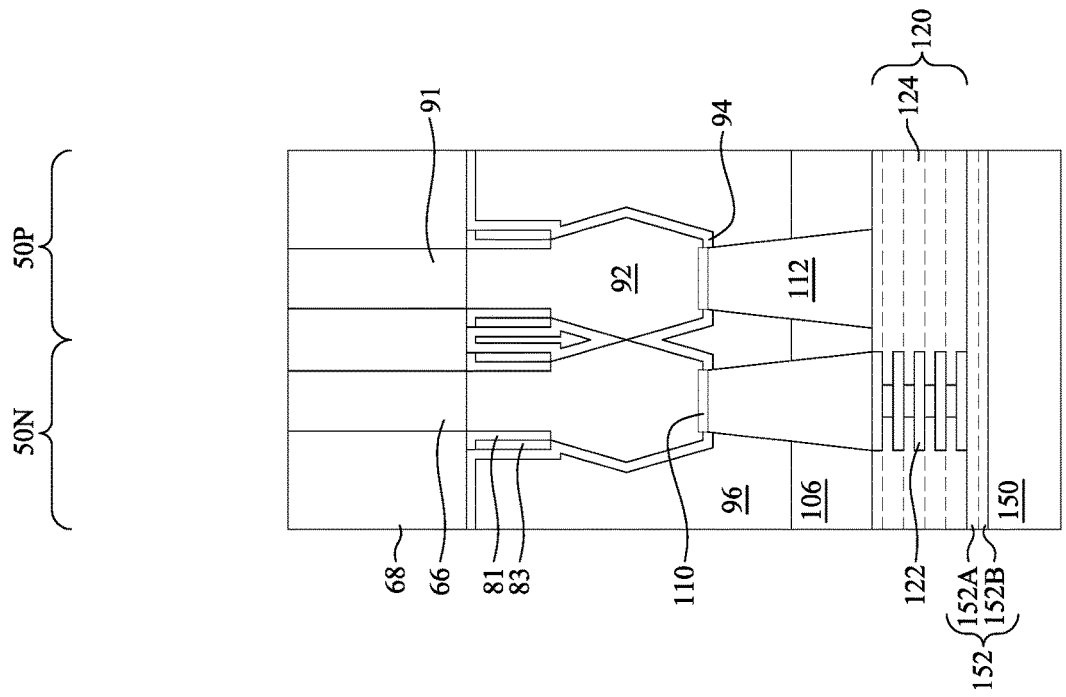
Figure 25A:
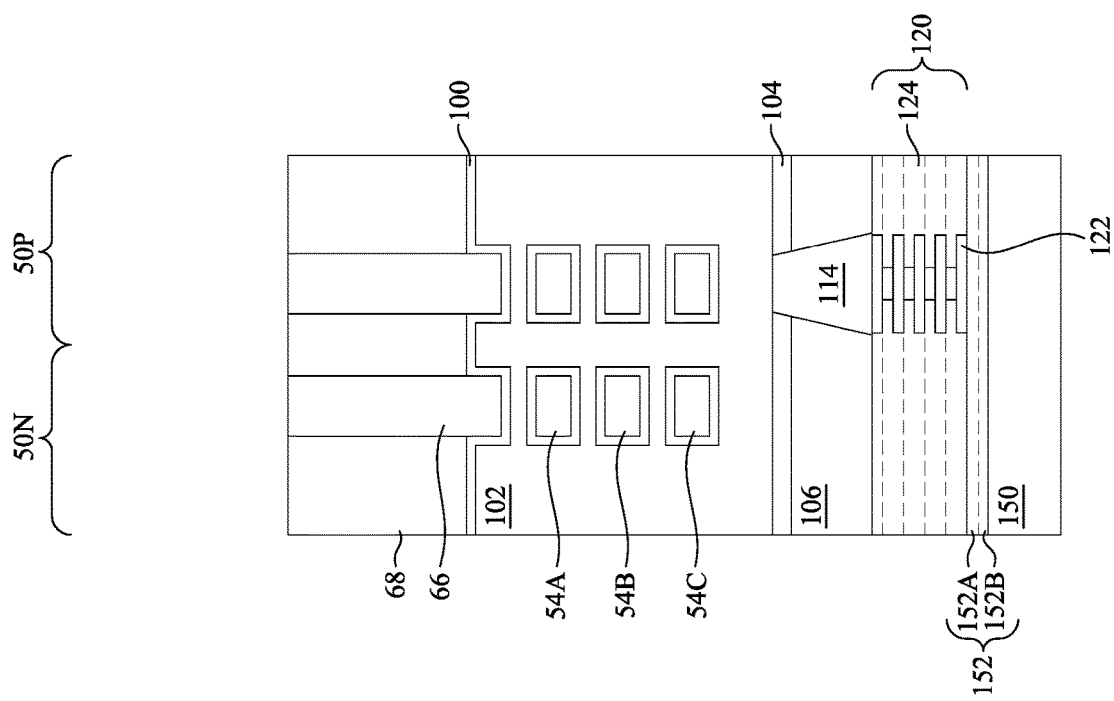
Figure 25C:
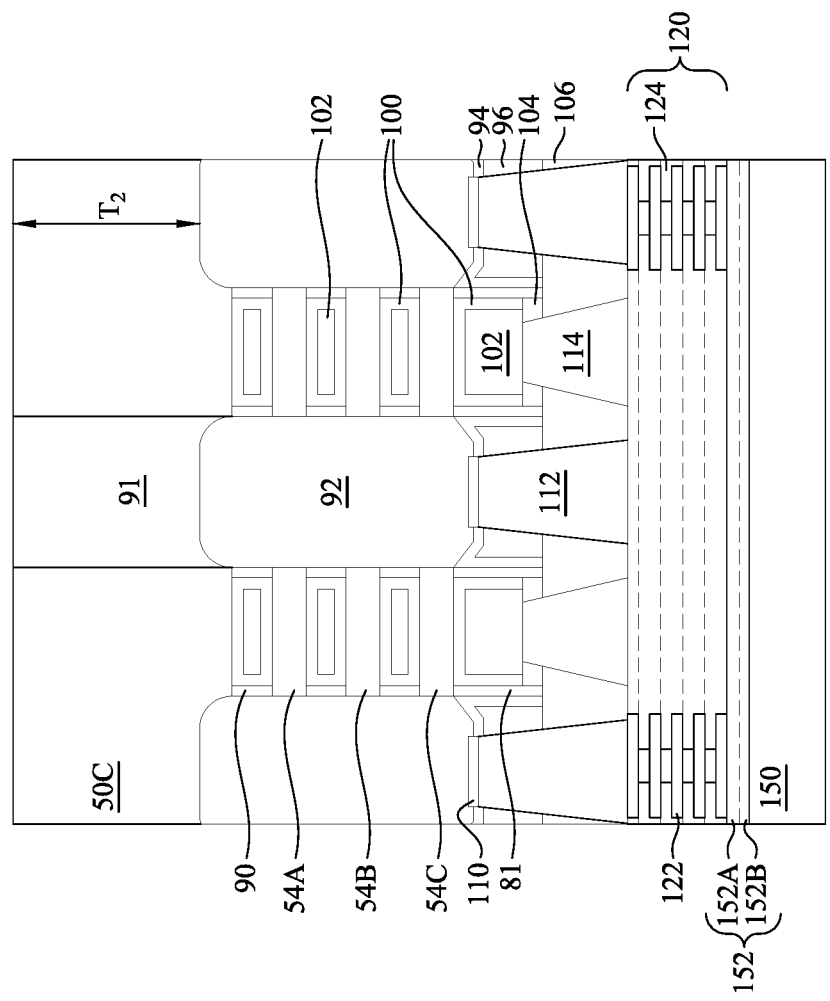
Figure 25D:
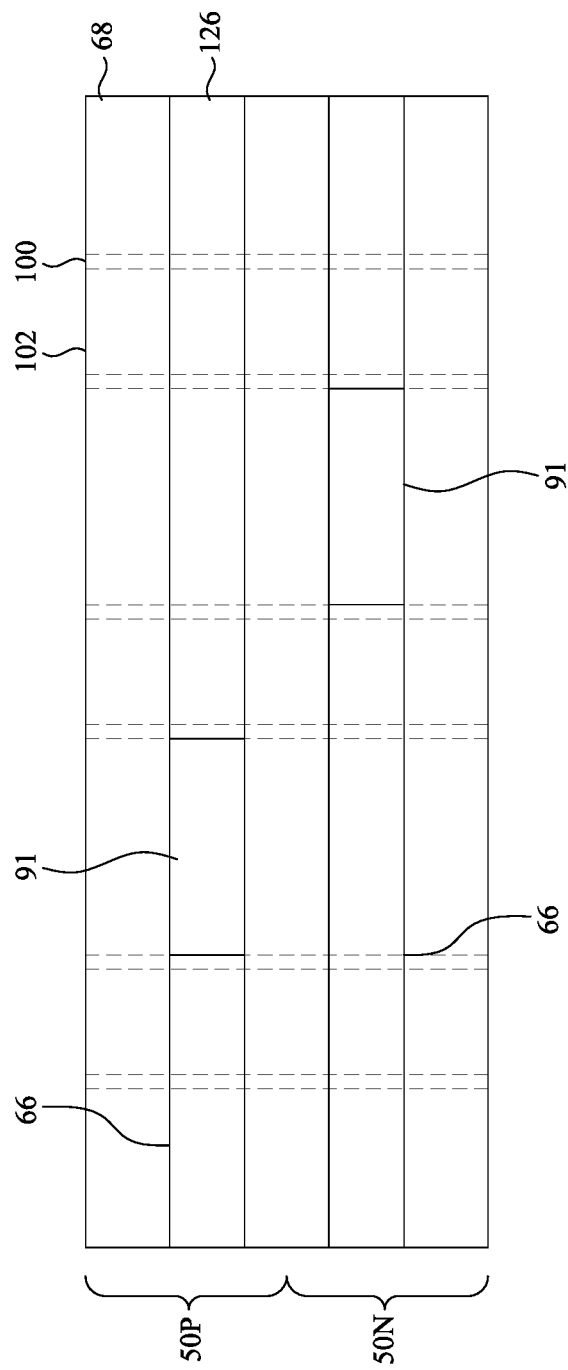
Figure 26B:
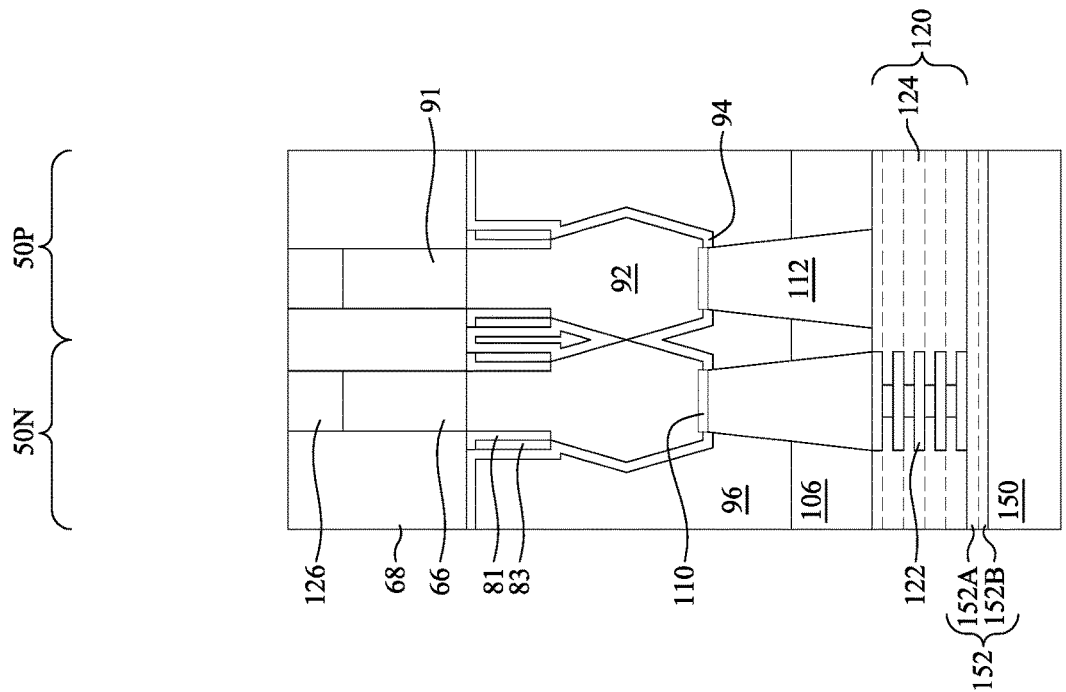
Figure 26A:
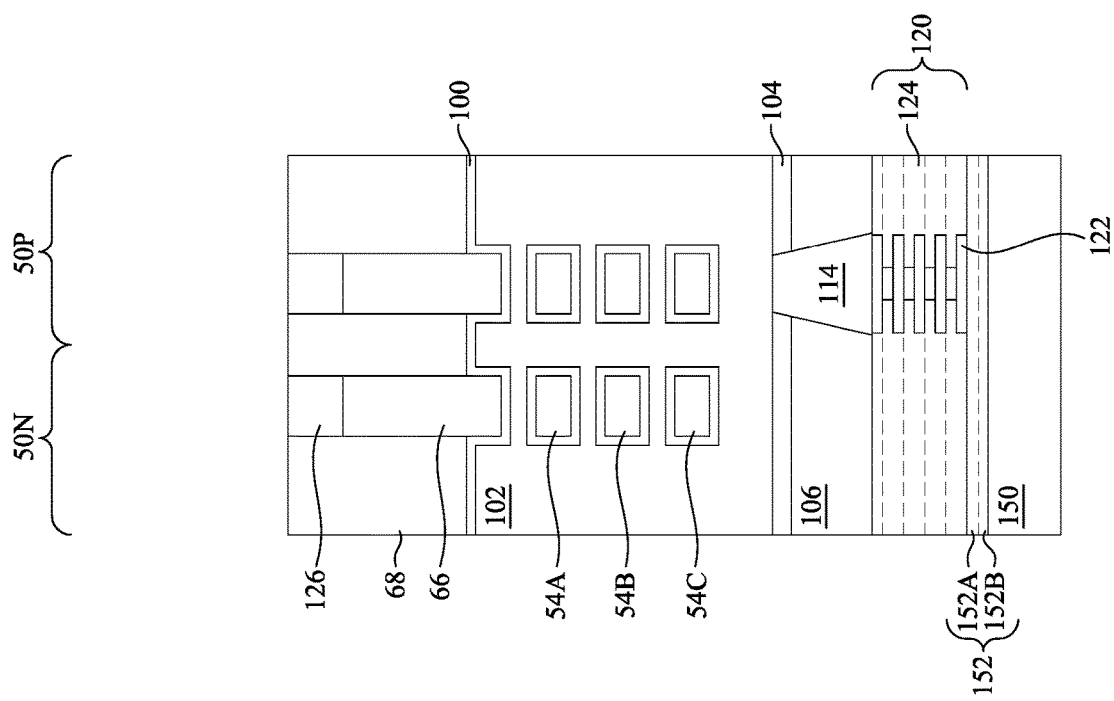
Figure 26C:
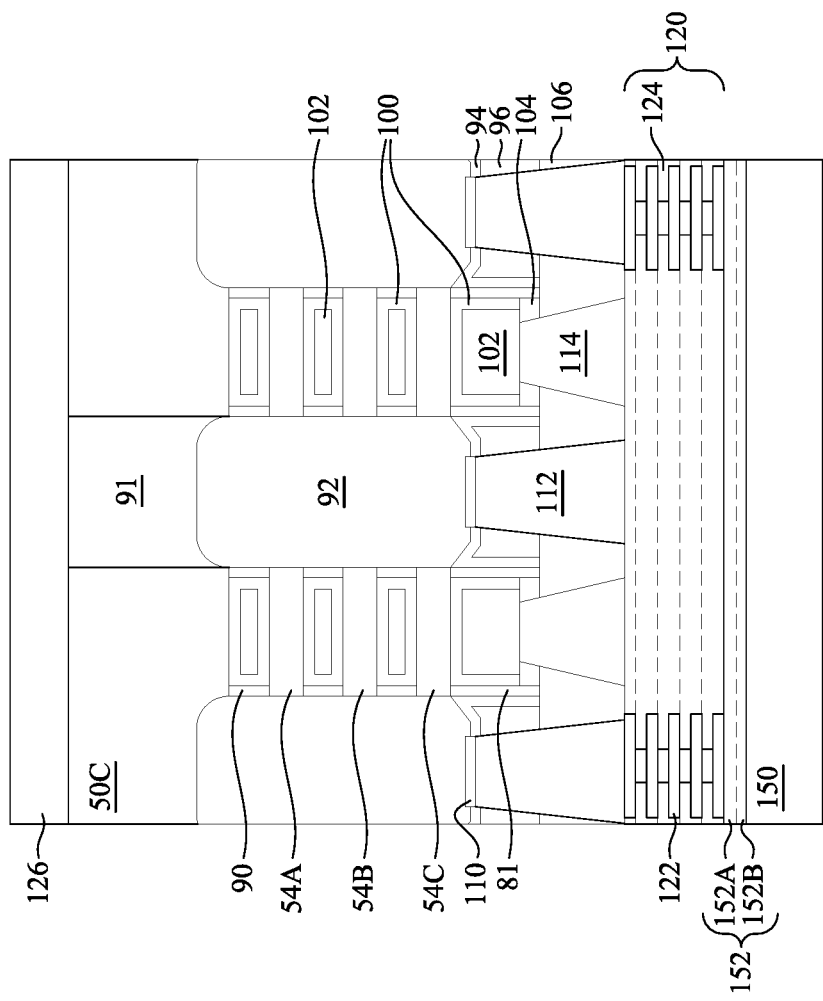
Figure 26D:
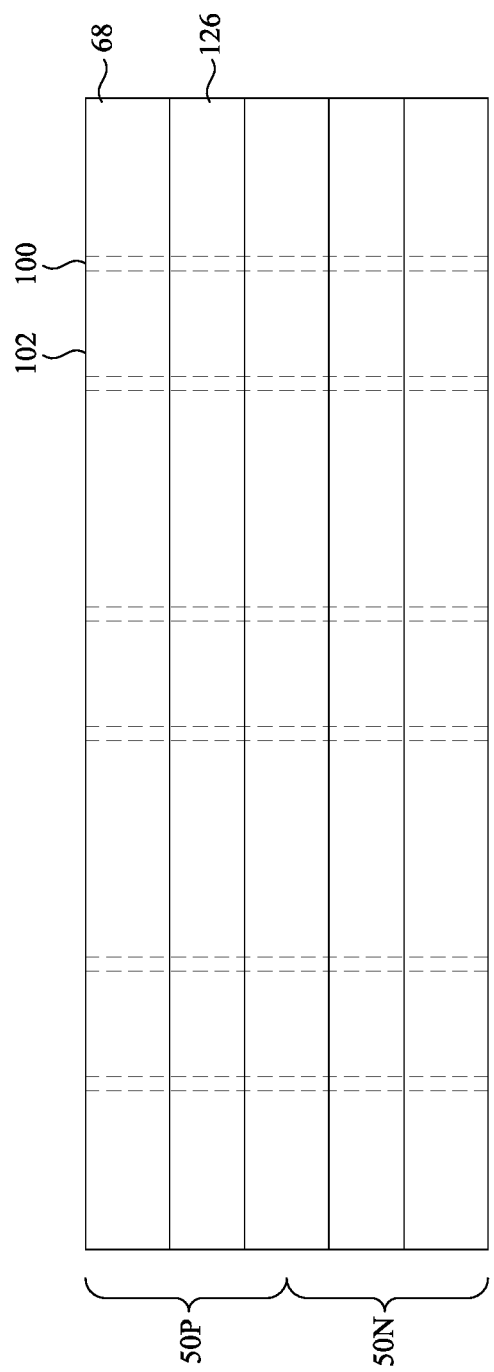
Figure 27C:
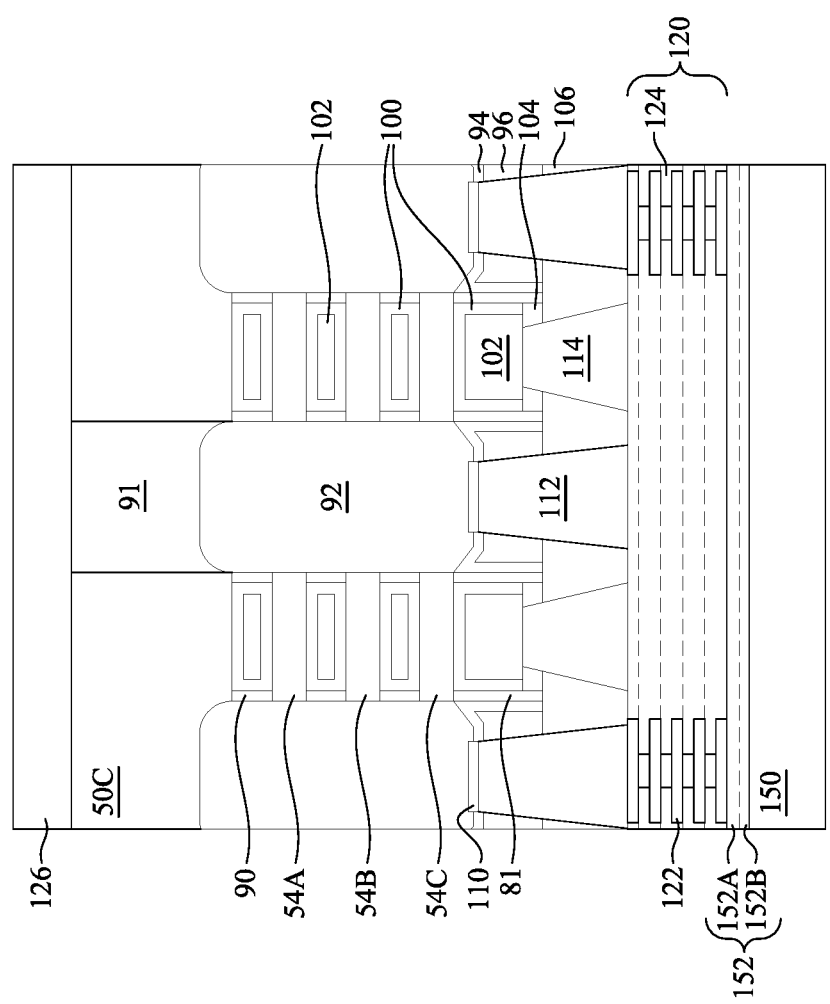
Figure 27D:
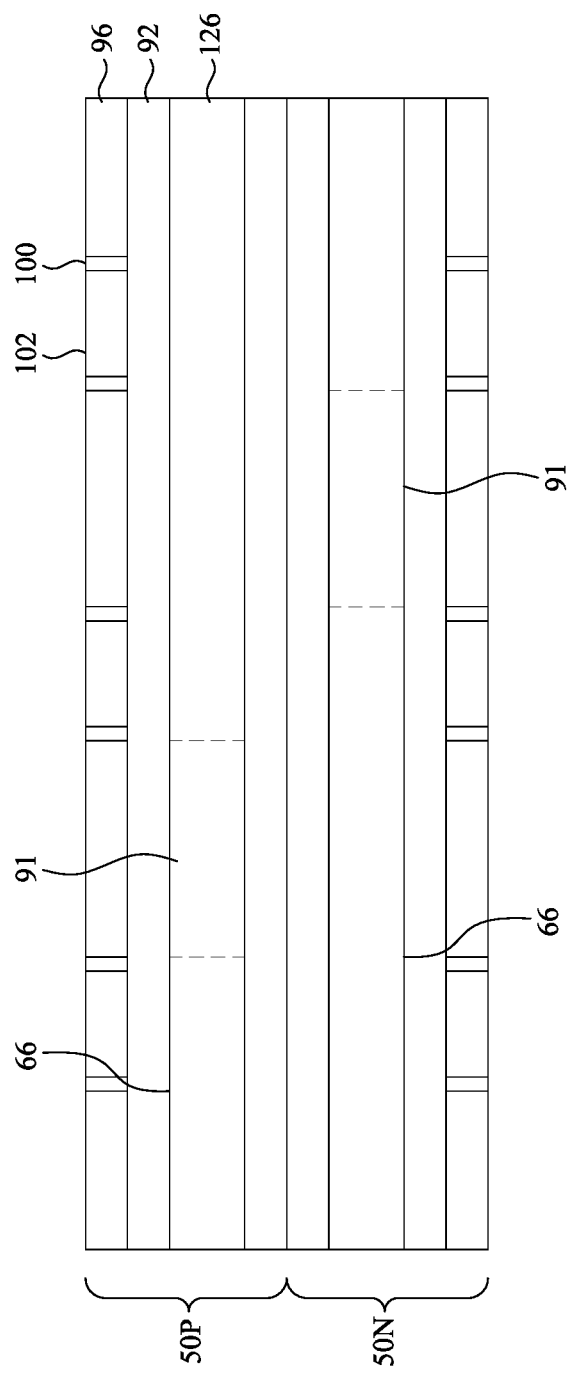
Figure 28B:
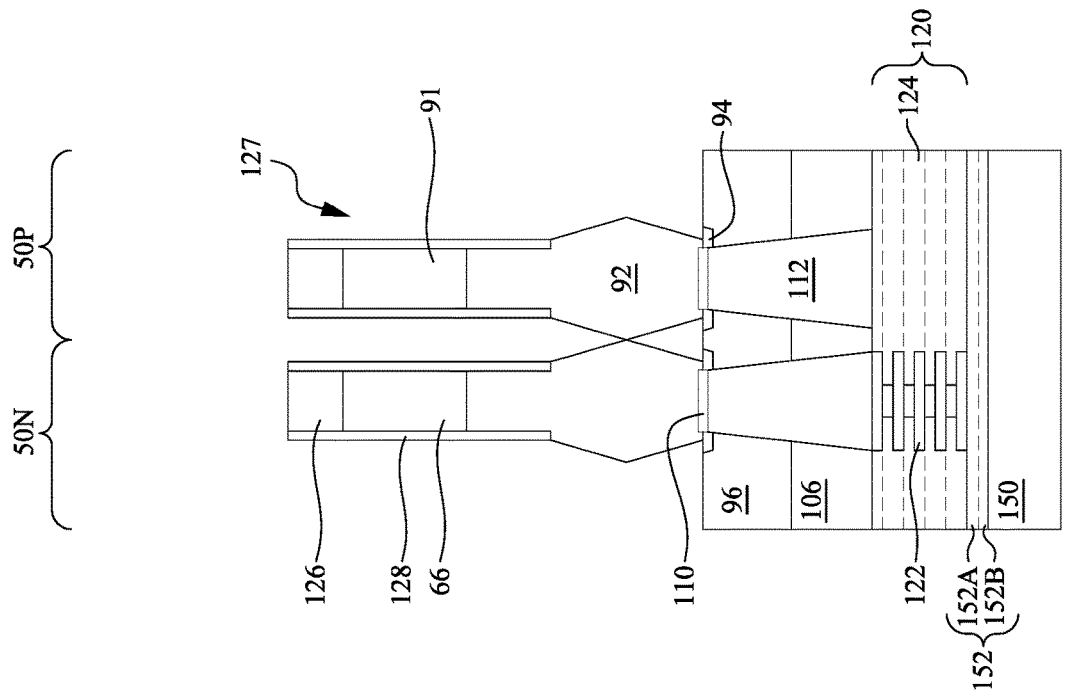
Figure 28A:
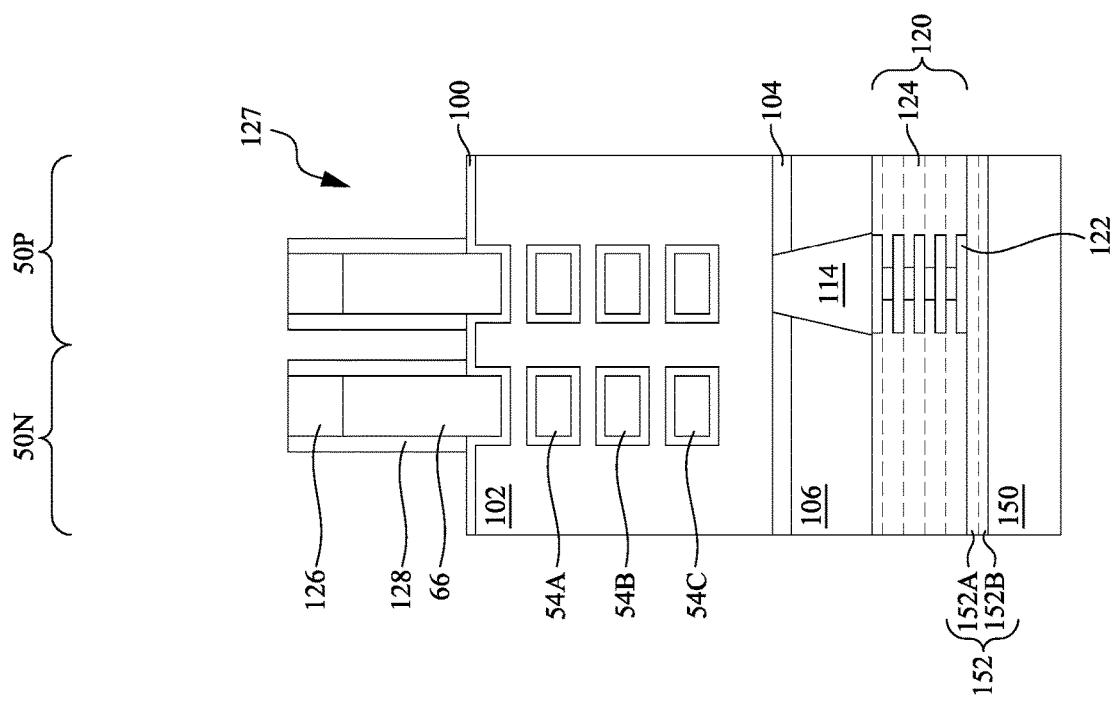
Figure 28C:
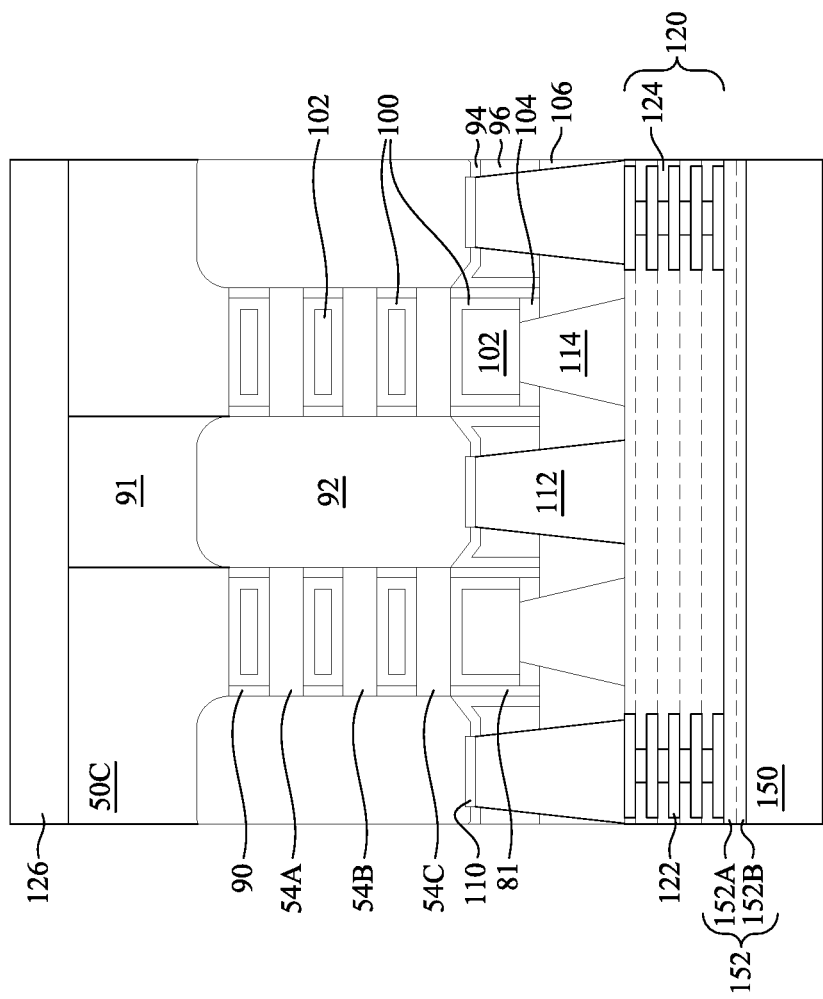
Figure 28D:
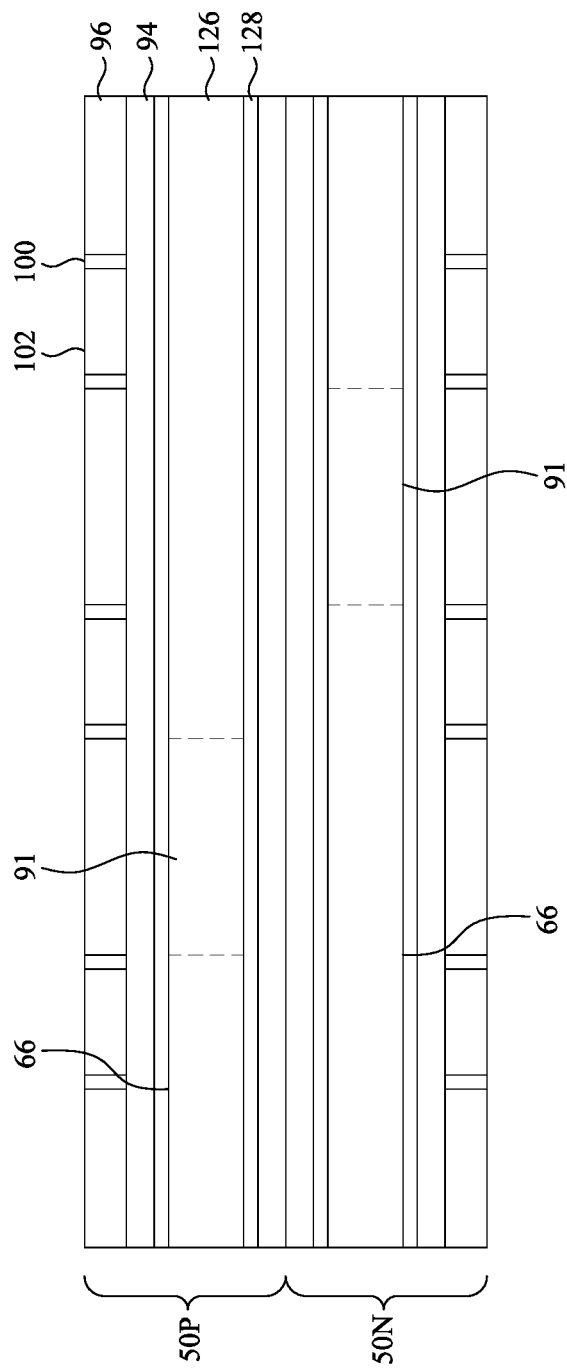
Figure 29B:
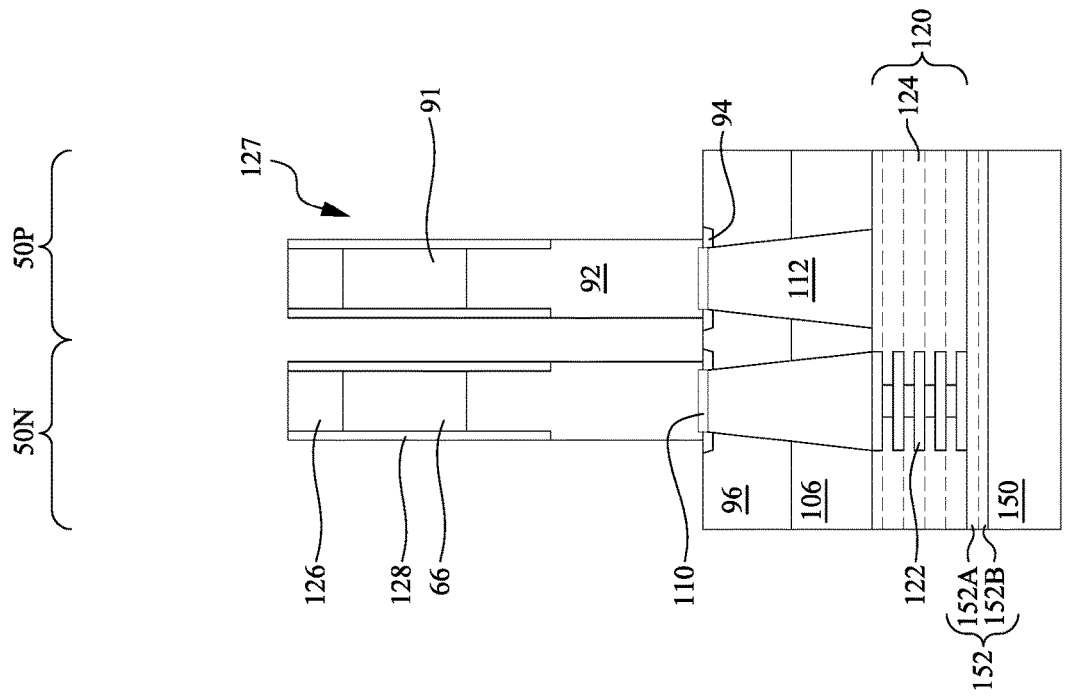
Figure 29A:
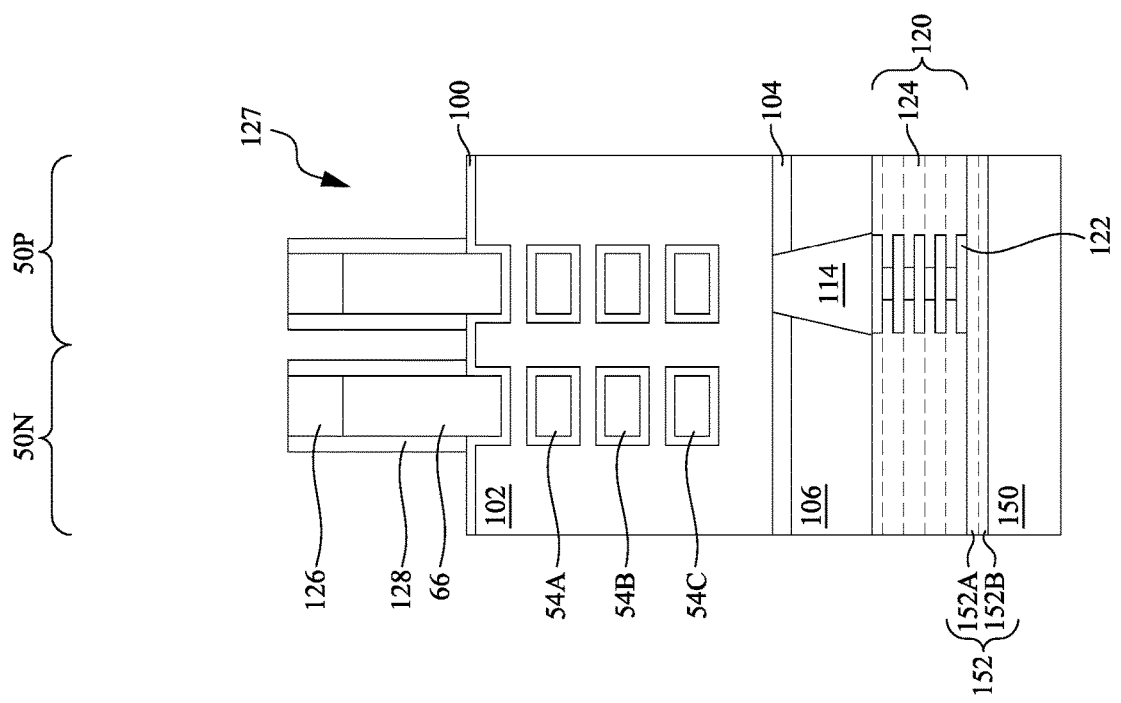
Figure 29C:
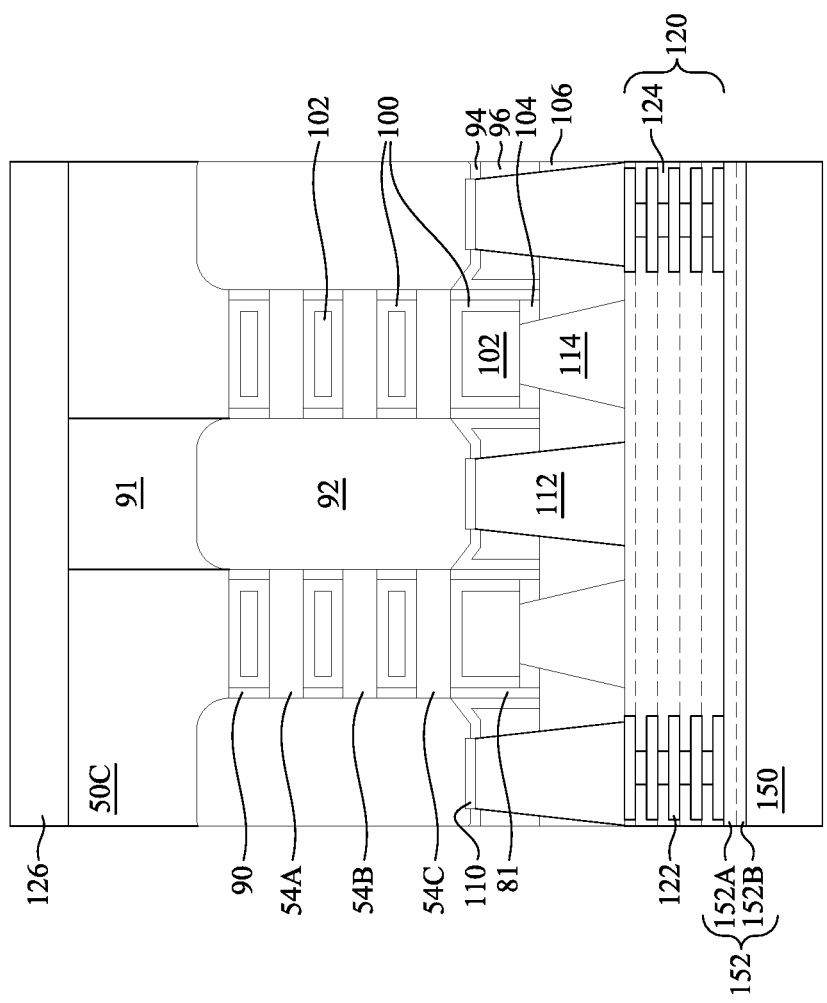
Figure 29D:
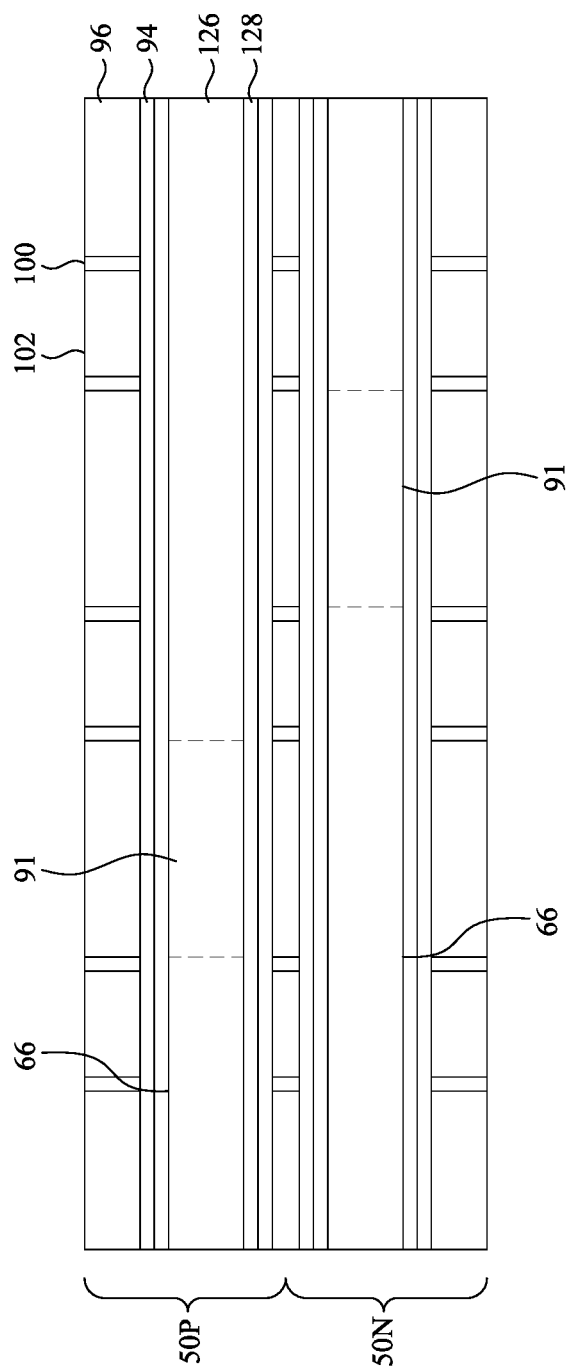

FIG. 25D illustrates a backside view following the thinning process, with the gate dielectric layers 100 and the gate electrodes being illustrated as dashed lines. As illustrated in FIG. 25D, the first epitaxial material 91 may be between gate dielectric layers boo of adjacent gate electrodes 102. The first epitaxial material 91 may be formed replacing portions of the fins 66 at various points along the length of the fins 66. Although a single first epitaxial material 91 is illustrated along the length of each of the fins 66, any number of first epitaxial materials 91 may be disposed in each of the fins 66.

In FIGS. 26A through 26D, portions of the fins 66 and the first epitaxial material 91 are replaced by a cap layer 126. Portions of the fins 66 and the first epitaxial material 91 may be removed using suitable etching processes, such as isotropic etching processes (e.g., wet etching processes), anisotropic etching processes (e.g., dry etching processes), multiple processes or combinations thereof, or the like to define openings in the STI regions 68. The etching processes may be timed etching processes in order to control the amount of material of the fins 66 and the first epitaxial material 91 that is removed.

The cap layer 126 may then be deposited in an opening defined by removing the portions of the fins 66 and the first epitaxial material 91. The cap layer 126 may be deposited by CVD, ALD, PVD, or the like. The cap layer 126 may be used to protect remaining portions of the fins 66 and the first epitaxial material 91 from subsequent etching processes, such as the etching process used to cut the epitaxial source/drain regions 92 (discussed below with respect to FIGS. 29A through 29D) and the processes used to cut the gate structures (discussed below with respect to FIGS. 31A through 31E). The cap layer 126 may comprise silicon oxide, silicon nitride, silicon oxynitride, or the like.

In FIGS. 27A through 27D, the STI regions 68, the first spacers 81, the second spacers 83, and portions of the CESL 94 and the first ILD 96 are removed to form fourth recesses 127. The STI regions 68, the first spacers 81, the second spacers 83, and portions of the CESL 94 and the first ILD 96 are then removed. The STI regions 68, the first spacers 81, the second spacers 83, and portions of the CESL 94 and the first ILD 96 may be removed using suitable etching processes, such as isotropic etching processes. In some embodiments, the STI regions 68, the first spacers 81, the second spacers 83, and portions of the CESL 94 and the first ILD 96 may be removed by one or more wet etching processes. Timed etching processes may be used to stop the etching of the STI regions 68, the first spacers 81, the second spacers 83, the CESL 94, and the first ILD 96 when the fourth recesses 127 reach a desired depth.

As illustrated in FIG. 27B, the timed etching processes may etch the STI regions 68, the first spacers 81, the second spacers 83, the CESL 94, and the first ILD 96 such that bottom surfaces of the fourth recesses 127 (defined by top surfaces of the CESL 94 and the first ILD 96) are level with bottom surfaces of the epitaxial source/drain regions 92. Etching the STI regions 68, the first spacers 81, the second spacers 83, the CESL 94, and the first ILD 96 may be etched such that the bottom surfaces of the fourth recesses 127 are level with bottom surfaces of the epitaxial source/drain regions 92 exposes side surfaces of the epitaxial source/drain regions 92, without exposing the source/drain contacts 112, which allows for a subsequent etching process used to cut the epitaxial source/drain regions 92 (discussed below with respect to FIGS. 29A through 29D) to be performed without etching the source/drain contacts 112. In some embodiments, the bottom surfaces of the fourth recesses 127 may be disposed above or below the bottom surfaces of the epitaxial source/drain regions 92.

In FIGS. 28A through 28D, third spacers 128 are formed along sidewalls of the fins 66, the first epitaxial material 91, the cap layer 126, and the epitaxial source/drain regions 92. A third spacer layer (not separately illustrated) may be deposited over the structures illustrated in FIGS. 27A through 27D. The third spacer layer may be deposited by CVD, ALD, PVD, or the like. The third spacer layer may comprise silicon oxide, silicon nitride, silicon oxynitride, or the like.

The third spacers 128 may then be formed by etching the third spacer layer with a suitable etching process, such as an anisotropic etching process. The third spacers 128 may have thicknesses from about 1 nm to about 10 nm. The third spacers 128 may extend along vertical sidewalls of the cap layer 126, the fins 66, the first epitaxial material 91, and the epitaxial source/drain regions 92, while faceted portions of the epitaxial source/drain regions 92 are exposed by the third spacers 128. As will be discussed in greater detail below in reference to FIGS. 29A through 29D, the third spacers 128 may be used as masks for a subsequent etching process used to cut the epitaxial source/drain regions 92 and may protect the fins 66, the first epitaxial material 91, and portions of the epitaxial source/drain regions 92 from the etching process.

In FIGS. 29A through 29D, portions of the epitaxial source/drain regions 92 are trimmed using the cap layer 126 and the third spacers 128 as a mask. For example, areas of the epitaxial source/drain regions 92 that extend laterally past the third spacers 128 may be removed. The epitaxial source/drain regions 92 may be trimmed by a suitable etching process, such as an anisotropic etching process. In some embodiments, the epitaxial source/drain regions 92 may be trimmed using RIE, NBE, a combination thereof, or the like. The above-described process for trimming the epitaxial source/drain regions 92 is a self-aligned process, which allows for the epitaxial source/drain regions 92 to be patterned at smaller pitches and with greater accuracy than conventional processes. Trimming the epitaxial source/drain regions 92 from the backside of the second substrate 50C may allow for the fins 66 and the epitaxial source/drain regions 92 to be formed with tighter pitches, while preventing undesired bridging between adjacent epitaxial source/drain regions 92. This reduces device defects, increases device density, and improves device performance. Trimming the epitaxial source/drain regions 92 may also reduce the dimensions of the epitaxial source/drain regions 92, which reduces parasitic capacitance.

In FIGS. 30A through 30E, a third ILD 130 is formed in the fourth recesses 127 over the first ILD 96 and the CESL 94 and along sidewalls of the third spacers 128 and the epitaxial source/drain regions 92. The third ILD 130 may be a dielectric material such as silicon nitride, silicon oxide, silicon oxynitride, a low-k dielectric material, combinations of these, or the like. The third ILD 130 may be deposited by a process such as CVD, PVD, ALD, combinations or multiples thereof, or the like. In some embodiments, the third ILD 130 is a flowable film formed by FCVD. In some embodiments, the third ILD 130 is formed of a dielectric material such as PSG, BSG, BPSG, USG, or the like.

In some embodiments, the third ILD 130 may be deposited over the cap layer 126 and the third spacers 128 and then recessed such that the fins 66, the first epitaxial material 91, the cap layer 126, and portions of the third spacers 128 extend from between neighboring portions of the third ILD 130. The third ILD 130 may be recessed by a planarization process followed by an etching process. The planarization process may include a CMP, an etch-back process, a combination thereof, or the like. The etching process may be a selective etching process (e.g., a process which etches the material of the third ILD 130 at a faster rate than the material of the third spacers 128, the cap layer 126, or the gate dielectric layers 100.

Figure 30B:
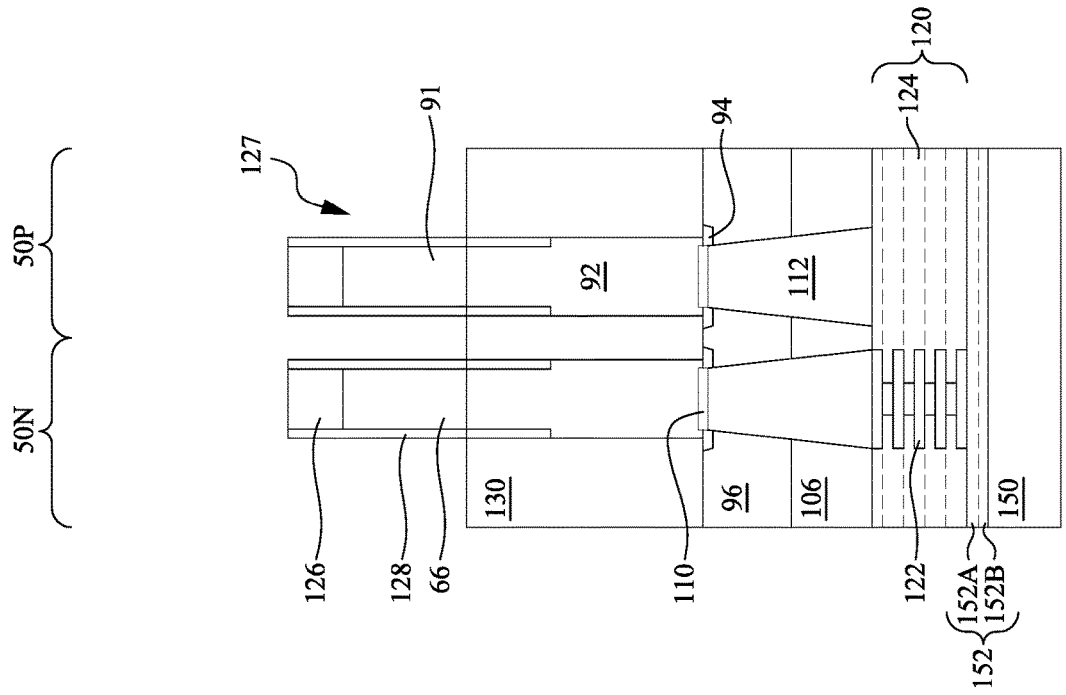
Figure 30A:
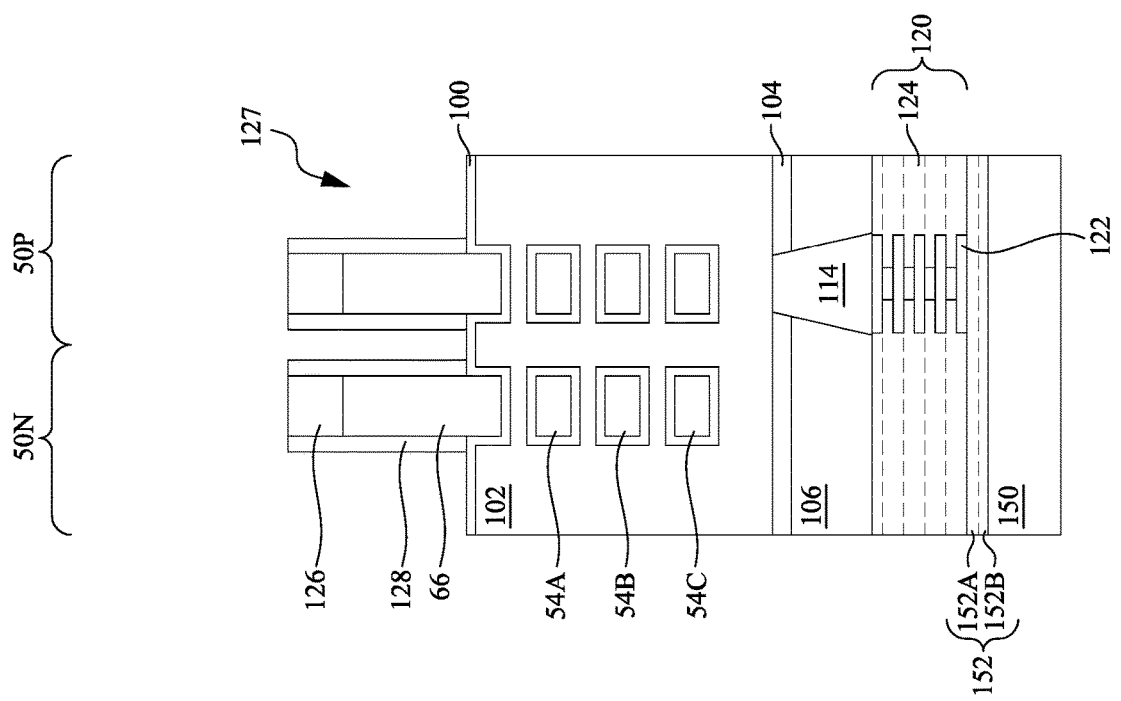
Figure 30C:
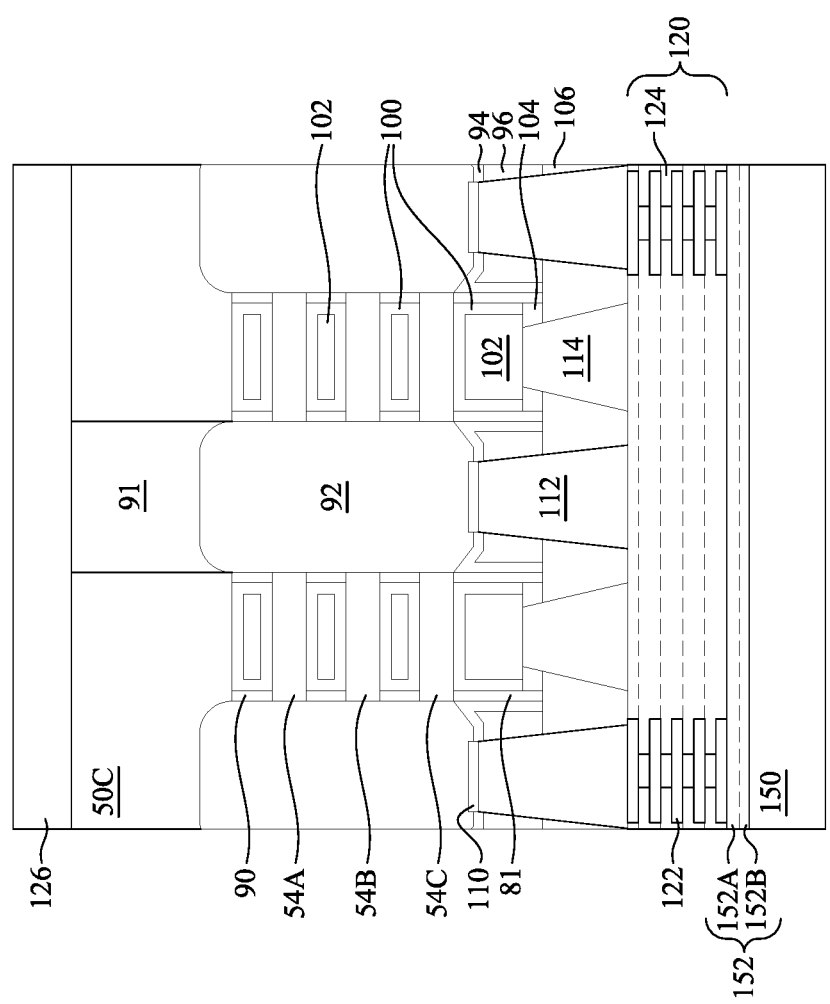
Figure 30D:
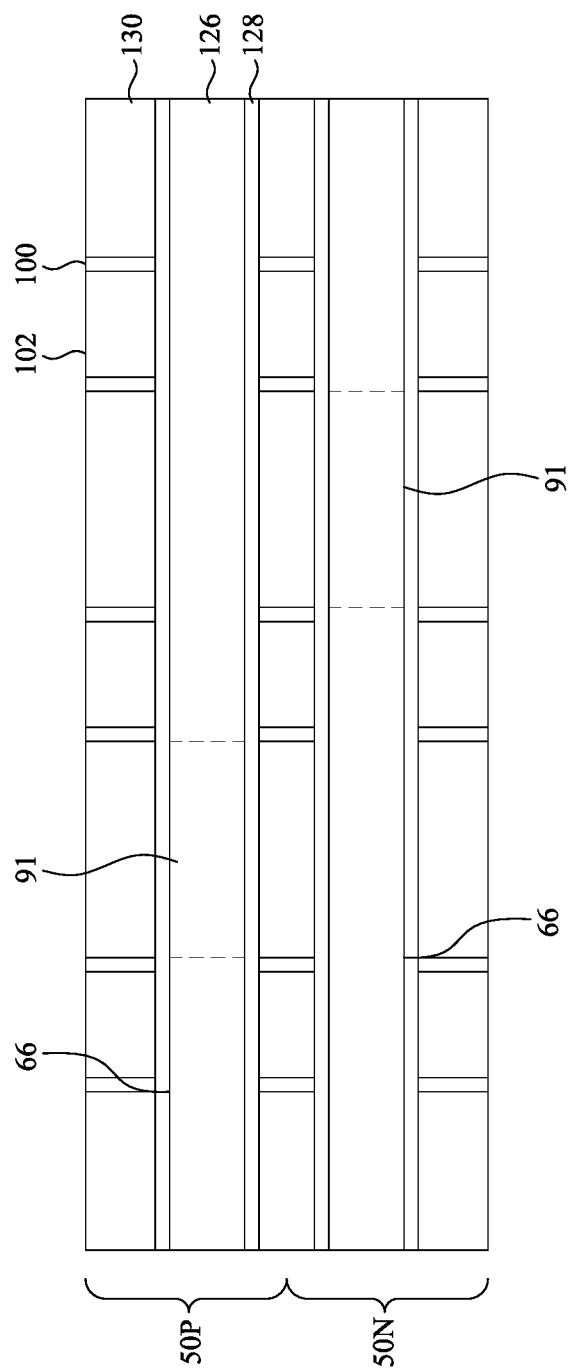
Figure 30E:
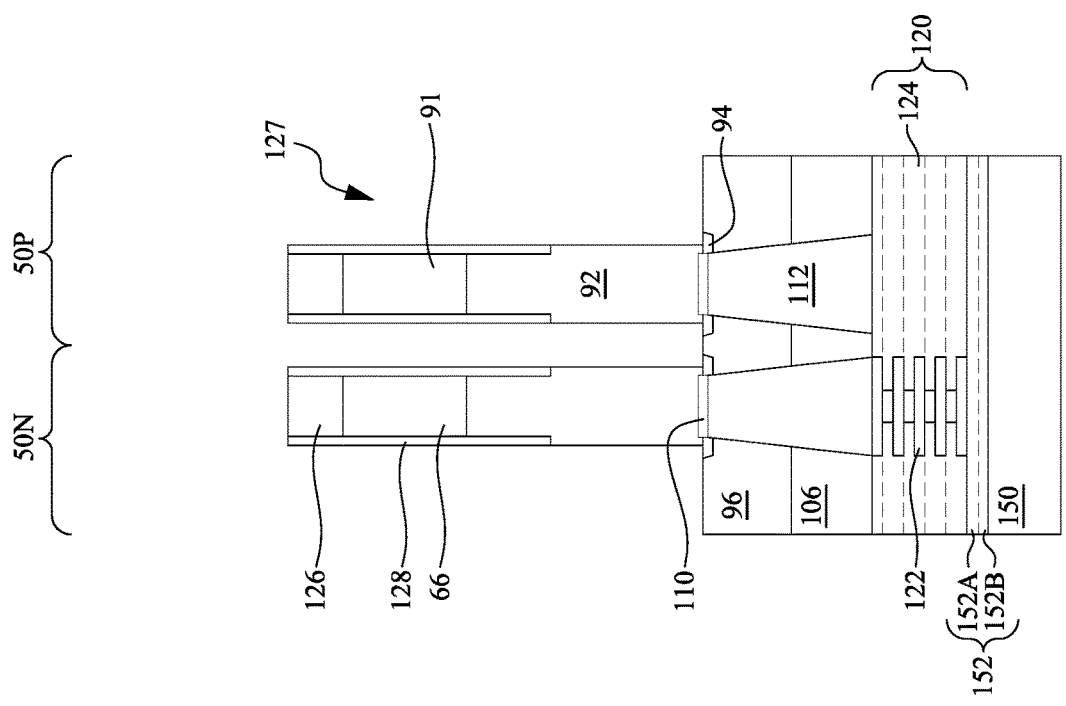

In some embodiments, the third ILD 130 may be optional. For example, FIG. 30E illustrates an embodiment in which the third ILD 130 is not formed. Rather, as will be discussed in greater detail below, air gaps (such as the second air gaps 137, discussed below with respect to FIG. 32F) may be formed adjacent the epitaxial source/drain regions 92.

In FIGS. 31A through 31E, a second patterned hard mask 132 is formed over the structures illustrated in FIGS. 30A through 30D. The second patterned hard mask 132 may act as a mask for etching the gate structures, including the gate dielectric layers 100 and the gate electrodes 102. A second hard mask layer (not separately illustrated) may be deposited on top surfaces of the gate dielectric layers 100, the cap layer 126, and the third ILD 130; and top surfaces and sidewalls of the third spacers 128. The second hard mask layer may be deposited by CVD, ALD, or the like. The second hard mask layer may be formed of silicon oxide, silicon nitride, silicon carbide, amorphous silicon, titanium nitride, silicon oxynitride, silicon carbonitride, combinations or multiple layers thereof, or the like.

The second patterned hard mask 132 may then be formed by forming a second patterned photoresist layer (not separately illustrated) over the second hard mask layer and patterning the second hard mask layer using the second patterned photoresist layer as a mask. The second photoresist layer may be deposited using spin-on coating or the like. The second photoresist layer may then be patterned by exposing the second photoresist layer to a patterned energy source (e.g., a patterned light source) and developing the second photoresist layer to remove an exposed or unexposed portion of the second photoresist layer, thereby forming the second patterned photoresist layer. The second hard mask layer may be etched by a suitable etching process, such as an anisotropic etching process, to transfer the pattern of the second patterned photoresist layer to the second hard mask layer, forming the second patterned hard mask 132. In some embodiments, the etching process may include reactive ion etching (RIE), neutral beam etching (NBE), the like, or a combination thereof.

Figure 31B:
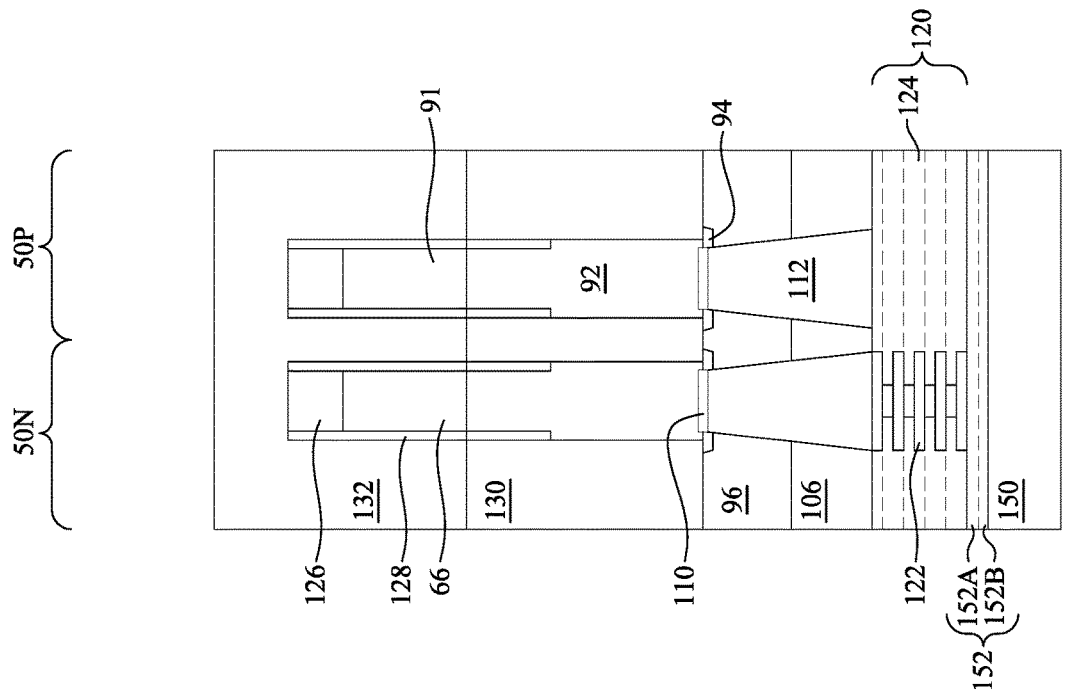
Figure 31A:
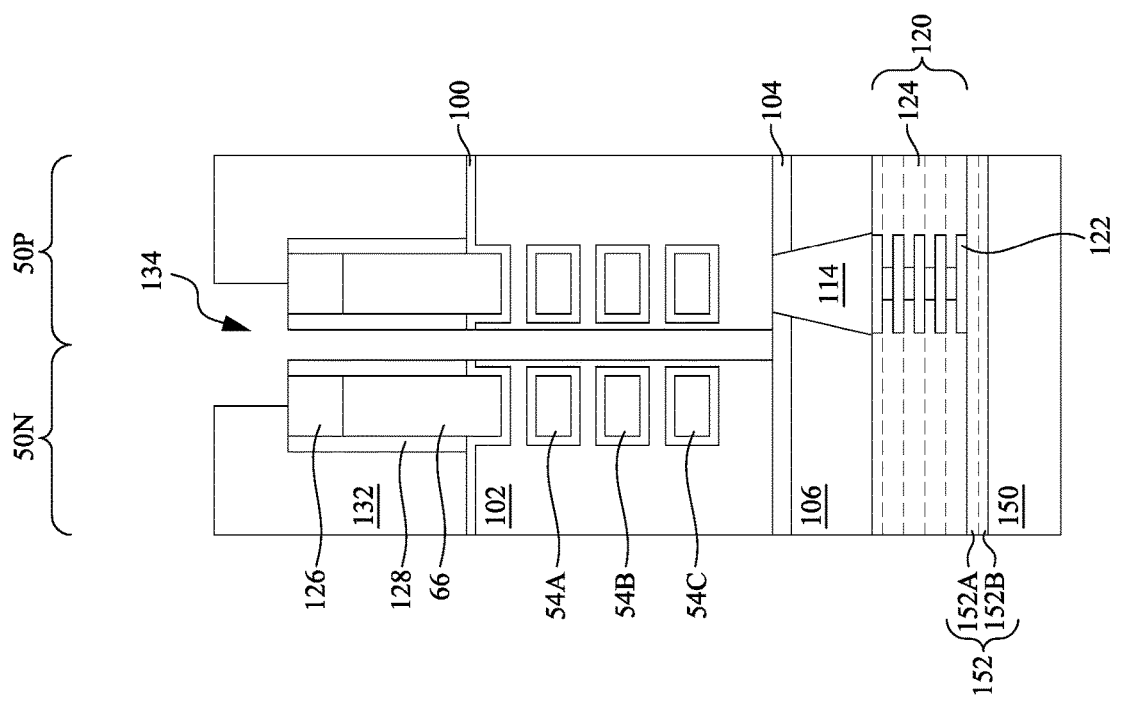
Figure 31C:
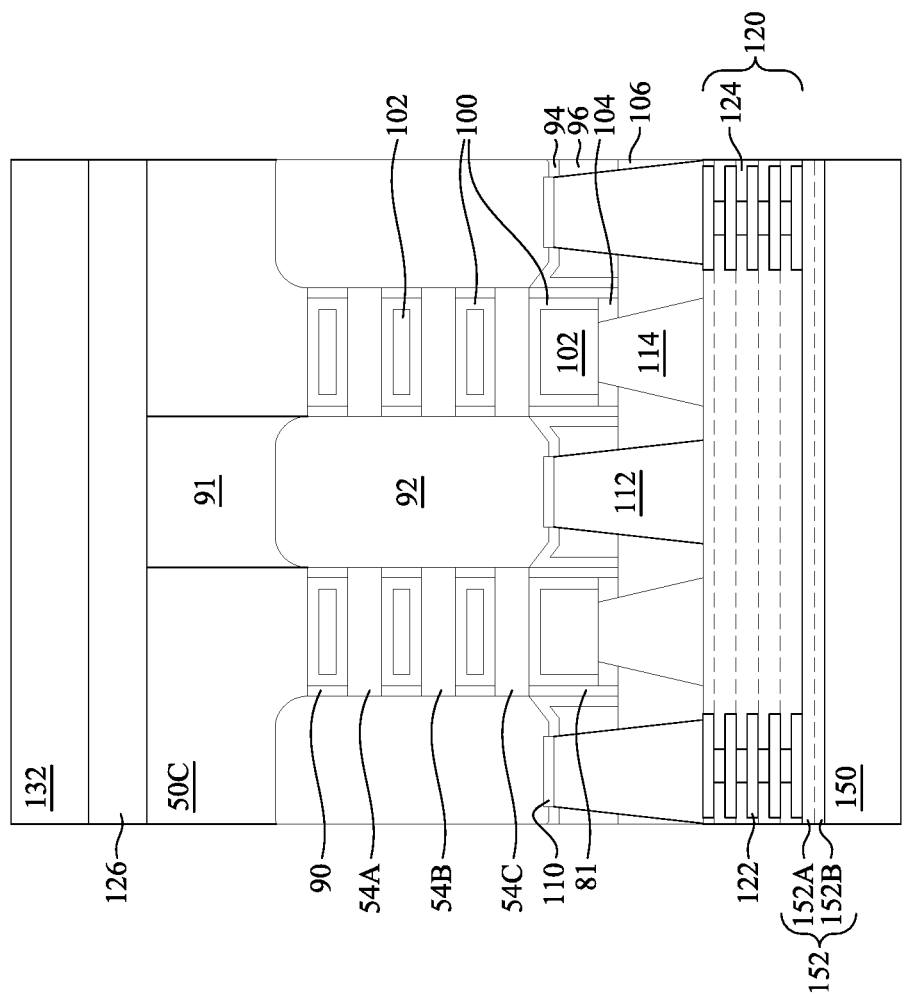
Figure 31D:
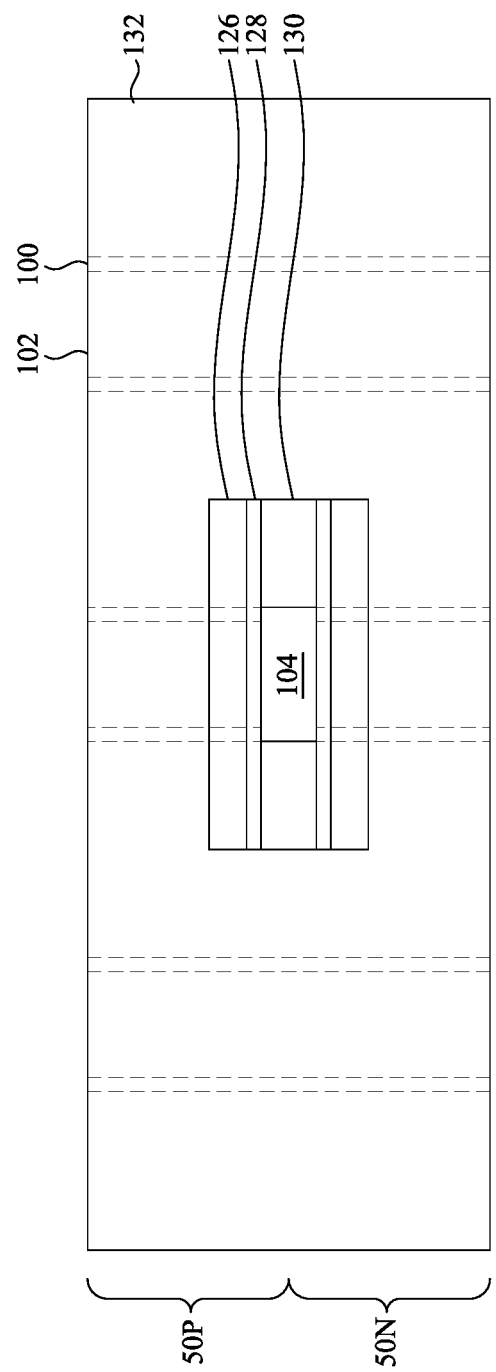

Further in FIGS. 31A through 31E, the second patterned hard mask 132, the third spacers 128, and the cap layer 126 are used as masks to etch a fifth recess 134 in a gate structure. As illustrated in FIG. 31A, the fifth recess 134 may extend completely through a gate dielectric layer 100 and the gate electrode 102 of the gate structure. The fifth recess 134 may have an aspect ratio (e.g., a ratio of the height to the width) from about 2 to about 10. In some embodiments, the fifth recess 134 may also extend at least partially through the gate mask 104. For example, in some embodiments, the fifth recesses 134 may extend from 3 nm to 20 nm into the gate mask 104. As further illustrated in FIG. 31A, at least a portion of the gate electrode 102 may remain between the gate dielectric layer 100 disposed on the second nanostructures 54. Although sidewalls of the fifth recess 134 are illustrated as being vertical, in some embodiments, the fifth recess 134 may have tapered profiles in the gate structure which have decreasing widths as the fifth recess 134 extend through the gate structure. For example, a width of the fifth recesses 134 may increasingly decrease in a direction towards the interconnect structure 120.

The above-described process for etching the gate structure is a self-aligned process, which allows for the gate structure to be patterned at smaller pitches and with greater accuracy than conventional processes. In the self-aligned process, the fifth recess 134 may have continuous sidewalls extending from backside surfaces of the third spacers 128 through the gate structure into the gate mask 104. In some embodiments, the self-aligned process may be performed on structures in which the fins 66 are spaced apart with a pitch ranging from about 20 nm to about 50 nm. Etching the gate structure from the backside of the second substrate 50C may allow for the fins 66 to be formed with tighter pitches. Thus, the above-described process reduces device defects, increases device density, and improves device performance. Moreover, conventional processes for etching gate structures may increase the height of the gate electrodes 102 to cover for etch losses of the first ILD 96 during the etching of the gate structures. Etching the gate structure according to the self-aligned backside process prevents etching of the first ILD 96 and allows for gate electrodes 102 to be formed with lower heights, which reduces costs.

Figure 31E:
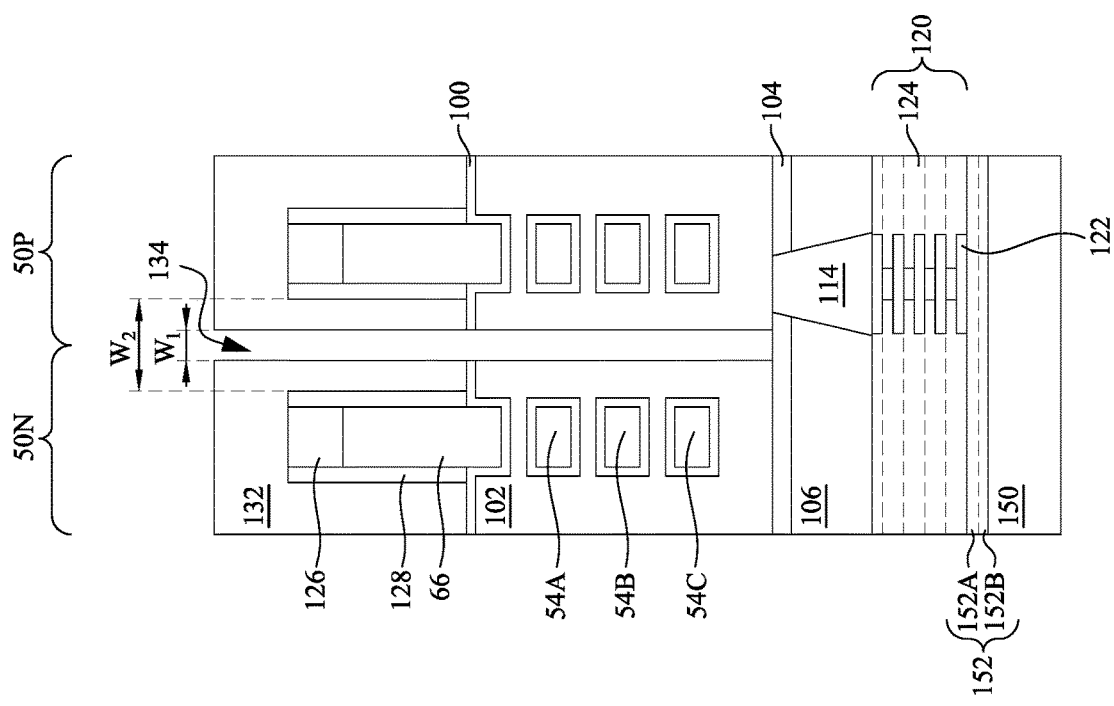

FIG. 31E illustrates an embodiment in which the fins 66 are spaced further apart and the gate structure is etched by a process which is not self-aligned. For example, the fins 66 may be spaced apart with a pitch ranging from about 40 nm to about 100 nm. The process used to etch the gate dielectric layer 100 and the gate electrode 102 may be the same as the above-described process, except that only the second patterned hard mask 132 is used as a mask, not the second patterned hard mask 132 in addition to the cap layer 126 and the third spacers 128. As illustrated in FIG. 31E, the fifth recess 134 may have a width $W_1$ less than a width $W_2$ between third spacers 128 disposed on adjacent fins 66. For example, the width $W_1$ may be from about 20 nm to about 80 nm and the width $W_2$ may be from about 30 nm to about 90 nm. Etching the gate structure with a process which is not self-aligned allows for any gate structure to be etched, regardless of the spacing between adjacent fins 66. However, the accuracy of the etching of the gate structure according to the process which is not self-aligned is lower than the accuracy of the self-aligned process and depends on the accuracy of the lithography processes used to pattern the second patterned hard mask 132.

In FIGS. 32A through 32G, the second patterned hard mask 132 is removed and a fourth ILD 136 is formed in the fifth recess 134, over top surfaces of the gate dielectric layers 100, over the STI regions 68, and surrounding sidewalls of the third spacers 128. The second patterned hard mask 132 may be removed by a suitable etching process, which may be an isotropic etching process, such as a wet etching process. The etching process may have a high etch selectivity to materials of the second patterned hard mask 132. As such, the second patterned hard mask 132 may be removed without significantly removing materials of the cap layer 126, the third spacers 128, the gate dielectric layers 100, the gate electrodes 102, or the third ILD 130.

The fourth ILD 136 may then be deposited filling the portions of the fifth recess 134 extending through the gate structure and over the gate dielectric layers 100, the cap layer 126, the third ILD 130, and the third spacers 128. The fourth ILD 136 may be a dielectric material such as silicon nitride, silicon oxide, silicon oxynitride, a low-k dielectric material, combinations of these, or the like. The fourth ILD 136 may be deposited by a process such as CVD, PVD, ALD, combinations or multiples thereof, or the like. In some embodiments, the fourth ILD 136 is a flowable film formed by FCVD. In some embodiments, the fourth ILD 136 may be formed of a dielectric material such as PSG, BSG, BPSG, USG, or the like. In some embodiments, the fourth ILD 136 may be deposited and then planarized to expose top surfaces of the cap layer 126 and the third spacers 128. The fourth ILD 136 may be planarized by a CMP, an etch-back process, a combination thereof, or the like.

Figure 32C:
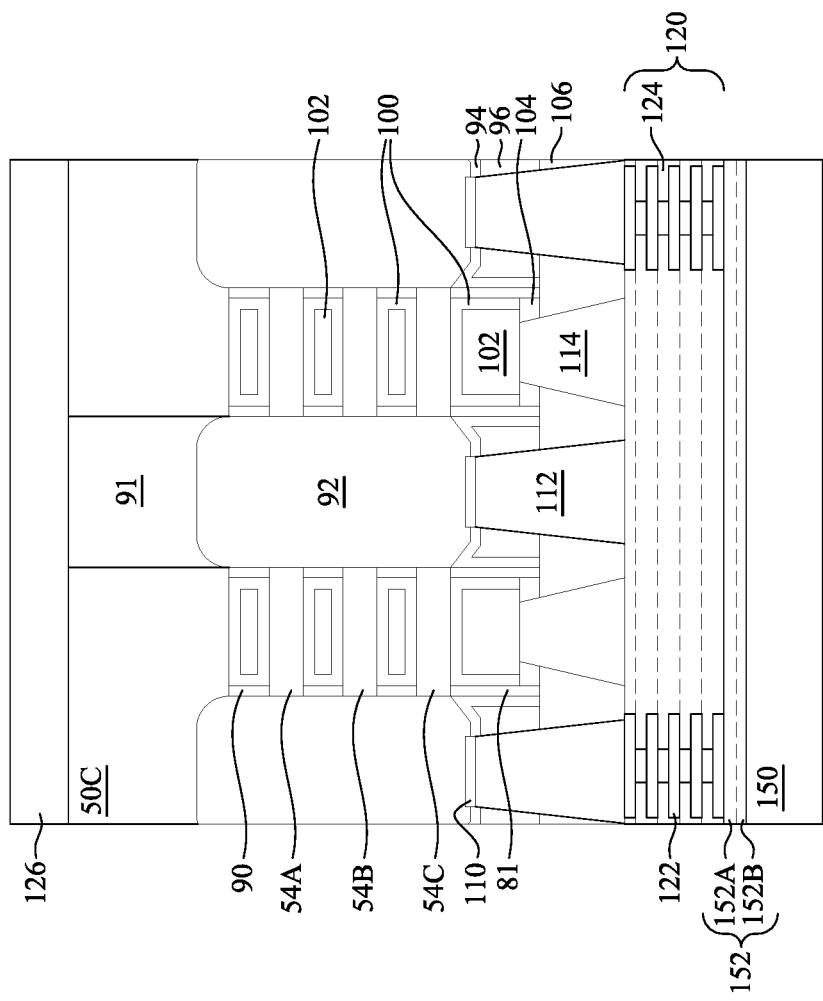
Figure 32D:
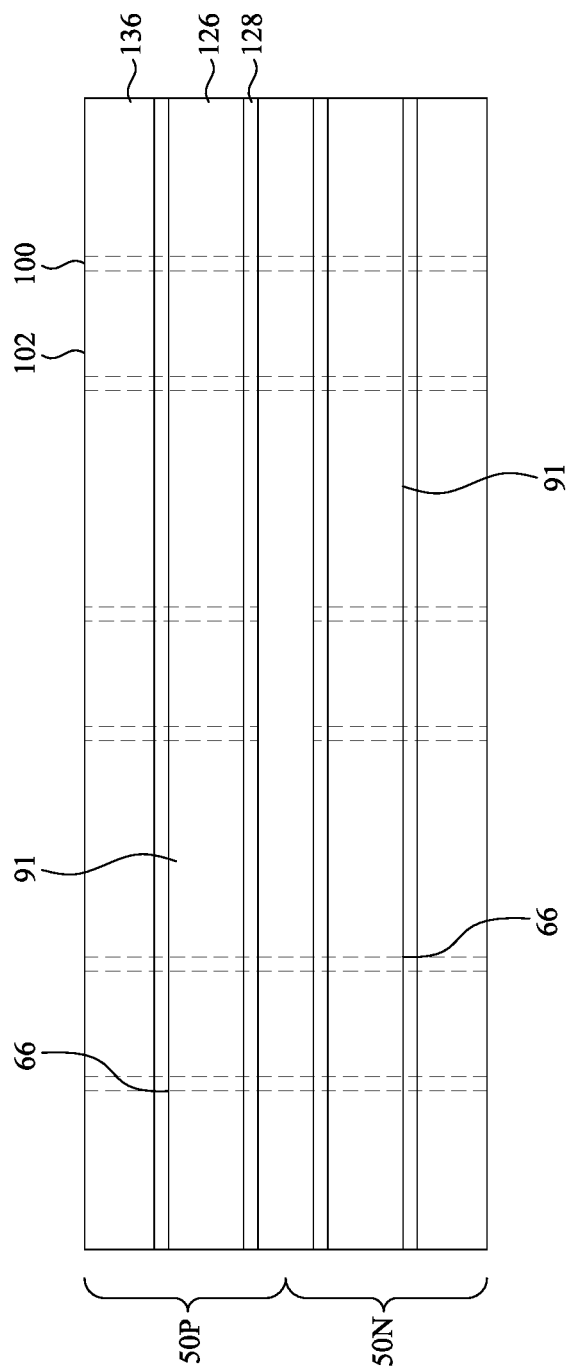
Figure 32F:
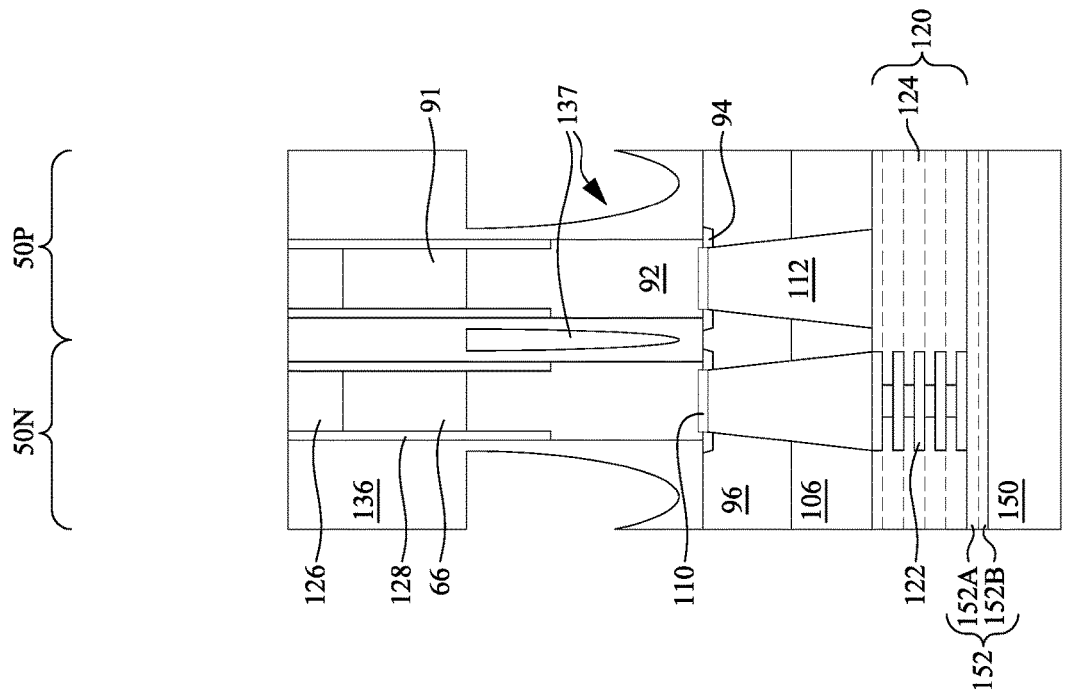
Figure 32E:
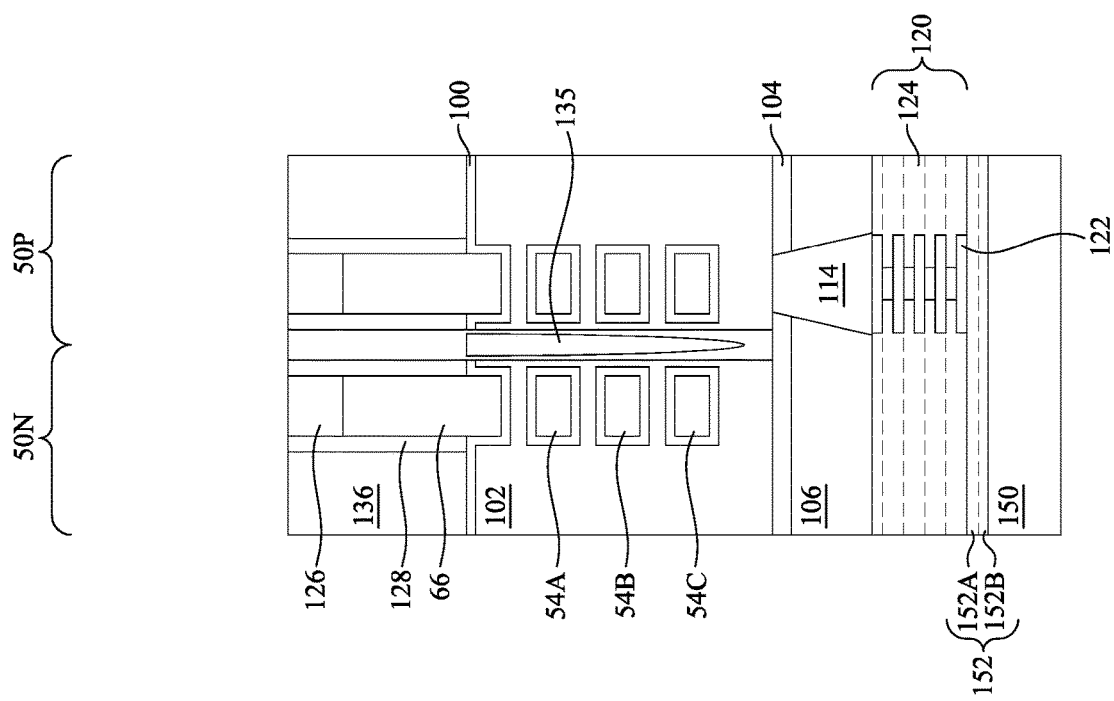
Figure 32G:
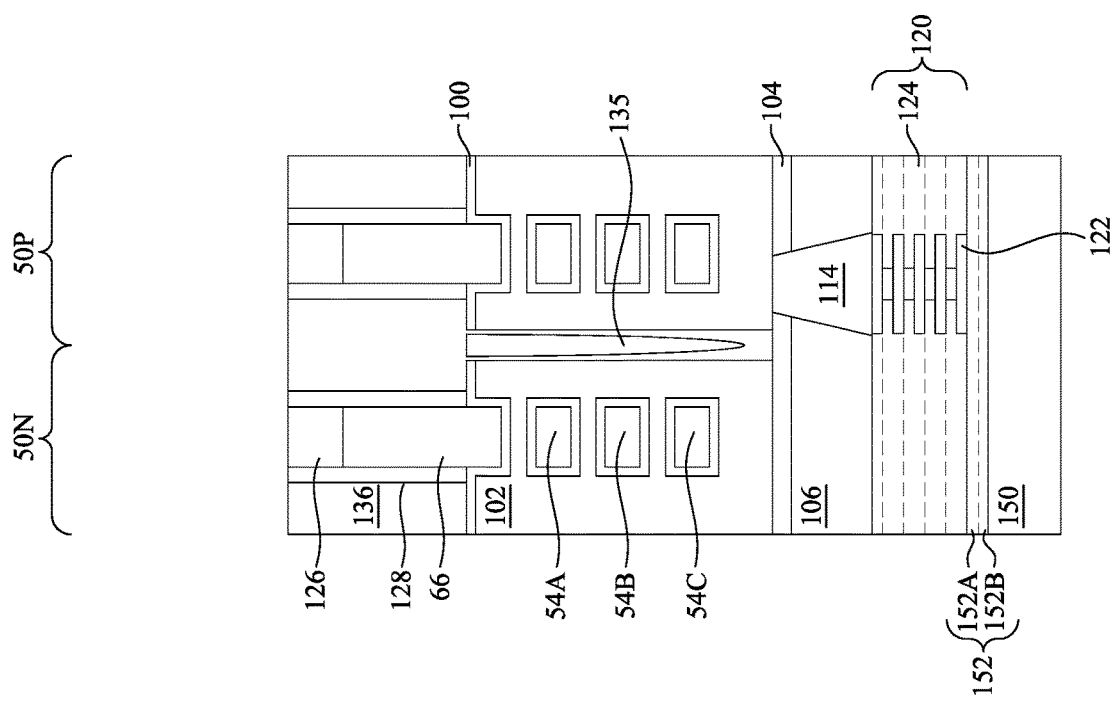
Figure 33B:
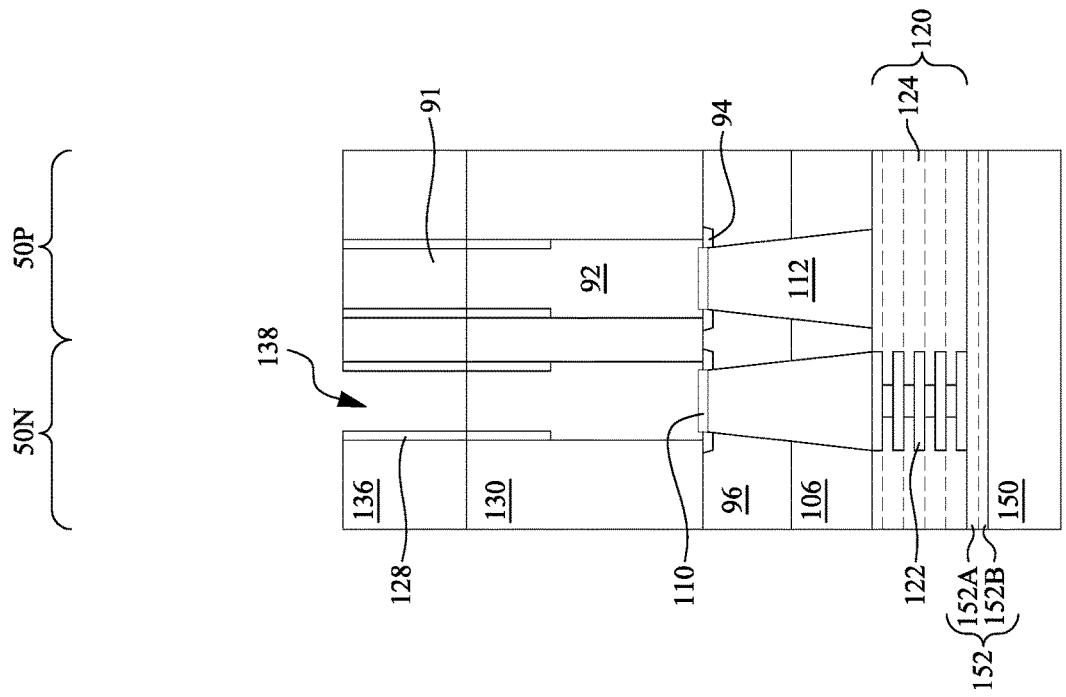
Figure 33A:
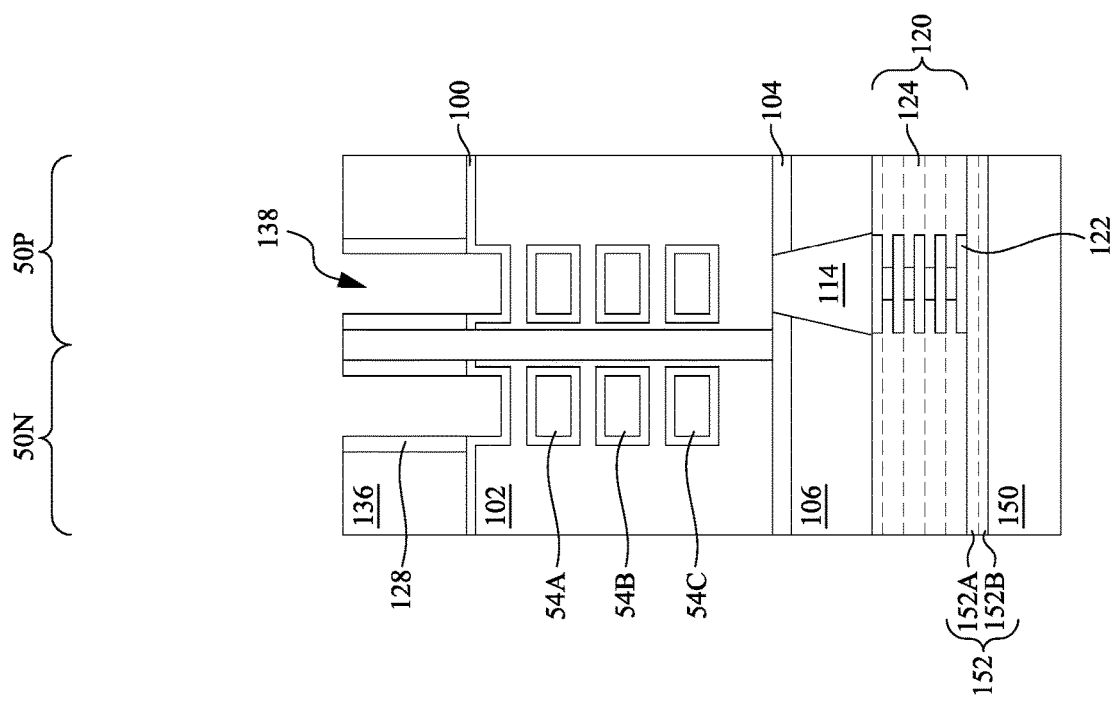
Figure 33C:
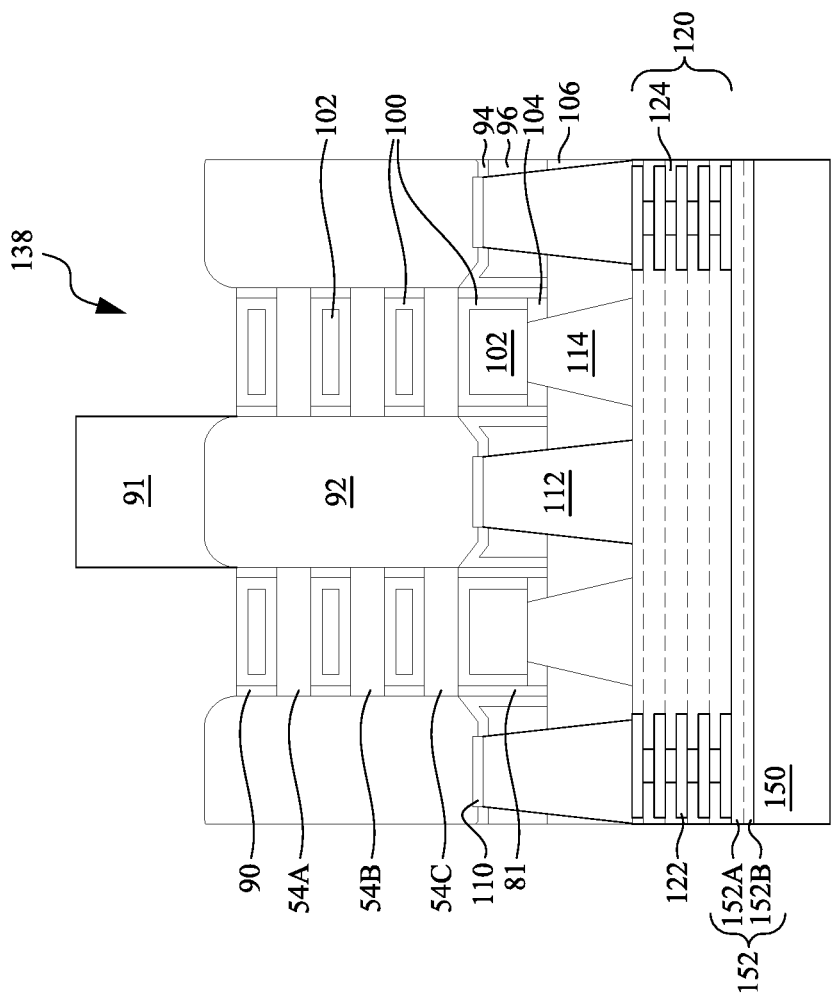
Figure 33D:
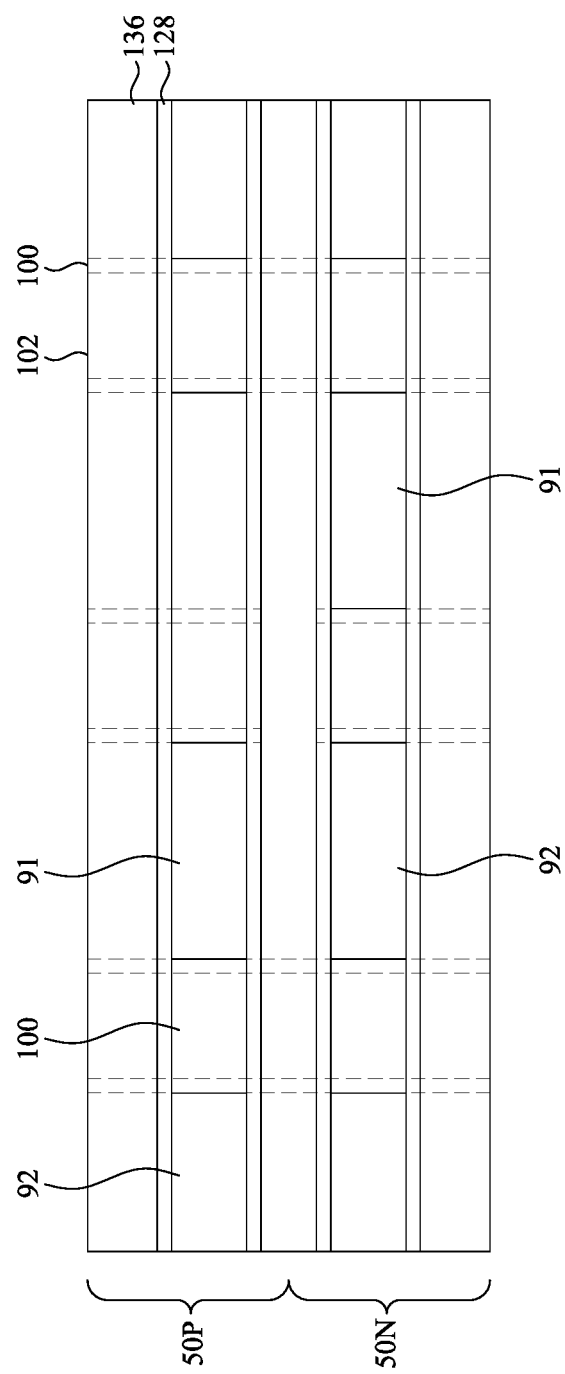
Figure 34B:
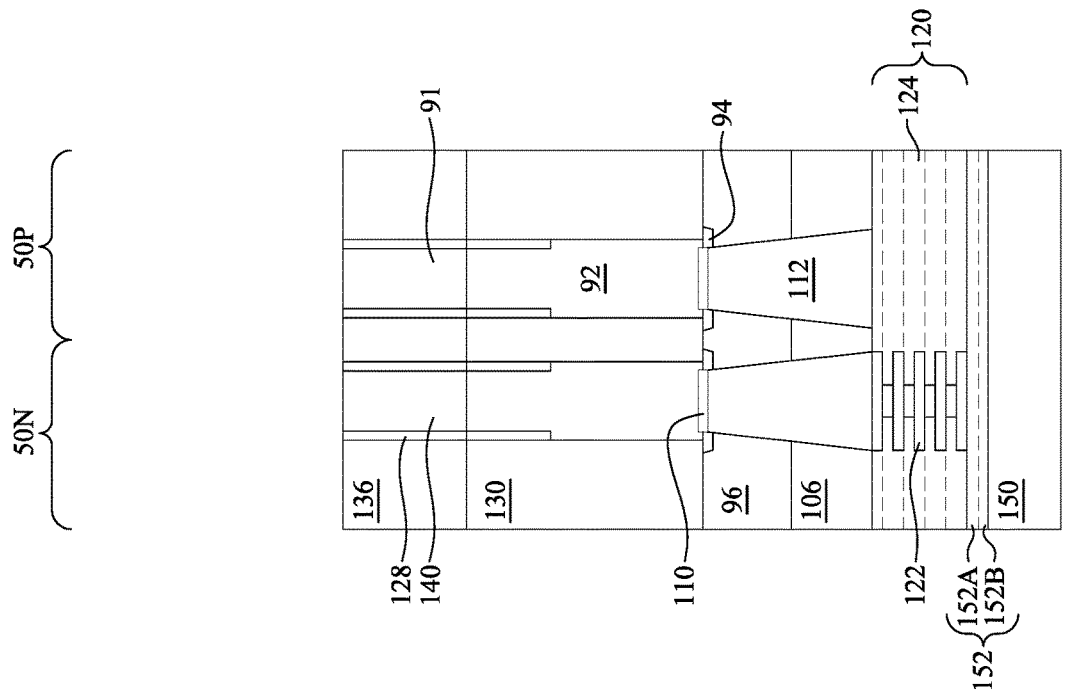
Figure 34A:
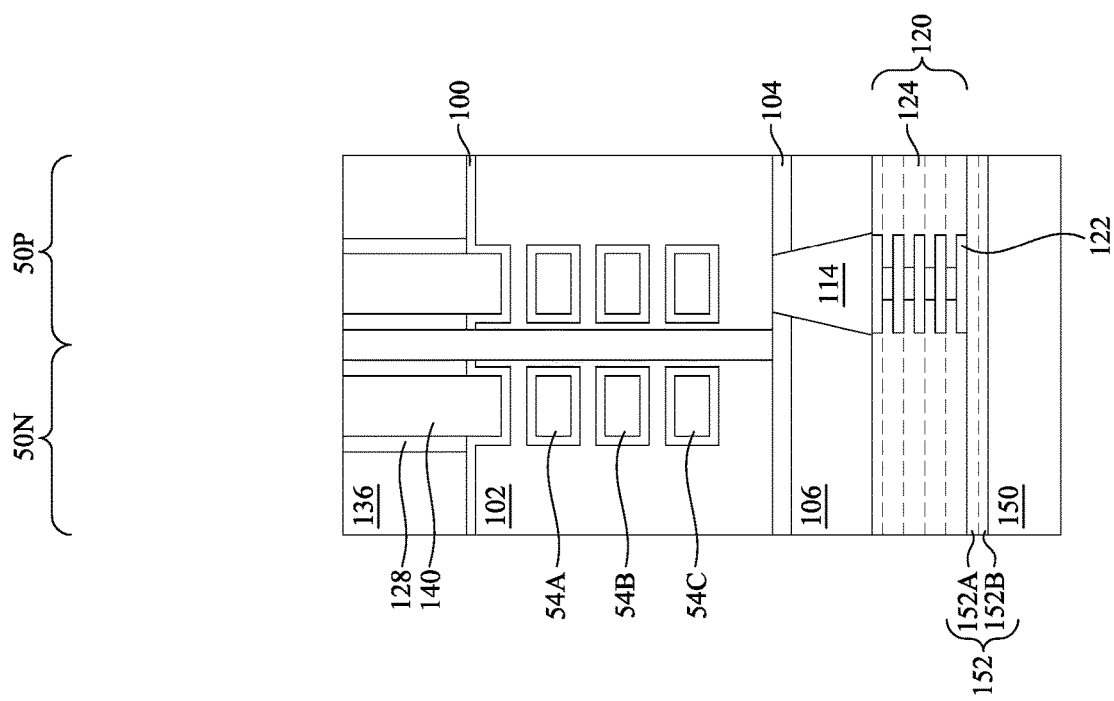
Figure 34C:
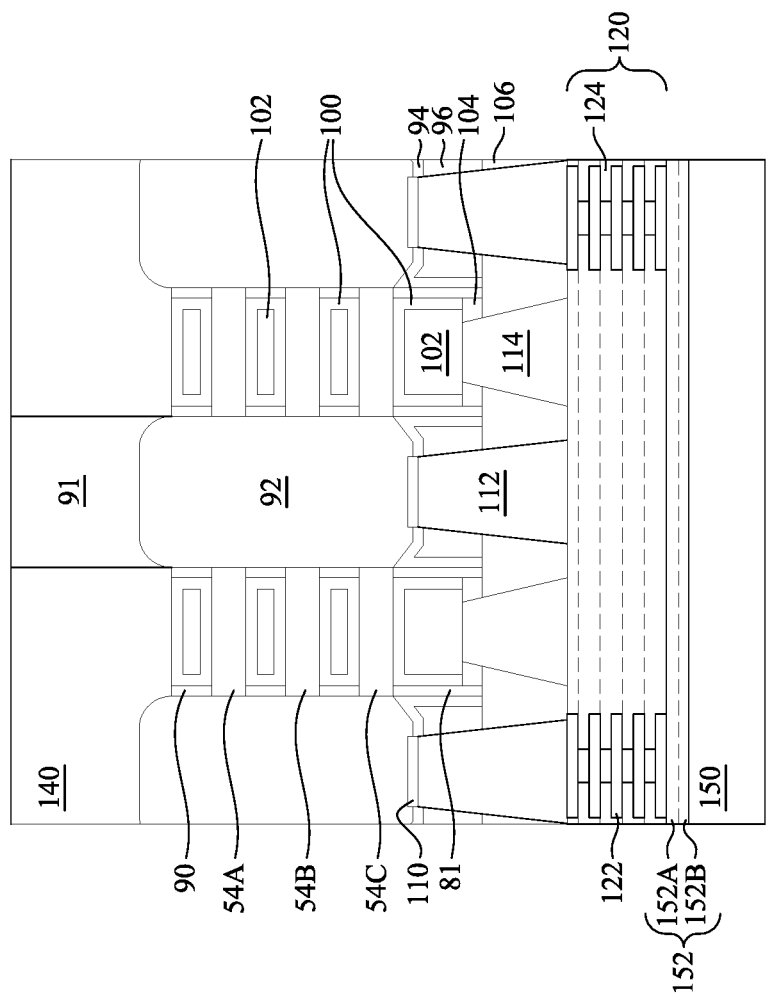
Figure 34D:
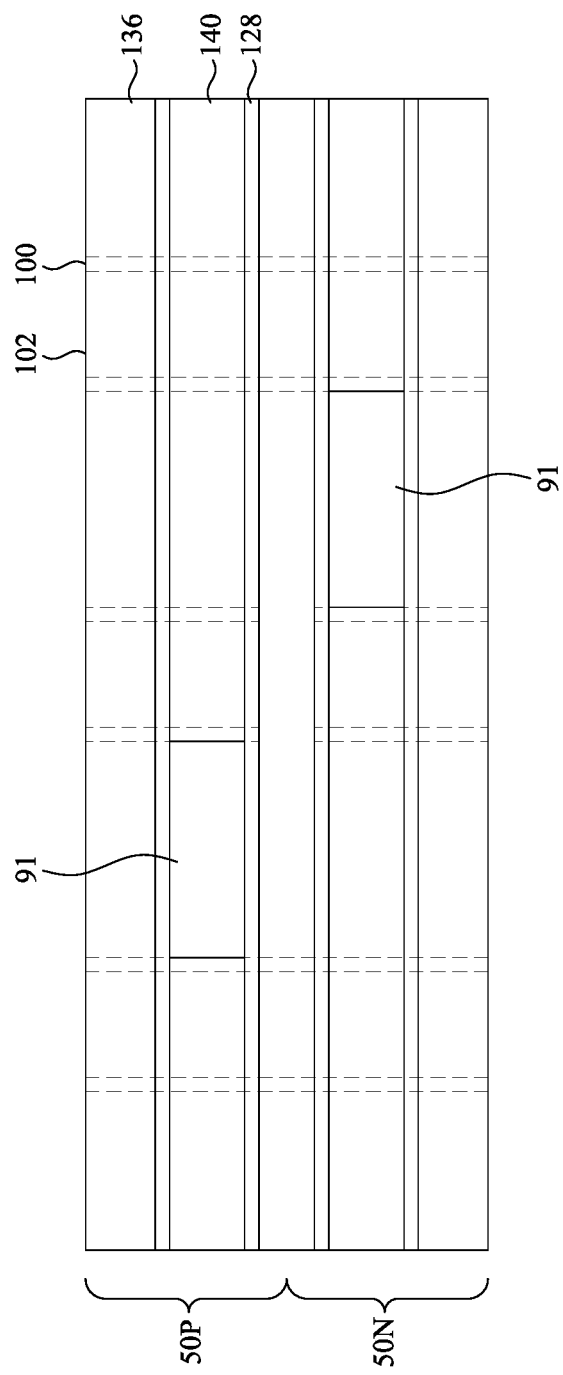
Figure 35B:
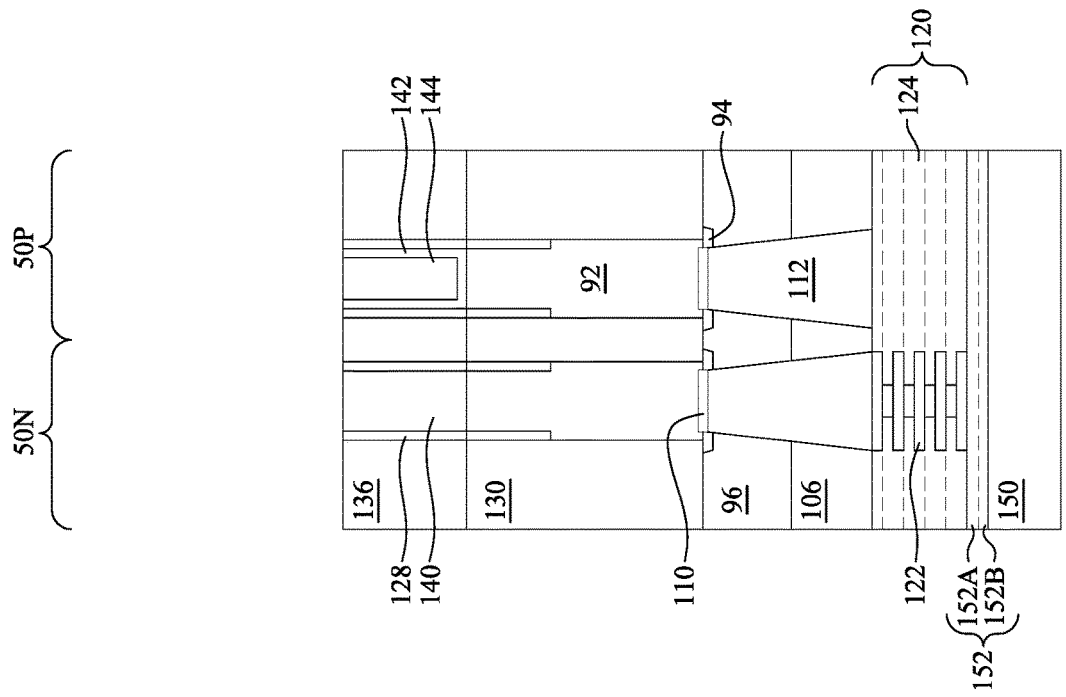
Figure 35A:
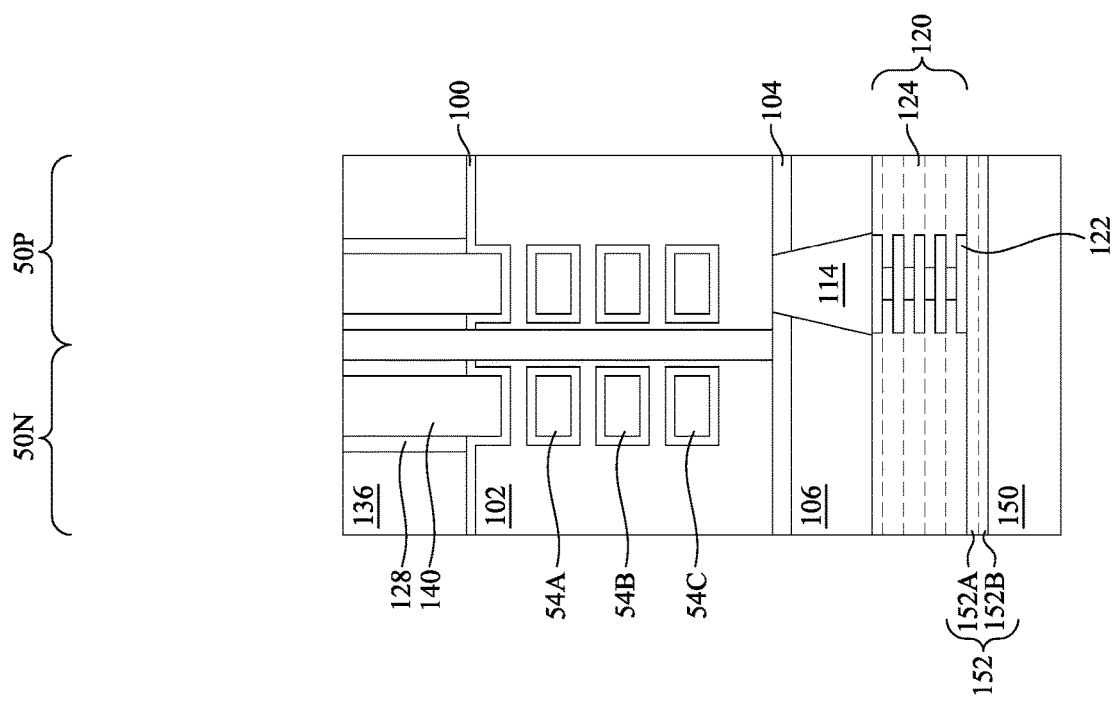
Figure 35C:
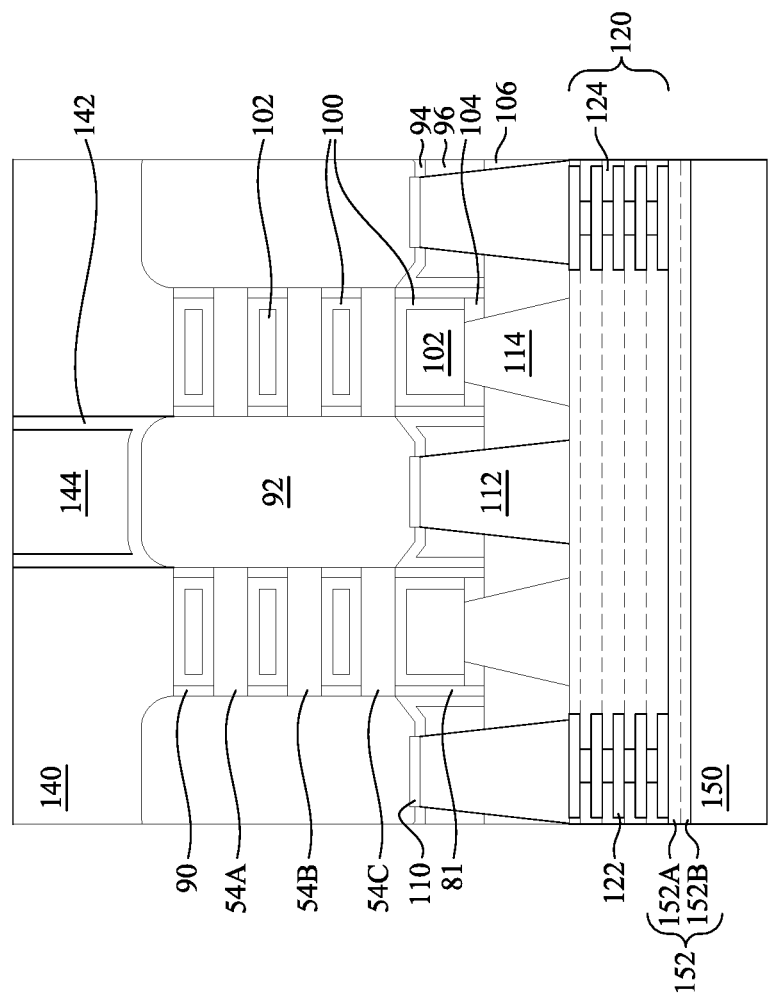
Figure 35D:
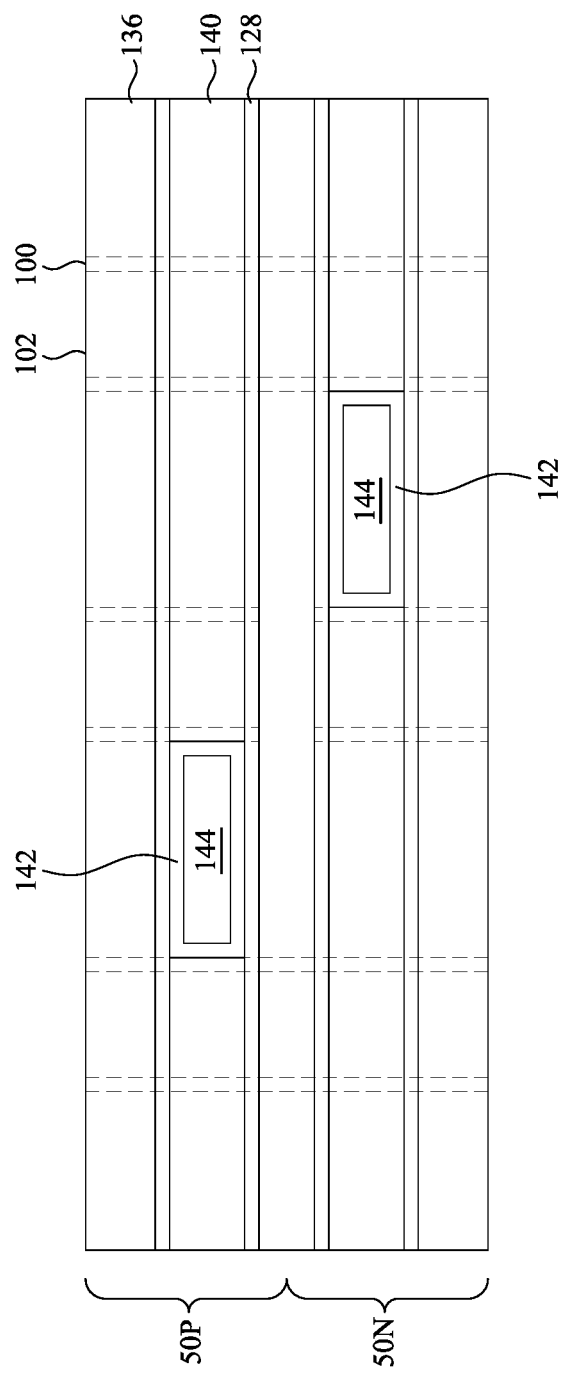

FIGS. 32E through 32G illustrate the fourth ILD 136 in accordance with various embodiments. In the embodiment illustrated in FIGS. 32E and 32G, a first air gap 135 is formed in the fifth recess 134 adjacent the gate electrode 102. As illustrated in FIGS. 32E and 32G, the fourth ILD 136 may be formed extending across the backside of the first air gap 135 and may seal the first air gap 135. In some embodiments, some of the material of the fourth ILD 136 may be deposited in the fifth recess 134 and may then be pinched off to seal the first air gap 135. In some embodiments, the first air gap 135 is substantially free from material of the fourth ILD 136. Material of the fourth ILD 136 deposited in the fifth recess 134 or otherwise enclosing the first air gap 135 may have planar surfaces, concave surfaces, convex surfaces or the like. The fourth ILD 136 may be deposited by PVD, CVD, ALD, or the like. In some embodiments, the first air gap 135 may extend between the third spacers 128. The first air gap 135 may have a lower dielectric constant than the fourth ILD 136. As such, forming the first air gap 135 between adjacent portions of the gate electrode 102 may reduce parasitic capacitance (e.g., capacitance between the adjacent portions of the gate electrode 102), which improves device performance.

In the embodiment illustrated in FIG. 32F, second air gaps 137 are formed adjacent the epitaxial source/drain regions 92. As illustrated in FIG. 32F, the fourth ILD 136 may be formed extending across backsides of the second air gaps 137 and may seal the second air gaps 137. In some embodiments, some of the material of the fourth ILD 136 may be deposited over the epitaxial source/drain regions 92, the first ILD 96, and the CESL 94 adjacent the epitaxial source/drain regions 92 and may then be pinched off to seal the second air gaps 137. In some embodiments, the second air gaps 137 are substantially free from material of the fourth ILD 136. Material of the fourth ILD 136 deposited adjacent the epitaxial source/drain regions 92 or otherwise enclosing the second air gaps 137 may have planar surfaces, concave surfaces, convex surfaces or the like. The fourth ILD 136 may be deposited by PVD, CVD, ALD, or the like. The second air gaps 137 may have a lower dielectric constant than the fourth ILD 136. As such, forming the second air gaps 137 adjacent the epitaxial source/drain regions 92 may reduce parasitic capacitance (e.g., capacitance between the epitaxial source/drain regions 92 and the gate electrodes 102), which improves device performance.

In FIGS. 33A through 33D, the cap layer 126, the fins 66, and the second substrate 50C are removed. The cap layer 126 may be removed by a planarization process, such as a CMP, an etch-back process, or the like. Following the planarization process, backside surfaces of the fourth ILD 136, the fins 66, the second substrate 50C, and the first epitaxial material 91 may be level with one another.

The fins 66 and the second substrate 50C are then removed to form sixth recesses 138. The fins 66 and the second substrate 50C may then be removed by a suitable etching process, which may be an isotropic etching process, such as a wet etching process. The etching process may have a high etch selectivity to materials of the fins 66 and the second substrate 50C. As such, the fins 66 and the second substrate 50C may be removed without significantly removing materials of the fourth ILD 136, the first epitaxial material 91, the third spacers 128, the epitaxial source/drain regions 92, or the gate dielectric layers 100.

In FIGS. 34A through 34D, a fifth ILD 140 is formed in the sixth recesses 138. The fifth ILD 140 may be deposited filling the sixth recesses 138 adjacent the first epitaxial material 91 and the third spacers 128. The fifth ILD 140 may be a dielectric material such as silicon nitride, silicon oxide, silicon oxynitride, a low-k dielectric material, combinations of these, or the like. The fifth ILD 140 may be deposited by a process such as CVD, PVD, ALD, combinations or multiples thereof, or the like. In some embodiments, the fifth ILD 140 is a flowable film formed by FCVD. In some embodiments, the fifth ILD 140 may be formed of a dielectric material such as PSG, BSG, BPSG, USG, or the like. In some embodiments, the fifth ILD 140 may be deposited and then planarized to expose top surfaces of the third spacers 128 and the first epitaxial material 91. The fifth ILD 140 may be planarized by a CMP, an etch-back process, a combination thereof, or the like.

In FIGS. 35A through 35D, the first epitaxial material 91 is replaced by backside vias 144. The first epitaxial material 91 may be removed by a suitable etching process, which may be an isotropic etching process, such as a wet etching process. The etching process may have a high etch selectivity to materials of the first epitaxial material 91. As such, the first epitaxial material 91 may be removed without significantly removing materials of the fourth ILD 136, the third spacers 128, the epitaxial source/drain regions 92, or the fifth ILD 140.

The backside vias 144 are then formed in recesses formed by removing the first epitaxial material 91. The backside vias 144 may include one or more layers, such as barrier layers, diffusion layers, and fill materials. For example, in some embodiments, the backside vias 144 may include a barrier layer 142 and a conductive material (labeled as the backside vias 144), and may be electrically coupled to an underlying conductive feature (e.g., the epitaxial source/drain regions 92). The backside vias 144 are electrically coupled to the epitaxial source/drain regions 92. The barrier layer 142 may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from surfaces of the fourth ILD 136, the fifth ILD 140, and the third spacers 128. In some embodiments, silicide regions, which may be similar to or the same as silicide regions no, discussed above in reference to FIGS. 21A through 21C, may be formed in the recesses formed by removing the first epitaxial semiconductor material before forming the backside vias 144.

Figure 36B:
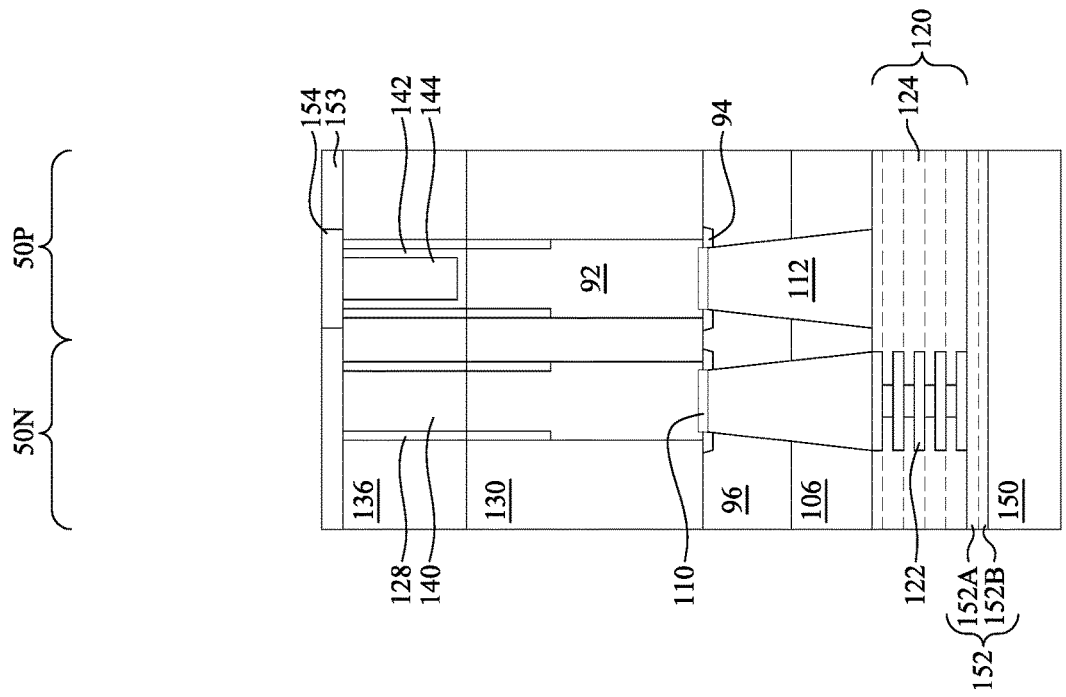
Figure 36A:
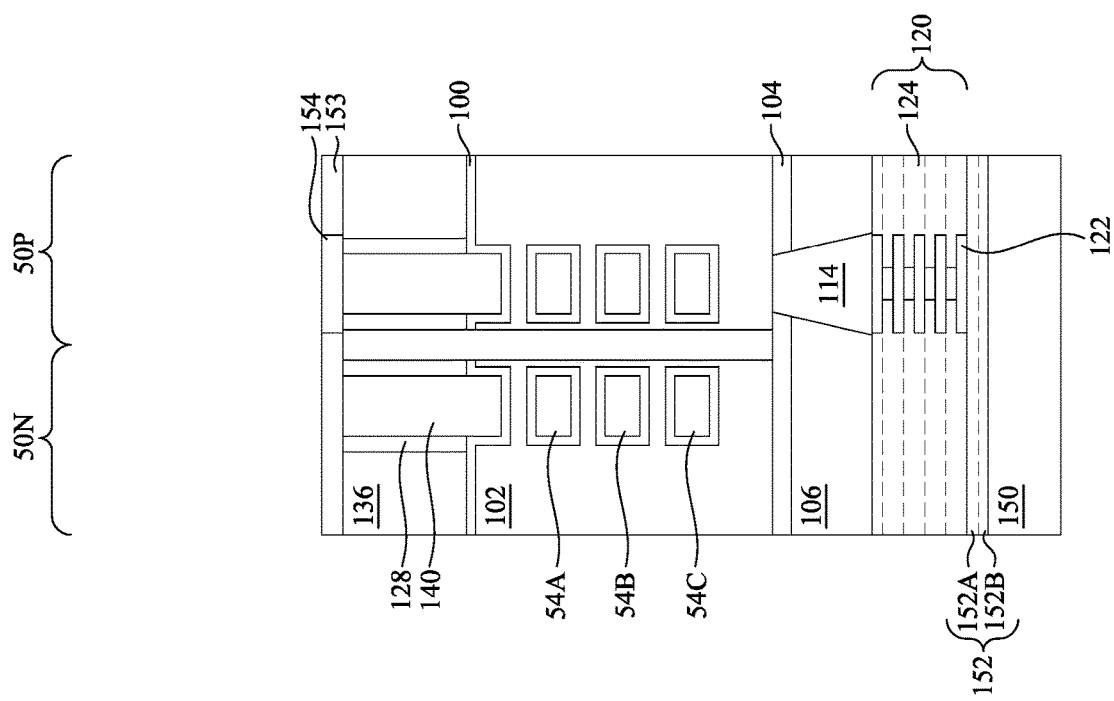
Figure 36C:
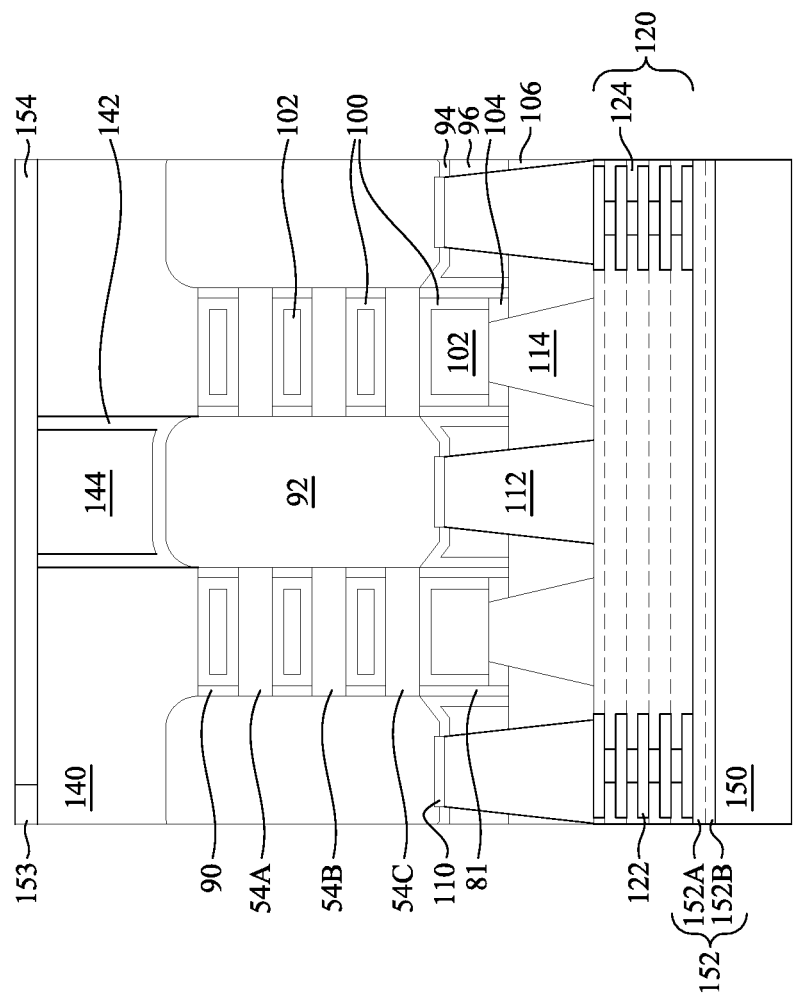

In FIGS. 36A through 36C, conductive lines 154 and a second dielectric layer 153 are formed over the fourth ILD 136, the fifth ILD 140, the third spacers 128, and the backside vias 144. The second dielectric layer 153 may be similar to the second ILD 106. For example, the second dielectric layer 153 may be formed of a like material and using a like process as the second ILD 106.

The conductive lines 154 are formed in the second dielectric layer 153. The conductive lines 154 may be referred to as a power rail. Forming the conductive lines 154 may include patterning recesses in the second dielectric layer 153 using a combination of photolithography and etching processes, for example. A pattern of the recesses in the second dielectric layer 153 may correspond to a pattern of the conductive lines 154. The conductive lines 154 are then formed by depositing a conductive material in the recesses. In some embodiments, the conductive lines 154 may include a power rail which includes a metal layer, which may be a single layer or a composite layer comprising a plurality of sub-layers formed of different materials. In some embodiments, the conductive lines 154 include copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer includes titanium, titanium nitride, titanium oxide, tantalum, tantalum nitride, titanium oxide, or the like. The conductive lines 154 may be formed using, for example, CVD, ALD, PVD, plating or the like. The conductive lines 154 are physically and electrically coupled to the epitaxial source/drain regions 92 through the backside vias 144. A planarization process (e.g., a CMP, a grinding, an etch-back, or the like) may be performed to remove excess portions of the conductive lines 154 formed over the second dielectric layer 153.

In some embodiments, the conductive lines 154 are power rails, which are conductive lines that electrically connect the epitaxial source/drain regions 92 to a reference voltage, supply voltage, or the like. By placing power rails on a backside of the resulting semiconductor die rather than in a front side of the semiconductor die, advantages may be achieved. For example, a gate density of the nano-FETs and/or interconnect density of the front-side interconnect structure 120 may be increased. Further, the backside of the semiconductor die may accommodate wider power rails, reducing resistance and increasing efficiency of power delivery to the nano-FETs. For example, a width of the conductive lines 154 may be at least twice a width of a first level conductive line (e.g., a conductive line 122A, illustrated in FIG. 36C) of the front-side interconnect structure 120.

Figure 37C:
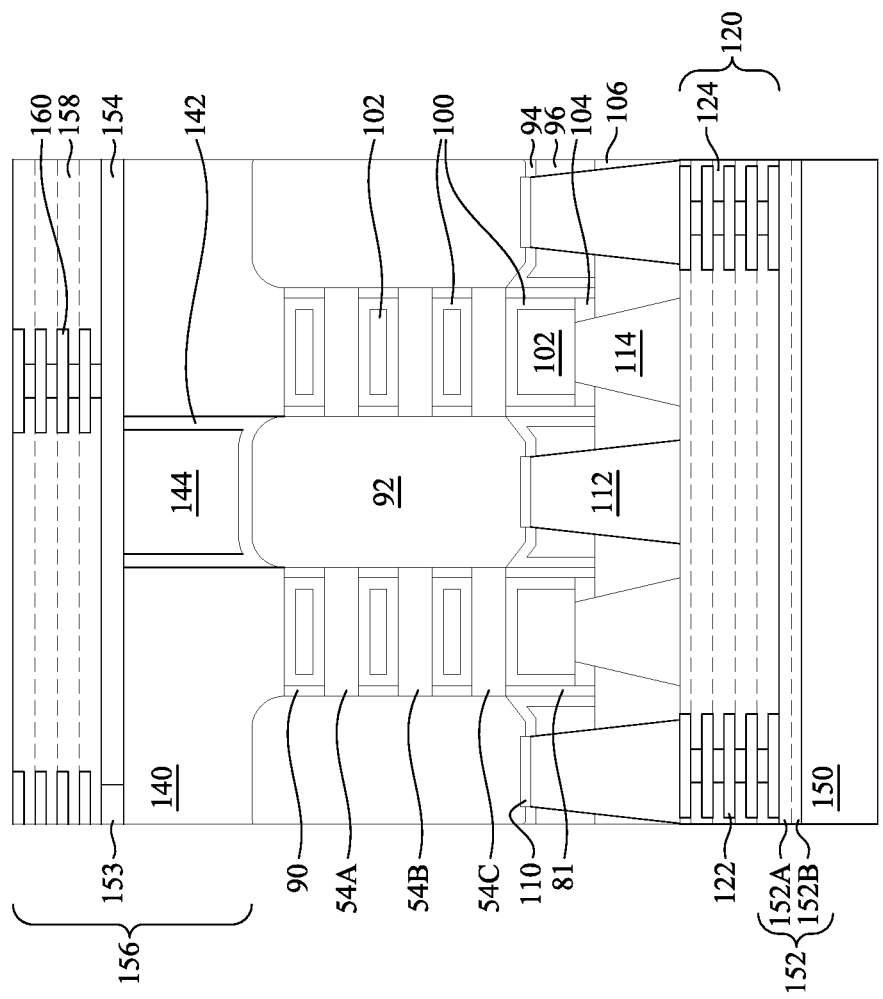

In FIGS. 37A through 37C, remaining portions of a backside interconnect structure 156 are formed over the second dielectric layer 153 and the conductive lines 154. The remaining portions of the backside interconnect structure 156 may include conductive features 160 formed in third dielectric layers 158. The backside interconnect structure 156 may include the fourth ILD 136, the fifth ILD 140, the third spacers 128, the backside via 144, the second dielectric layer 153, the conductive lines 154, the conductive features 160, and the third dielectric layers 158. The remainder of the backside interconnect structure 156 may be similar to the front-side interconnect structure 120. For example, the backside interconnect structure 156 may include similar materials and be formed using like processes as the front-side interconnect structure 120. In particular, the backside interconnect structure 156 may comprise stacked layers of conductive features 160 formed in third dielectric layers 158. The conductive features 160 may include routing lines (e.g., for routing to and from subsequently formed contact pads and external connectors). The conductive features 160 may further be patterned to include one or more embedded passive devices such as, resistors, capacitors, inductors, or the like. The embedded passive devices may be integrated with the conductive lines 154 (e.g., a power rail) to provide circuits (e.g., power circuits) on the backside of the nano-FETs.

Figure 38C:
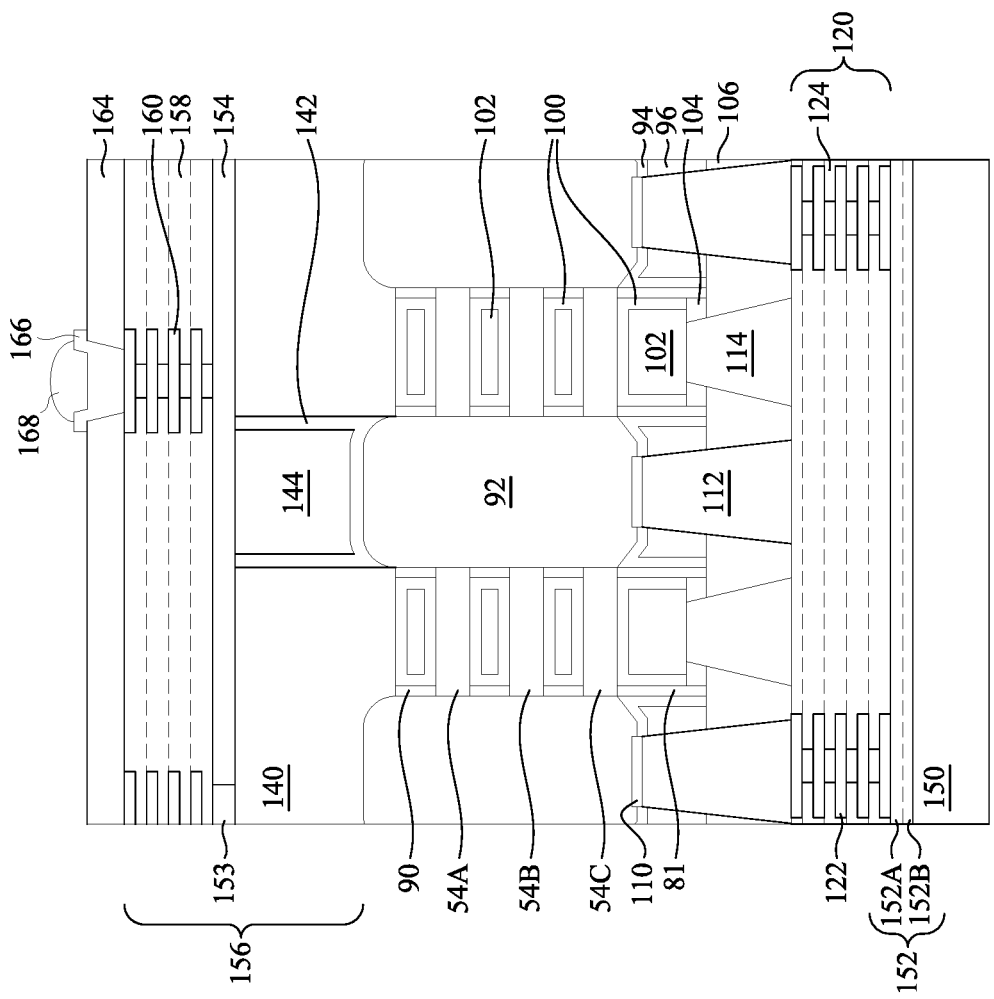

In FIGS. 38A through 38C, a passivation layer 164, UBMs 166, and external connectors 168 are formed over the backside interconnect structure 156. The passivation layer 164 may include polymers such as PBO, polyimide, BCB, or the like. Alternatively, passivation layer 164 may include non-organic dielectric materials such as silicon oxide, silicon nitride, silicon carbide, silicon oxynitride, or the like. The passivation layer 164 may be deposited by, for example, CVD, PVD, ALD, or the like.

The UBMs 166 are formed through the passivation layer 164 to the conductive features 160 in the backside interconnect structure 156, and external connectors 168 are formed on the UBMs 166. The UBMs 166 may include one or more layers of copper, nickel, gold, or the like, which are formed by a plating process, or the like. The external connectors 168 (e.g., solder balls) are formed on the UBMs 166. The formation of external connectors 168 may include placing solder balls on the exposed portions of UBMs 166 and then reflowing the solder balls. In alternative embodiments, the formation of external connectors 168 includes performing a plating step to form solder regions over the topmost conductive feature 160 and then reflowing the solder regions. The UBMs 166 and the external connectors 168 may be used to provide input/output connections to other electrical components, such as, other device dies, redistribution structures, printed circuit boards (PCBs), motherboards, or the like. The UBMs 166 and the external connectors 168 may also be referred to as backside input/output pads that may provide signal, supply voltage, and/or ground connections to the nano-FETs described above.

Embodiments may achieve advantages. For example, performing the self-aligned process to etch the gate structure may improve the accuracy of the etching of the gate structure. This allows for features with smaller dimensions to be patterned, increases device density, reduces device defects, and improves device performance. Moreover, performing the self-aligned process to trim the epitaxial source/drain regions also provides for improved accuracy of the trimming of the epitaxial source/drain regions. This allows for features with smaller dimensions to be patterned, increases device density, reduces device defects, and improves device performance. Moreover, the size of the epitaxial source/drain regions may be reduced, which reduces parasitic capacitance. Forming ILDs adjacent the gate structures and the source/drain regions of low-k materials or including air gaps may further reduce parasitic capacitance, increasing device performance.

In accordance with an embodiment, a semiconductor device includes a first transistor structure; a first interconnect structure on a front-side of the first transistor structure; and a second interconnect structure on a backside of the first transistor structure, the second interconnect structure including a first dielectric layer on the backside of the first transistor structure; a contact extending through the first dielectric layer to a source/drain region of the first transistor structure; and first spacers along sidewalls of the contact between the contact and the first dielectric layer, sidewalls of the first spacers facing the first dielectric layer being aligned with sidewalls of the source/drain region of the first transistor structure. In an embodiment, the semiconductor device further includes a second dielectric layer surrounding the source/drain region; and an air gap in the second dielectric layer. In an embodiment, the second dielectric layer includes a low-dielectric constant material. In an embodiment, the first dielectric layer includes a low-dielectric constant material, and the first dielectric layer and the second dielectric layer enclose the air gap. In an embodiment, the second interconnect structure further includes a power rail electrically connected to the contact. In an embodiment, the second interconnect structure further includes a second dielectric layer, the second dielectric layer including a surface level with a surface of the first dielectric layer, the second dielectric layer having sidewalls aligned with sidewalls of a nanostructure of the first transistor structure. In an embodiment, the semiconductor device further includes second spacers along sidewalls of the second dielectric layer between the second dielectric layer and the first dielectric layer, a sidewall of the second spacers facing the first dielectric layer being aligned with an end surface of a gate structure of the first transistor structure.

In accordance with another embodiment, a semiconductor device includes a first transistor structure including a first nanostructure, a first gate structure surrounding the first nanostructure, and a first source/drain region adjacent the first gate structure; a first interconnect structure on a front-side of the first transistor structure; and a second interconnect structure on a backside of the first transistor structure, the second interconnect structure including a first dielectric layer on the backside of the first transistor structure; and a first spacer extending through the first dielectric layer, a first sidewall of the first spacer being aligned with a first end surface of the first gate structure. In an embodiment, the semiconductor device further includes a second spacer extending through the first dielectric layer, a second sidewall of the second spacer being aligned with a sidewall of the first source/drain region. In an embodiment, a second sidewall of the first spacer is aligned with the first nanostructure. In an embodiment, the first transistor structure further includes a second dielectric layer adjacent the first gate structure. In an embodiment, an air gap is disposed in the second dielectric layer. In an embodiment, the first dielectric layer and the second dielectric layer enclose the air gap. In an embodiment, the semiconductor device further includes a second transistor structure including a second nanostructure, a second gate structure surrounding the second nanostructure, and a second source/drain region adjacent the second gate structure, the second dielectric layer separating a second end surface of the second gate structure from the first end surface of the first gate structure in a direction along longitudinal axes of the first gate structure and the second gate structure.

In accordance with yet another embodiment, a method includes forming a transistor structure on a semiconductor substrate; thinning the semiconductor substrate to expose a fin; after thinning the semiconductor substrate, forming first spacers along sidewalls of the fin; etching a source/drain region of the transistor structure using the first spacers as a mask; and forming a first interlayer dielectric adjacent the source/drain region. In an embodiment, the method further includes forming a second interlayer dielectric over the first interlayer dielectric, forming the second interlayer dielectric sealing an air gap in the first interlayer dielectric adjacent the source/drain region. In an embodiment, the method further includes etching an opening in a gate structure of the transistor structure using the first spacers as a mask; and forming a second interlayer dielectric adjacent the first spacers. In an embodiment, forming the second interlayer dielectric includes forming air gaps in the second interlayer dielectric, the air gaps being adjacent the gate structure. In an embodiment, the method further includes replacing portions of the fin with a cap layer; and forming a patterned hard mask over the cap layer and the first spacers, the patterned hard mask exposing portions of the cap layer, the first spacers, and a gate dielectric layer of the gate structure, etching the gate structure of the transistor structure using the first spacers, the cap layer, and the patterned hard mask as the mask. In an embodiment, the method further includes replacing the fin with an epitaxially grown semiconductor material; and replacing the epitaxially grown semiconductor material with a conductive via electrically coupled to the source/drain region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first semiconductor structure and a second semiconductor structure;
a first source/drain region and a second source/drain region on opposing sides of the first semiconductor structure;
a third source/drain region and a fourth source/drain region on opposing sides of the second semiconductor structure;
a first gate structure surrounding the first semiconductor structure;
a second gate structure surrounding the second semiconductor structure, the first gate structure being aligned with the second gate structure, the first source/drain region being on a same side of the first gate structure as the third source/drain region is on the second gate structure;
a first interconnect structure over the first gate structure and over the second gate structure;
a first dielectric layer between the first source/drain region and the third source/drain region;
a first spacer material between the first dielectric layer and the first source/drain region, wherein the first dielectric layer contacts the first source/drain region;
a second dielectric layer over the first dielectric layer, wherein the first dielectric layer is between the second dielectric layer and the first interconnect structure, wherein the first gate structure is between the second dielectric layer and the first interconnect structure;
a gate cut structure between the first gate structure and the second gate structure, the gate cut structure extending from a surface of the second dielectric layer to a surface of the first gate structure; and
a contact extending through the second dielectric layer to the first source/drain region.

2. The device of claim 1, further comprising:
a first interlayer dielectric over the first gate structure;
a first interconnect structure on the first interlayer dielectric, the first interlayer dielectric being between the first gate structure and the first interconnect structure; and
a first gate contact extending from the first gate structure to a first conductive feature of the first interconnect structure.

3. The device of claim 2, further comprising:
a second interconnect structure on the second dielectric layer, the second dielectric layer being between the first gate structure and the second interconnect structure, wherein the contact extends from the first source/drain region to a second conductive feature of the second interconnect structure.

4. The device of claim 1, wherein the gate cut structure comprises an air gap.

5. The device of claim 1, wherein a sidewall of the first spacer material is aligned with a sidewall of the first source/drain region.

6. The device of claim 1, wherein the first spacer material further extends only partially through the first dielectric layer.

7. The device of claim 1, wherein the first spacer material extends along sidewalls of the contact.

8. A semiconductor device comprising:
a first transistor structure comprising a first nanostructure, a first gate structure surrounding the first nanostructure, and a first source/drain region adjacent the first gate structure;
a second transistor structure comprising a second nanostructure, a second gate structure surrounding the second nanostructure, and a second source/drain region adjacent the second gate structure;
a first interconnect structure on a front-side of the first transistor structure and the second transistor structure; and
a second interconnect structure on a backside of the first transistor structure and the second transistor structure, the second interconnect structure comprising:
a first dielectric layer on the backside of the first transistor structure;
a first contact extending through first dielectric layer to contact the second source/drain region;
a first spacer extending through the first dielectric layer, a first sidewall of the first spacer being aligned with a first end surface of the first gate structure; and
a second spacer extending through the first dielectric layer, the second spacer being between the first dielectric layer and the first contact, a first sidewall of the second spacer being aligned with a first sidewall of the second source/drain region.

9. The device of claim 8, further comprising an air gap between the first end surface of the first gate structure and a second end surface of a second gate structure, wherein a longitudinal axis of the second gate structure is aligned with a longitudinal axis of the first gate structure.

10. The device of claim 8, wherein the first spacer and the second spacer are a same material.

11. The device of claim 8, wherein the second spacer extends along a sidewall of the second source/drain region.

12. The device of claim 8, wherein the first dielectric layer extends between the first source/drain region and the second source/drain region, wherein an air gap is disposed in the first dielectric layer between the first source/drain region and the second source/drain region.

13. The device of claim 8, further comprising external connectors on the second interconnect structure, the second interconnect structure being between the external connectors and the first contact.

14. The device of claim 8, further comprising a gate contact extending from the first gate structure to the first interconnect structure.

15. A method comprising:
forming a first fin and a second fin protruding from a semiconductor substrate;
replacing a portion the second fin with a sacrificial material;
forming a first nanostructure over the first fin and a second nanostructure over the sacrificial material;

forming a first source/drain region adjacent the first nanostructure and a second source/drain region adjacent the second nanostructure;

forming a first gate structure over the first nanostructure and the second nanostructure;

thinning the semiconductor substrate to expose the first fin and the sacrificial material;

after thinning the semiconductor substrate, forming first spacers along sidewalls of the first fin and the sacrificial material;

etching the first source/drain region and the second source/drain region using the first spacers as a mask;

forming a first dielectric layer adjacent the first source/drain region and the second source/drain region;

etching the first gate structure using the first spacers as a mask to form a recess, the recess dividing the first gate structure into a second gate structure and a third gate structure;

forming a second dielectric layer over the first dielectric layer and in the recess; and replacing the sacrificial material with a source/drain contact.

16. The method of claim 15, wherein the sacrificial material comprises a semiconductor material.

17. The method of claim 15, further comprising, prior to thinning, forming a front-side redistribution structure over the first gate structure.

18. The method of claim 15, wherein forming the second dielectric layer forms an air gap between the second gate structure and the third gate structure.

19. The method of claim 15, wherein the first spacers extend between the second dielectric layer and the source/drain contact.

20. The method of claim 15, wherein the first dielectric layer contacts a sidewall of the first spacers.

* * * * *